(12) United States Patent
Singh et al.

(10) Patent No.: US 12,327,931 B2
(45) Date of Patent: Jun. 10, 2025

(54) WIRELESS CONNECTOR SYSTEM

(71) Applicant: NuCurrent, Inc., Chicago, IL (US)

(72) Inventors: Vinit Singh, Austin, TX (US); Pavel Shostak, Chicago, IL (US); Alberto Peralta, Chicago, IL (US); Jason Luzinski, Chicago, IL (US); Jacob D. Babcock, Chicago, IL (US); Michael Gotlieb, Chicago, IL (US); Glenn E. Riese, McHenry, IL (US); Md. Nazmul Alam, Lombard, IL (US); Robert Giometti, Buffalo Grove, IL (US); Oleg Los, Buffalo Grove, IL (US); Unnati Wadkar, Chicago, IL (US); Mark Melone, Chicago, IL (US)

(73) Assignee: NuCurrent, Inc., Chicago, IL (US)

( * ) Notice: Subject to any disclaimer, the term of this patent is extended or adjusted under 35 U.S.C. 154(b) by 670 days.

(21) Appl. No.: 17/188,877

(22) Filed: Mar. 1, 2021

(65) Prior Publication Data

US 2021/0367451 A1    Nov. 25, 2021

Related U.S. Application Data

(63) Continuation of application No. 15/686,920, filed on Aug. 25, 2017, now Pat. No. 10,938,220.

(Continued)

(51) Int. Cl.
*H01Q 7/00* (2006.01)
*H01F 38/14* (2006.01)
(Continued)

(52) U.S. Cl.
CPC ............. *H01Q 7/00* (2013.01); *H01F 38/14* (2013.01); *H01Q 1/38* (2013.01); *H01Q 1/42* (2013.01);
(Continued)

(58) Field of Classification Search
CPC .. H01Q 7/00; H01Q 1/38; H01Q 1/42; H01Q 1/526; H01F 38/14; H01R 12/7082;
(Continued)

(56) References Cited

U.S. PATENT DOCUMENTS 2,797,393 A    6/1957   Clogston
2,911,605 A    11/1959  Wales, Jr. et al.
(Continued)

FOREIGN PATENT DOCUMENTS

CN    1228551 A    9/1999
CN    2650300 Y    10/2004
(Continued)

OTHER PUBLICATIONS

Notification of Reasons for Refusal, KR Application No. 10-2019-7005779, dated May 13, 2022, 12 pages.
(Continued)

*Primary Examiner* — Jared Fureman
*Assistant Examiner* — Michael J Warmflash
(74) *Attorney, Agent, or Firm* — Lee Sullivan Shea & Smith LLP

(57) ABSTRACT

Various embodiments of a wireless connector system are described. The system has a transmitter module and a receiver module that are configured to wirelessly transmit electrical energy and/or data via near field magnetic coupling. The wireless connector system is designed to increase the amount of wirelessly transmitted electrical power over a greater separation distance. The system is configured with various sensing circuits that alert the system to the presence of the receiver module to begin transfer of electrical power as well as undesirable objects and increased temperature that could interfere with the operation of the system. The wireless connector system is a relatively small footprint that is designed to be surface mounted.

17 Claims, 37 Drawing Sheets

Related U.S. Application Data

(60) Provisional application No. 62/379,940, filed on Aug. 26, 2016.

(51) Int. Cl.

| | | |
|---|---|---|
| *H01Q 1/38* | (2006.01) | |
| *H01Q 1/42* | (2006.01) | |
| *H01Q 1/52* | (2006.01) | |
| *H01R 12/70* | (2011.01) | |
| *H02J 50/10* | (2016.01) | |
| *H02J 50/60* | (2016.01) | |
| *H03H 7/38* | (2006.01) | |
| *H03H 11/28* | (2006.01) | |
| *H04B 1/04* | (2006.01) | |
| *H04B 1/16* | (2006.01) | |
| *H04B 5/26* | (2024.01) | |
| *H04B 5/72* | (2024.01) | |
| *H04B 5/75* | (2024.01) | |
| *H04B 5/79* | (2024.01) | |
| *H05K 1/02* | (2006.01) | |
| *H05K 1/14* | (2006.01) | |
| *H05K 1/18* | (2006.01) | |
| *H05K 3/36* | (2006.01) | |
| *H05K 3/40* | (2006.01) | |
| *H05K 5/02* | (2006.01) | |
| *H05K 9/00* | (2006.01) | |
| *H01R 12/52* | (2011.01) | |
| *H01R 12/57* | (2011.01) | |
| *H01R 12/72* | (2011.01) | |
| *H01R 12/73* | (2011.01) | |
| *H04B 5/24* | (2024.01) | |

(52) U.S. Cl.
CPC ......... *H01Q 1/526* (2013.01); *H01R 12/7082* (2013.01); *H02J 50/10* (2016.02); *H02J 50/60* (2016.02); *H03H 7/38* (2013.01); *H03H 11/28* (2013.01); *H04B 1/04* (2013.01); *H04B 1/16* (2013.01); *H04B 5/26* (2024.01); *H04B 5/72* (2024.01); *H04B 5/75* (2024.01); *H04B 5/79* (2024.01); *H05K 1/0216* (2013.01); *H05K 1/147* (2013.01); *H05K 1/181* (2013.01); *H05K 3/361* (2013.01); *H05K 3/40* (2013.01); *H05K 5/0247* (2013.01); *H05K 9/0075* (2013.01); *H05K 9/0081* (2013.01); *H05K 9/0084* (2013.01); *H01R 12/52* (2013.01); *H01R 12/57* (2013.01); *H01R 12/7088* (2013.01); *H01R 12/721* (2013.01); *H01R 12/724* (2013.01); *H01R 12/725* (2013.01); *H01R 12/732* (2013.01); *H04B 5/24* (2024.01); *H05K 1/028* (2013.01); *H05K 1/148* (2013.01); *H05K 3/366* (2013.01); *H05K 9/0022* (2013.01); *H05K 2201/10098* (2013.01)

(58) Field of Classification Search
CPC .... H01R 12/52; H01R 12/57; H01R 12/7088; H01R 12/721; H01R 12/724; H01R 12/725; H01R 12/732; H02J 50/10; H02J 50/60; H02J 50/005; H03H 7/38; H03H 11/28; H04B 1/04; H04B 1/16; H04B 5/26; H04B 5/72; H04B 5/75; H04B 5/79; H04B 5/24; H05K 1/0216; H05K 1/147; H05K 1/181; H05K 3/361; H05K 3/40; H05K 5/0247; H05K 9/0075; H05K 9/0081; H05K 9/0084; H05K 1/028; H05K 1/148; H05K 3/366; H05K 9/0022; H05K 2201/10098

See application file for complete search history.

(56) References Cited

U.S. PATENT DOCUMENTS

| | | |
|---|---|---|
| 3,484,731 A | 12/1969 | Rich et al. |
| 3,633,151 A | 1/1972 | Sensabaugh |
| 3,824,500 A | 7/1974 | Rothenberg |
| 4,328,531 A | 5/1982 | Nagashima et al. |
| 4,494,100 A | 1/1985 | Stengel et al. |
| 4,959,631 A | 9/1990 | Hasegawa et al. |
| 4,996,165 A | 2/1991 | Chang et al. |
| 5,137,478 A | 8/1992 | Graf et al. |
| 5,237,165 A | 8/1993 | Tingley, III |
| 5,280,645 A | 1/1994 | Nguyen et al. |
| 5,281,855 A | 1/1994 | Hadden et al. |
| 5,365,247 A | 11/1994 | Van Der Veen et al. |
| 5,604,352 A | 2/1997 | Schuetz |
| 5,713,939 A * | 2/1998 | Nedungadi ........ A61N 1/37211 607/33 |
| 5,748,464 A | 5/1998 | Schuetz |
| 5,767,808 A | 6/1998 | Robbins et al. |
| 5,767,813 A | 6/1998 | Verma et al. |
| 5,777,538 A | 7/1998 | Schuetz |
| 5,801,611 A | 9/1998 | Van Loenen et al. |
| 5,808,587 A | 9/1998 | Shima |
| 5,838,154 A | 11/1998 | Morikawa et al. |
| 5,883,392 A | 3/1999 | Schuetz |
| 5,892,489 A | 4/1999 | Kanba et al. |
| 5,980,773 A | 11/1999 | Takeda |
| 6,005,193 A | 12/1999 | Markel |
| 6,021,337 A | 2/2000 | Remillard et al. |
| 6,028,568 A | 2/2000 | Asakura et al. |
| 6,107,972 A | 8/2000 | Seward et al. |
| 6,148,821 A | 11/2000 | Falco |
| 6,163,307 A | 12/2000 | Kim et al. |
| 6,271,803 B1 | 8/2001 | Watanabe et al. |
| 6,474,341 B1 | 11/2002 | Hunter et al. |
| 6,503,831 B2 | 1/2003 | Speakman |
| 6,556,101 B1 | 4/2003 | Tada et al. |
| 6,583,769 B2 | 6/2003 | Shiroki et al. |
| 6,664,863 B1 | 12/2003 | Okamoto et al. |
| 6,809,688 B2 | 10/2004 | Yamada |
| 6,897,830 B2 | 5/2005 | Bae et al. |
| 6,924,230 B2 | 8/2005 | Sun et al. |
| 7,046,113 B1 | 5/2006 | Okamoto et al. |
| 7,113,087 B1 | 9/2006 | Casebolt et al. |
| 7,205,655 B2 | 4/2007 | Sippola |
| 7,355,558 B2 | 4/2008 | Lee |
| 7,563,352 B2 | 7/2009 | Hubel |
| 7,579,835 B2 | 8/2009 | Schnell et al. |
| 7,579,836 B2 | 8/2009 | Schnell et al. |
| 7,688,270 B2 | 3/2010 | Tsushima |
| 7,713,762 B2 | 5/2010 | Lee et al. |
| 7,728,778 B2 | 6/2010 | Tsao et al. |
| 7,786,836 B2 | 8/2010 | Gabara |
| 7,796,094 B2 | 9/2010 | Mtchedlishvili et al. |
| 7,952,365 B2 | 5/2011 | Narita et al. |
| 8,004,080 B2 | 8/2011 | McShane et al. |
| 8,056,819 B2 | 11/2011 | Rowell et al. |
| 8,118,611 B2 | 2/2012 | Jeon |
| 8,138,924 B2 | 3/2012 | Sinnett et al. |
| 8,253,278 B2 | 8/2012 | Cook et al. |
| 8,299,877 B2 | 10/2012 | Hong et al. |
| 8,374,545 B2 | 2/2013 | Menegoli et al. |
| 8,385,043 B2 | 2/2013 | Ng et al. |
| 8,436,780 B2 | 5/2013 | Schantz et al. |
| 8,452,235 B2 | 5/2013 | Kirby et al. |
| 8,457,758 B2 | 6/2013 | Olson et al. |
| 8,497,658 B2 * | 7/2013 | Von Novak ............. H02J 50/20 320/108 |
| 8,567,048 B2 | 10/2013 | Singh et al. |
| 8,610,530 B2 | 12/2013 | Singh et al. |
| 8,618,695 B2 | 12/2013 | Azancot et al. |
| 8,653,927 B2 | 2/2014 | Singh et al. |

(56) References Cited

U.S. PATENT DOCUMENTS

| | | |
|---|---|---|
| 8,680,960 B2 | 3/2014 | Singh et al. |
| 8,692,641 B2 | 4/2014 | Singh et al. |
| 8,692,642 B2 | 4/2014 | Singh et al. |
| 8,698,590 B2 | 4/2014 | Singh et al. |
| 8,698,591 B2 | 4/2014 | Singh et al. |
| 8,707,546 B2 | 4/2014 | Singh et al. |
| 8,710,948 B2 | 4/2014 | Singh et al. |
| 8,714,813 B2 | 5/2014 | Liao |
| 8,772,973 B2 | 7/2014 | Kurs |
| 8,774,712 B2 | 7/2014 | Sato et al. |
| 8,803,474 B2 | 8/2014 | Hillan et al. |
| 8,803,631 B2 | 8/2014 | Manssen et al. |
| 8,803,649 B2 | 8/2014 | Singh et al. |
| 8,823,481 B2 | 9/2014 | Singh et al. |
| 8,823,482 B2 | 9/2014 | Singh et al. |
| 8,836,171 B2 | 9/2014 | Choi et al. |
| 8,855,786 B2 | 10/2014 | Derbas et al. |
| 8,860,545 B2 | 10/2014 | Singh et al. |
| 8,892,034 B2 | 11/2014 | McGuire et al. |
| 8,898,885 B2 | 12/2014 | Singh et al. |
| 8,901,880 B2 | 12/2014 | Cook et al. |
| 8,901,881 B2 | 12/2014 | Partovi |
| 8,933,589 B2 | 1/2015 | Bourilkov et al. |
| 8,975,981 B2 * | 3/2015 | See ............ H03H 7/38 333/32 |
| 9,071,926 B2 * | 6/2015 | Krishnan ......... G06K 7/10237 |
| 9,124,316 B2 | 9/2015 | Langer |
| 9,178,361 B2 | 11/2015 | Liu et al. |
| 9,178,369 B2 | 11/2015 | Partovi |
| 9,196,958 B2 | 11/2015 | Arnold et al. |
| 9,208,942 B2 | 12/2015 | Singh et al. |
| 9,209,636 B2 | 12/2015 | Yoda et al. |
| 9,230,732 B2 | 1/2016 | Muratov et al. |
| 9,231,412 B2 | 1/2016 | Lisi et al. |
| 9,252,846 B2 | 2/2016 | Lee et al. |
| 9,252,876 B2 | 2/2016 | Fischer et al. |
| 9,318,897 B2 | 4/2016 | Brohlin et al. |
| 9,425,653 B2 | 8/2016 | Cook et al. |
| 9,432,090 B2 | 8/2016 | Wang |
| 9,515,633 B1 | 12/2016 | Long et al. |
| 9,525,311 B2 | 12/2016 | Menegoli |
| 9,559,526 B2 | 1/2017 | Von Novak, III et al. |
| 9,866,040 B2 | 1/2018 | Kato |
| 9,899,882 B2 * | 2/2018 | Lee ............ H02J 50/12 |
| 9,912,173 B2 | 3/2018 | Tseng |
| 9,912,174 B2 | 3/2018 | Soar |
| 9,941,936 B2 * | 4/2018 | Kuttan ............ H04B 1/0458 |
| 10,283,995 B2 | 5/2019 | Gunderson |
| 10,868,444 B2 | 12/2020 | Peralta et al. |
| 10,886,751 B2 * | 1/2021 | Singh ............ H05K 9/0075 |
| 10,892,646 B2 | 1/2021 | Peralta et al. |
| 10,897,140 B2 | 1/2021 | Singh et al. |
| 10,903,660 B2 | 1/2021 | Singh et al. |
| 10,931,118 B2 | 2/2021 | Singh et al. |
| 11,011,915 B2 | 5/2021 | Singh et al. |
| 11,901,621 B2 * | 2/2024 | Shoji ............ H01Q 1/52 |
| 2002/0020554 A1 | 2/2002 | Sakamoto et al. |
| 2002/0053992 A1 | 5/2002 | Kawakami et al. |
| 2002/0071003 A1 | 6/2002 | Kimura |
| 2002/0075191 A1 | 6/2002 | Yokoshima et al. |
| 2002/0101383 A1 | 8/2002 | Junod |
| 2002/0105080 A1 | 8/2002 | Speakman |
| 2003/0006069 A1 | 1/2003 | Takebe et al. |
| 2003/0058180 A1 | 3/2003 | Forster et al. |
| 2003/0119677 A1 | 6/2003 | Qiyan et al. |
| 2003/0142929 A1 | 7/2003 | Bartur et al. |
| 2003/0146875 A1 | 8/2003 | Kirino |
| 2004/0000974 A1 | 1/2004 | Odenaal et al. |
| 2004/0085247 A1 | 5/2004 | Mickle et al. |
| 2004/0108311 A1 | 6/2004 | De Rooij et al. |
| 2004/0118920 A1 | 6/2004 | He |
| 2004/0140528 A1 | 7/2004 | Kim et al. |
| 2004/0159460 A1 | 8/2004 | Passiopoulos et al. |
| 2004/0189528 A1 | 9/2004 | Killen et al. |
| 2004/0196605 A1 | 10/2004 | Dinn et al. |
| 2004/0217488 A1 | 11/2004 | Luechinger |
| 2004/0227608 A1 | 11/2004 | Nakatani et al. |
| 2005/0043638 A1 | 2/2005 | Chen |
| 2005/0121229 A1 | 6/2005 | Takai et al. |
| 2005/0174628 A1 | 8/2005 | Kelly et al. |
| 2005/0269693 A1 | 12/2005 | Green et al. |
| 2006/0022772 A1 | 2/2006 | Kanno et al. |
| 2006/0040628 A1 | 2/2006 | Porret et al. |
| 2006/0192645 A1 | 8/2006 | Lee et al. |
| 2006/0284718 A1 | 12/2006 | Baumgartner et al. |
| 2007/0018767 A1 | 1/2007 | Gabara |
| 2007/0020969 A1 | 1/2007 | Yungers |
| 2007/0023424 A1 | 2/2007 | Weber |
| 2007/0045773 A1 | 3/2007 | Mi et al. |
| 2007/0046544 A1 | 3/2007 | Murofushi et al. |
| 2007/0080810 A1 | 4/2007 | Juds |
| 2007/0095913 A1 | 5/2007 | Takahashi et al. |
| 2007/0120629 A1 | 5/2007 | Schnell et al. |
| 2007/0126544 A1 | 6/2007 | Wotherspoon et al. |
| 2007/0139275 A1 | 6/2007 | Deaett et al. |
| 2007/0179570 A1 | 8/2007 | De Taboada et al. |
| 2007/0182367 A1 | 8/2007 | Partovi |
| 2007/0267718 A1 | 11/2007 | Lee |
| 2007/0279287 A1 | 12/2007 | Castaneda et al. |
| 2008/0039332 A1 | 2/2008 | Bernstein et al. |
| 2008/0055178 A1 | 3/2008 | Kim et al. |
| 2008/0062066 A1 | 3/2008 | Arai |
| 2008/0067874 A1 | 3/2008 | Tseng |
| 2008/0150693 A1 | 6/2008 | You et al. |
| 2008/0164839 A1 * | 7/2008 | Kato ............ H02J 7/04 320/108 |
| 2008/0164840 A1 | 7/2008 | Kato et al. |
| 2008/0164844 A1 | 7/2008 | Kato et al. |
| 2008/0164960 A1 | 7/2008 | Schnell et al. |
| 2008/0169910 A1 | 7/2008 | Greene et al. |
| 2008/0205495 A1 | 8/2008 | Trott |
| 2008/0211320 A1 | 9/2008 | Cook et al. |
| 2008/0277386 A1 | 11/2008 | Haimer |
| 2008/0278399 A1 | 11/2008 | Nakajima et al. |
| 2008/0283277 A1 | 11/2008 | Muramatsu et al. |
| 2008/0303735 A1 | 12/2008 | Fujimoto et al. |
| 2009/0015266 A1 | 1/2009 | Narita et al. |
| 2009/0058189 A1 | 3/2009 | Cook et al. |
| 2009/0079387 A1 | 3/2009 | Jin et al. |
| 2009/0079628 A1 | 3/2009 | Rofougaran |
| 2009/0085706 A1 | 4/2009 | Baarman et al. |
| 2009/0096413 A1 | 4/2009 | Partovi et al. |
| 2009/0108974 A1 | 4/2009 | Raggam et al. |
| 2009/0134875 A1 | 5/2009 | Tomiha et al. |
| 2009/0140691 A1 | 6/2009 | Jung |
| 2009/0152542 A1 | 6/2009 | Lee et al. |
| 2009/0171178 A1 * | 7/2009 | He ............ A61B 5/0031 600/365 |
| 2009/0197435 A1 | 8/2009 | Jessup et al. |
| 2009/0230777 A1 | 9/2009 | Baarman et al. |
| 2009/0261778 A1 | 10/2009 | Kook |
| 2009/0261936 A1 | 10/2009 | Widjaja et al. |
| 2009/0271048 A1 | 10/2009 | Wakamatsu |
| 2009/0287807 A1 * | 11/2009 | Sueyoshi ............ G06F 9/54 707/999.01 |
| 2010/0007215 A1 | 1/2010 | Sakuma |
| 2010/0033290 A1 | 2/2010 | Liu et al. |
| 2010/0072588 A1 | 3/2010 | Yang |
| 2010/0127660 A1 | 5/2010 | Cook et al. |
| 2010/0141042 A1 | 6/2010 | Kesler et al. |
| 2010/0144308 A1 | 6/2010 | Jin et al. |
| 2010/0164296 A1 | 7/2010 | Kurs et al. |
| 2010/0164632 A1 * | 7/2010 | Blednov ............ H03F 3/217 330/277 |
| 2010/0181961 A1 * | 7/2010 | Novak ............ H04W 52/04 320/108 |
| 2010/0201310 A1 | 8/2010 | Vorenkamp et al. |
| 2010/0219694 A1 | 9/2010 | Kurs et al. |
| 2010/0289599 A1 | 11/2010 | Knecht et al. |
| 2010/0289709 A1 | 11/2010 | Guan |
| 2010/0295701 A1 | 11/2010 | Denis et al. |
| 2011/0024510 A1 | 2/2011 | Kato et al. |
| 2011/0084656 A1 | 4/2011 | Gao |
| 2011/0101788 A1 | 5/2011 | Sun et al. |

(56) References Cited

U.S. PATENT DOCUMENTS

| | | | |
|---|---|---|---|
| 2011/0127951 A1* | 6/2011 | Walley | H02J 50/10 320/108 |
| 2011/0137379 A1 | 6/2011 | Wosmek et al. | |
| 2011/0181484 A1 | 7/2011 | Pettus et al. | |
| 2011/0205315 A1 | 8/2011 | Saga et al. | |
| 2011/0212691 A1 | 9/2011 | Rott et al. | |
| 2011/0241437 A1 | 10/2011 | Kanno | |
| 2011/0248891 A1 | 10/2011 | Han et al. | |
| 2011/0279198 A1 | 11/2011 | Haner | |
| 2011/0291613 A1 | 12/2011 | Rosik et al. | |
| 2012/0038317 A1 | 2/2012 | Miyamoto et al. | |
| 2012/0062345 A1 | 3/2012 | Kurs et al. | |
| 2012/0095531 A1 | 4/2012 | Derbas et al. | |
| 2012/0153742 A1* | 6/2012 | Lee | H02J 50/80 307/104 |
| 2012/0169434 A1 | 7/2012 | Masuda et al. | |
| 2012/0170337 A1 | 7/2012 | Lisi et al. | |
| 2012/0217819 A1 | 8/2012 | Yamakawa et al. | |
| 2012/0223589 A1 | 9/2012 | Low et al. | |
| 2012/0223590 A1 | 9/2012 | Low et al. | |
| 2012/0235500 A1 | 9/2012 | Ganem et al. | |
| 2012/0235634 A1 | 9/2012 | Hall et al. | |
| 2012/0235636 A1 | 9/2012 | Partovi | |
| 2012/0248887 A1 | 10/2012 | Kesler et al. | |
| 2012/0249396 A1 | 10/2012 | Parsche | |
| 2012/0256494 A1 | 10/2012 | Kesler et al. | |
| 2012/0262109 A1 | 10/2012 | Toya et al. | |
| 2012/0274148 A1 | 11/2012 | Sung et al. | |
| 2012/0280765 A1 | 11/2012 | Kurs et al. | |
| 2012/0293011 A1 | 11/2012 | Byun et al. | |
| 2012/0305792 A1 | 12/2012 | Kuwabara et al. | |
| 2012/0313579 A1 | 12/2012 | Matsumoto et al. | |
| 2012/0315772 A1 | 12/2012 | Joschika | |
| 2012/0323512 A1 | 12/2012 | Rhodin | |
| 2012/0326524 A1 | 12/2012 | Matsumoto et al. | |
| 2012/0326931 A1 | 12/2012 | Murayama et al. | |
| 2013/0015718 A1 | 1/2013 | Jung et al. | |
| 2013/0063223 A1* | 3/2013 | See | H03F 1/56 333/32 |
| 2013/0067737 A1 | 3/2013 | Singh et al. | |
| 2013/0067738 A1 | 3/2013 | Singh et al. | |
| 2013/0068499 A1 | 3/2013 | Singh et al. | |
| 2013/0068507 A1 | 3/2013 | Singh et al. | |
| 2013/0069748 A1 | 3/2013 | Singh et al. | |
| 2013/0069749 A1 | 3/2013 | Singh et al. | |
| 2013/0069750 A1 | 3/2013 | Singh et al. | |
| 2013/0069843 A1 | 3/2013 | Singh et al. | |
| 2013/0076154 A1 | 3/2013 | Baarman et al. | |
| 2013/0093629 A1 | 4/2013 | Chiu et al. | |
| 2013/0099734 A1 | 4/2013 | Lee et al. | |
| 2013/0099975 A1* | 4/2013 | Cyganski | G08B 21/0263 342/432 |
| 2013/0101133 A1* | 4/2013 | Yoon | H04R 3/12 381/77 |
| 2013/0140900 A1 | 6/2013 | Yu et al. | |
| 2013/0146671 A1 | 6/2013 | Grieshofer et al. | |
| 2013/0147427 A1* | 6/2013 | Polu | H04B 5/26 320/108 |
| 2013/0154557 A1 | 6/2013 | Lee et al. | |
| 2013/0169060 A1 | 7/2013 | Jung et al. | |
| 2013/0181535 A1 | 7/2013 | Muratov et al. | |
| 2013/0199027 A1 | 8/2013 | Singh et al. | |
| 2013/0199028 A1 | 8/2013 | Singh et al. | |
| 2013/0200070 A1 | 8/2013 | Singh et al. | |
| 2013/0200722 A1 | 8/2013 | Singh et al. | |
| 2013/0200968 A1 | 8/2013 | Singh et al. | |
| 2013/0200969 A1 | 8/2013 | Singh et al. | |
| 2013/0200976 A1 | 8/2013 | Singh et al. | |
| 2013/0201589 A1 | 8/2013 | Singh et al. | |
| 2013/0205582 A1 | 8/2013 | Singh et al. | |
| 2013/0207744 A1 | 8/2013 | Singh et al. | |
| 2013/0208389 A1 | 8/2013 | Singh et al. | |
| 2013/0208390 A1 | 8/2013 | Singh et al. | |
| 2013/0234899 A1 | 9/2013 | Pope et al. | |
| 2013/0257362 A1 | 10/2013 | Lim et al. | |
| 2013/0257670 A1 | 10/2013 | Sovero et al. | |
| 2013/0285605 A1 | 10/2013 | Partovi | |
| 2013/0293028 A1 | 11/2013 | Byun et al. | |
| 2013/0300207 A1 | 11/2013 | Wang | |
| 2013/0335284 A1 | 12/2013 | Hsu et al. | |
| 2014/0008974 A1 | 1/2014 | Miyamoto | |
| 2014/0009110 A1 | 1/2014 | Lee et al. | |
| 2014/0015330 A1 | 1/2014 | Byun et al. | |
| 2014/0028111 A1 | 1/2014 | Hansen et al. | |
| 2014/0035383 A1 | 2/2014 | Riehl | |
| 2014/0035793 A1 | 2/2014 | Kato et al. | |
| 2014/0041218 A1 | 2/2014 | Signh et al. | |
| 2014/0047713 A1 | 2/2014 | Singh et al. | |
| 2014/0084946 A1 | 3/2014 | Clark et al. | |
| 2014/0113551 A1* | 4/2014 | Krishnan | H04B 5/72 455/90.3 |
| 2014/0162554 A1 | 6/2014 | Sankar et al. | |
| 2014/0168019 A1 | 6/2014 | Hirobe et al. | |
| 2014/0183971 A1 | 7/2014 | Endo et al. | |
| 2014/0184334 A1 | 7/2014 | Nobbe et al. | |
| 2014/0197694 A1 | 7/2014 | Asanuma et al. | |
| 2014/0203661 A1 | 7/2014 | Dayan et al. | |
| 2014/0226795 A1 | 8/2014 | Kitano | |
| 2014/0231518 A1 | 8/2014 | Yosui | |
| 2014/0253052 A1 | 9/2014 | Goma et al. | |
| 2014/0266019 A1 | 9/2014 | Pigott | |
| 2014/0266036 A1* | 9/2014 | Jung | B60L 53/124 320/108 |
| 2014/0266624 A1 | 9/2014 | Van Bosch et al. | |
| 2014/0302782 A1 | 10/2014 | Raab et al. | |
| 2014/0306548 A1 | 10/2014 | Yang | |
| 2014/0312242 A1 | 10/2014 | Valentino et al. | |
| 2014/0319921 A1 | 10/2014 | Lisi et al. | |
| 2014/0361628 A1 | 12/2014 | Huang et al. | |
| 2015/0054455 A1 | 2/2015 | Kim et al. | |
| 2015/0070190 A1 | 3/2015 | Wai Fong et al. | |
| 2015/0076922 A1 | 3/2015 | Kato et al. | |
| 2015/0084586 A1* | 3/2015 | Von Novak, III | H02J 50/27 320/108 |
| 2015/0091502 A1 | 4/2015 | Mukherjee et al. | |
| 2015/0115727 A1 | 4/2015 | Carobolante et al. | |
| 2015/0136858 A1 | 5/2015 | Finn et al. | |
| 2015/0137746 A1 | 5/2015 | Lee et al. | |
| 2015/0140807 A1 | 5/2015 | Mohammed et al. | |
| 2015/0145634 A1 | 5/2015 | Kurz et al. | |
| 2015/0145635 A1 | 5/2015 | Kurz et al. | |
| 2015/0180440 A1 | 6/2015 | Ishizuka | |
| 2015/0200445 A1 | 7/2015 | Murphy | |
| 2015/0207541 A1 | 7/2015 | Kuroda | |
| 2015/0234035 A1 | 8/2015 | Lohoefener et al. | |
| 2015/0236545 A1 | 8/2015 | Hyun et al. | |
| 2015/0236550 A1 | 8/2015 | Yang et al. | |
| 2015/0249359 A1 | 9/2015 | Gunderson | |
| 2015/0255994 A1 | 9/2015 | Kesler et al. | |
| 2015/0280322 A1 | 10/2015 | Saito et al. | |
| 2015/0290379 A1 | 10/2015 | Rudser et al. | |
| 2015/0318710 A1 | 11/2015 | Lee et al. | |
| 2015/0349110 A1 | 12/2015 | Kocon | |
| 2015/0349541 A1 | 12/2015 | Yamamoto et al. | |
| 2015/0351292 A1 | 12/2015 | Chang et al. | |
| 2015/0357827 A1 | 12/2015 | Muratov et al. | |
| 2015/0372493 A1 | 12/2015 | Sankar | |
| 2016/0001663 A1 | 1/2016 | Chae et al. | |
| 2016/0013565 A1 | 1/2016 | Ortiz | |
| 2016/0028265 A1 | 1/2016 | Bell et al. | |
| 2016/0036244 A1 | 2/2016 | Griffith | |
| 2016/0049826 A1 | 2/2016 | Lee et al. | |
| 2016/0056639 A1 | 2/2016 | Mao | |
| 2016/0056664 A1 | 2/2016 | Partovi | |
| 2016/0064952 A1 | 3/2016 | Matsumoto et al. | |
| 2016/0072306 A1 | 3/2016 | Tsuda et al. | |
| 2016/0105963 A1 | 4/2016 | Isom et al. | |
| 2016/0111889 A1 | 4/2016 | Jeong | |
| 2016/0118711 A1 | 4/2016 | Finn et al. | |
| 2016/0126002 A1 | 5/2016 | Chien et al. | |
| 2016/0149416 A1 | 5/2016 | Ha et al. | |
| 2016/0156103 A1 | 6/2016 | Bae et al. | |
| 2016/0156215 A1 | 6/2016 | Bae et al. | |

(56) References Cited

U.S. PATENT DOCUMENTS

| | | |
|---|---|---|
| 2016/0165323 A1 | 6/2016 | Hollis |
| 2016/0183034 A1 | 6/2016 | Konanur et al. |
| 2016/0183056 A1 | 6/2016 | Leabman |
| 2016/0197513 A1 | 7/2016 | Uchimoto et al. |
| 2016/0224975 A1 | 8/2016 | Na et al. |
| 2016/0254679 A1 | 9/2016 | Liu et al. |
| 2016/0264007 A1 | 9/2016 | Haase |
| 2016/0285321 A1 | 9/2016 | Akuzawa et al. |
| 2016/0325105 A1 | 11/2016 | Etzkorn et al. |
| 2016/0330823 A1 | 11/2016 | Hwa et al. |
| 2017/0025900 A1 | 1/2017 | Amari et al. |
| 2017/0033610 A1 | 2/2017 | Borin |
| 2017/0033613 A1 | 2/2017 | Takahashi |
| 2017/0040846 A1 | 2/2017 | Sankar |
| 2017/0070249 A1 | 3/2017 | Irish et al. |
| 2017/0093198 A1 | 3/2017 | Graham et al. |
| 2017/0093222 A1 | 3/2017 | Joye et al. |
| 2017/0111243 A1 | 4/2017 | Bell et al. |
| 2017/0117755 A1 | 4/2017 | Muratov et al. |
| 2017/0126069 A1 | 5/2017 | Martin |
| 2017/0126544 A1 | 5/2017 | Mgneras et al. |
| 2017/0180013 A1* | 6/2017 | Kuttan ............... H04B 1/0475 |
| 2017/0222466 A1 | 8/2017 | Sankar |
| 2017/0240007 A1 | 8/2017 | Chuang |
| 2017/0256956 A1 | 9/2017 | Irish et al. |
| 2017/0346343 A1 | 11/2017 | Atasoy et al. |
| 2017/0357338 A1 | 12/2017 | Bell |
| 2017/0372837 A1 | 12/2017 | Lee et al. |
| 2018/0013307 A1 | 1/2018 | Pudipeddi |
| 2018/0043861 A1 | 2/2018 | Kosugi |
| 2018/0054090 A1 | 2/2018 | Von Novak, III et al. |
| 2018/0083669 A1 | 3/2018 | Jeong et al. |
| 2018/0131231 A1 | 5/2018 | Nakano et al. |
| 2018/0167107 A1 | 6/2018 | Peralta et al. |
| 2018/0167108 A1 | 6/2018 | Peralta et al. |
| 2018/0167109 A1 | 6/2018 | Peralta et al. |
| 2018/0168057 A1 | 6/2018 | Peralta et al. |
| 2018/0212649 A1 | 7/2018 | Tenno |
| 2018/0219428 A1 | 8/2018 | Bae |
| 2018/0315968 A1 | 11/2018 | Koyama et al. |
| 2018/0339599 A1 | 11/2018 | Iwamoto et al. |
| 2019/0027969 A1 | 1/2019 | Staring et al. |
| 2019/0052116 A1 | 2/2019 | Bae |
| 2019/0140699 A1 | 5/2019 | Park et al. |
| 2019/0154448 A1 | 5/2019 | Cao |
| 2019/0222060 A1 | 7/2019 | Leem |
| 2019/0363545 A1 | 11/2019 | Lee et al. |

FOREIGN PATENT DOCUMENTS

| | | |
|---|---|---|
| CN | 201150058 Y | 11/2008 |
| CN | 203396791 U | 1/2014 |
| CN | 103944196 A | 7/2014 |
| CN | 104037493 A | 9/2014 |
| CN | 104037494 A | 9/2014 |
| CN | 104155511 A | 11/2014 |
| EP | 0310396 A1 | 4/1989 |
| EP | 0972268 B1 | 5/2002 |
| EP | 1609503 A1 | 12/2005 |
| EP | 2031729 A2 | 3/2009 |
| EP | 2420953 A1 | 2/2012 |
| EP | 2557630 A1 | 2/2013 |
| EP | 2775564 A1 | 9/2014 |
| EP | 2775565 A1 | 9/2014 |
| JP | H01310518 A | 12/1989 |
| JP | H0582349 A | 4/1993 |
| JP | H0583249 A | 4/1993 |
| JP | H08237021 A | 9/1996 |
| JP | 10993005 A | 4/1997 |
| JP | H10255629 A | 9/1998 |
| JP | H10289041 A | 10/1998 |
| JP | H11507448 A | 6/1999 |
| JP | 2001344574 A | 12/2001 |
| JP | 2003110394 A | 4/2003 |
| JP | 2003153457 A | 5/2003 |
| JP | 2005236585 A | 9/2005 |
| JP | 2007042569 A | 2/2007 |
| JP | 2008160781 A | 7/2008 |
| JP | 2008172874 A | 7/2008 |
| JP | 2008205215 A | 9/2008 |
| JP | 2008294285 A | 12/2008 |
| JP | 2008307114 A | 12/2008 |
| JP | 4329932 B2 | 9/2009 |
| JP | 2012147408 A | 8/2012 |
| JP | 2013051864 A | 3/2013 |
| JP | 2013093429 A | 5/2013 |
| JP | 2013161905 A | 8/2013 |
| JP | 2014175864 A | 9/2014 |
| JP | 2014175865 A | 9/2014 |
| JP | 2014530543 A | 11/2014 |
| JP | 2015008628 A | 1/2015 |
| JP | 2015195728 A | 11/2015 |
| JP | 2015537440 A | 12/2015 |
| JP | 2016041008 A * | 3/2016 ......... G06K 19/0701 |
| KR | 20100092741 A | 8/2010 |
| KR | 101216946 B1 | 1/2013 |
| KR | 20130015618 A | 2/2013 |
| KR | 20140111554 A | 9/2014 |
| KR | 20140111794 A | 9/2014 |
| KR | 20140133872 A | 11/2014 |
| KR | 20140135357 A | 11/2014 |
| KR | 101559939 B1 | 10/2015 |
| TW | 201436494 A | 9/2014 |
| TW | 201436495 A | 9/2014 |
| TW | 478461 B | 3/2015 |
| WO | 2008050917 A1 | 5/2008 |
| WO | 2010104569 A1 | 9/2010 |
| WO | 2010129369 A2 | 11/2010 |
| WO | 2012132242 A1 | 10/2012 |
| WO | 2014014425 A1 | 1/2014 |
| WO | 2015158500 A1 | 10/2015 |

OTHER PUBLICATIONS

Ex. 1032—U.S. Pat. No. 5,745,331 to Shamouilian et al., Apr. 28, 1998, 23 pages.

Ex. 1033—Hu, et al., "AC Resistance to Planar Power Inductors and the Quasidistributed Gap Technique," IEEE Transactions on Power Electronics, vol. 16, No. 4, Jul. 2001 ("Hu"), 13 pages.

Ex. 1035—A 1.2V 60-GHz Radio Receiver With On-Chip Transformers and Inductors in 90-nm CMOS, 2006 IEEE Compound Semiconductor Integrated Circuit Symposium, Nov. 12-15, 2006, 2 pages.

Ex. 1036 KRAEMER, et al., "Architecture Considerations for 60 GhzPulse Transceiver Front-Ends," CAS 2007 Proceedings vol. 2, 2007, Int'l Semiconductor Conference (2007), 26 pages.

Ex. 1037—Varonen, et al., "V-band Balanced Resistive Mixer in 65-nm CMOS," Proceedings of the 33rd European Solid-State Circuits Conference, 2007, 22 pages.

Ex. 1038—AC Resistance of Planar Power Inductors and the Quasidistributed Gap Technique, IEEE Transactions on Power Electronics, vol. 16, Issue 4, Jul. 2001, 2 pages.

Ex. 1039—Lopera et al., "A Multiwinding Modeling Method for High Frequency Transformers and Inductors", IEEE Transactions on Power Electronics, vol. 18, No. 3, May 2003, 14 pages.

Ex. 1040—Leonavicius et al., "Comparison of Realization Techniques for PFC Inductor Operating in Discontinuous Conduction Mode," IEEE Transactions on Power Electronics, vol. 19, No. 2, Mar. 2004, 14 pages.

Ex. 1041—Roshen W.A., "Fringing Field Formulas and Winding Loss Due to an Air Gap," IEEE Transactions on Magnetics, vol. 43, No. 8, Aug. 2007, 12 pages.

Exhibit A-01: Invalidity Contentions: '960 Patent in View Jitsuo, *NuCurrent v. Samsung Electronics America, Inc. et al.*, Case No. 1:19-cv-00798-DLC (S.D.N.Y.), Invalidity of U.S. Pat. No. 8,680,960 ("The '960 Patent") by Japanese Patent Application Publication JP05082349A ("Jitsuo"), Apr. 12, 2019, 56 pages.

Exhibit A-02: Invalidity Contentions: '960Patent in View of Kurs '694, *NuCurrent v. Samsung Electronics America, Inc. et al.*, Case No. 1:19-cv-00798-DLC (S.D.N.Y.) Invalidity of U.S. Pat. No.

(56) References Cited

OTHER PUBLICATIONS 8,680,960 ("The '960 Patent") by U.S. Patent Application Publication 2010/0219694 AI ("Kurs '694"), Apr. 12, 2019, 59 pages.
Exhibit A-03: Invalidity Contentions: '960 Patent in View of Sheng-Yuan, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2007/267718 A1 ("Sheng-Yuan"). Apr. 12, 2019, 86 pages.
Exhibit A-04: Invalidity Contentions: '960 Patent in View of Wotherspoon, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2007/0126544 A1 ("Wotherspoon"), Apr. 12, 2019, 51 pages.
Exhibit A-05: Invalidity Contentions: '960 Patent in View of Baarman 777, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2009/0230777A1 ("Baarman '777"), Apr. 12, 2019, 50 pages.
Exhibit A-06: Invalidity Contentions: '960 Patent in View of Bae, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Granted Publication 6897830 B2 ("Bae"), Apr. 12, 2019, 80 pages.
Exhibit A-07: Invalidity Contentions: '960 Patent in View of Ganem, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0235500 A1 ("Steven J. Ganem"), Apr. 12, 2019, 82 pages.
Exhibit A-08: Invalidity Contentions: '960 Patent in View of Gao, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 20111084656 A1 ("Gao"), Apr. 12, 2019, 39 pages.
Exhibit A-09: Invalidity Contentions: '960 Patent in View of Burghartz &Rejaei, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by on the Design of RF Spiral Inductors on Silicon ("Burghartz & Rejaei"), Apr. 12, 2019, 53 pages.
Exhibit A-10: Invalidity Contentions: '960 Patent in View of Hasegawa '215, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by Japanese Patent Application Publication 2008-205215 A ("Hasegawa Minoru"), Apr. 12, 2019, 46 pages.
Exhibit A-11: Invalidity Contentions: '960 Patent in View of Hasegawa '518, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by J.P. Patent Application Publication 01310518 A ("Hasegawa Michio '518"), Apr. 12, 2019, 82 pages.
Exhibit A-12: Invalidity Contentions: '960 Patent in View of Hasegawa Michio '631, *NuCurrent v. Samsung Electronics America, Inc. et al.*, Case No. 1:19-cv-00798-DLC (S.D.n. Y.) Invalidity of U.S. Pat. No. 3,680,960 ("The '960 Patent") by U.S. Patent Granted Publication 4959631 A ("Hasegawa Michio '631"), Apr. 12, 2019, 43 pages.
Exhibit A-13: Invalidity Contentions: '960 Patent in View of Ishihara, *NuCurrent v. Samsung Electronics America, Inc. et al.*, Case No. 1:19-cv-00798-DLC (S.D.n. Y.) Invalidity of U.S. Pat. No. 3,680,960 ("The '960 Patent") by JP Patent Application Publication 2008/294285 A ("Ishihara Keien"), Apr. 12, 2019, 37 pages.
Exhibit A-14: Invalidity Contentions: '960 Patent in View of Kato, *NuCurrent v. Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2008/164840 A1 ("Hiroshi Kato"), Apr. 12, 2019, 35 pages.

Exhibit A-15: Invalidity Contentions: '960 Patent in View of Kato, *NuCurrent v. Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2008/164844 A1 ("Hiroshi Kato"), Apr. 12, 2019, 40 pages.
Exhibit A-16: Invalidity Contentions: '960 Patent in View of Kimura, *NuCurrent v. Samsung Electronics America, Inc. et al.*, Case No. 1:19-cv-00798-DLC (S.D.n. Y.) Invalidity of U.S. Pat. No. 8,680,960 ("The '960 Patent") by U.S. Patent Application Publication 2002/071003 A1 ("Isao Kimura"), Apr. 12, 2019, 59 pages.
Exhibit A-17: Invalidity Contentions: '960 Patent in View of Kurs 765, *NuCurrent v. Samsung Electronics America, Inc. et al.*, Case No. 1:19-cv-00798-DLC (S.D.N.Y.) Invalidity of U.S. Pat. No. 3,680,960 ("The '960 Patent") by U.S. Patent Application Publication 2012/0280765 A1 ("Kurs '765"), Apr. 12, 2019, 57 pages.
Exhibit A-18: Invalidity Contentions: '960 Patent in View of Misumi, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by Japanese. Patent Application Publication JP 10255629 A ("Misumi Shuichi"), Apr. 12, 2019, 37 pages.
Exhibit A-19: Invalidity Contentions: '960 Patent in View of Nakatani, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2004/227608 A1 ("Toshifumi Nakatani"), Apr. 12, 2019, 58 pages.
Exhibit A-20: Invalidity Contentions: '960 Patent in View of Partovi '367, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2007/0182367 A1 ("Partovi '367"), Apr. 12, 2019, 49 pages.
Exhibit A-21: Invalidity Contentions: '960 Patent in View of Inventor Partovi '413, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S.Patent Application Publication 2009/0096413 A1 ("Afshin Partovi '413"), Apr. 12, 2019, 45 pages.
Exhibit A-22: Invalidity Contentions: '960 Patent in View of Partovi '636, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0235636 A1 ("Afshin Partovi '636"), Apr. 12, 2019, 64 pages.
Exhibit A-23: Invalidity Contentions: '960 Patent in View of QI 0.95, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by Qi System Description, Wireless Power Transfer, vol. 1: Low Power, Version 0.95 ("Qi 0.95"), Apr. 12, 2019, 26 pages.
Exhibit A-24: Invalidity Contentions: '960 Patent in View of QI 1.0.1, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by Qi System Description, Wireless Power Transfer, vol. 1: Low Power, Part 1: Interface Definition, Version 1.0.1 ("Qi 1.0.1"), Apr. 12, 2019, 49 pages.
Exhibit A-25: Invalidity Contentions: '960 Patent in View of Shima, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Pat. No. 5,808,587 A ("Hiroshi Shima"), Apr. 12, 2019, 87 pages.
Exhibit A-26: Invalidity Contentions: '960 Patent in View of Sun, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2011/0101788 A1 ("Sun"), Apr. 12, 2019, 65 pages.
Exhibit A-27: Invalidity Contentions: '960 Patent in View of Tseng, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Pat. No. 9,912, 173 B2 ("Ryan Tseng"), Apr. 12, 2019, 67 pages.
Exhibit A-28: Invalidity Contentions: '960 Patent in View of Von Novak, III, *NuCurrent v. Samsung Electronics America, Inc. et al.*,

(56) References Cited

OTHER PUBLICATIONS

Case No. 1:19-cv-00798-DLC (S.D.N.Y.) Invalidity of U.S. Pat. No. 8,680,960 ("The '960 Patent") by U.S. Pat. No. 9,559,526 B2 ("William H. Von Novak, III"), Apr. 12, 2019, 57 pages.
Exhibit A-29: Invalidity Contentions: '960 Patent in View of Yamakawa, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2012/0217819 A1 ("Yamakawa"), Apr. 12, 2019, 40 pages.
Exhibit A-30: Invalidity Contentions: '960 Patent in View of Yoon & Allen, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by Embedded Conductor Technology for Micromachined Rf Elements ("Yoon & Allen"), Apr. 12, 2019, 13 pages.
Exhibit A-31: Invalidity Contentions: '960 Patent in View of the Blackberry Z30, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by the Blackberry Z30, Apr. 12, 2019, 154 pages.
Exhibit A-32: Invalidity Contentions: '960 Patent in View of the LG G2, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by the LG G2, Apr. 12, 2019, 462 pages.
Exhibit A-33: Invalidity Contentions: '960 Patent in View of the LG G3, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by the LG G3, Apr. 12, 2019, 228 pages.
Exhibit A-34: Invalidity Contentions: '960 Patent in View of the LG Nexus 5, *NuCurrent v. Samsung Electronics America, Inc. et al.*, Case No. 1:19-cv-00798-DLC (S.D.N.Y.) Invalidity of U.S. Pat. No. 8,680,960 ("The '960 Patent") by the LG Nexus 5, Apr. 12, 2019, 391 pages.
Exhibit B-01: Invalidity Contentions: '046 Patent in View of Jitsuo, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Japanese Patent Application Publication JP05082349A ("Jitsuo"), Apr. 12, 2019, 50 pages.
Exhibit B-02: Invalidity Contentions: '046 Patent in View of Kurs '694, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2010/0219694 A1 ("Kurs '694"), Apr. 12, 2019, 51 pages.
Exhibit B-03: Invalidity Contentions: '046 Patent in View of Sheng-Yuan, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by U.S. Patent Application Publication 2007/267718 A1 ("Sheng-Yuan"), Apr. 12, 2019, 76 pages.
Exhibit B-04: Invalidity Contentions: '046 Patent in View of Wotherspoon, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2007/0126544 A1 ("Wotherspoon"), Apr. 12, 2019, 44 pages.
Exhibit B-05: Invalidity Contentions: '046 Patent in View of Baarman '777, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2009/0230777A1 ("Baarman '777"), Apr. 12, 2019, 42 pages.
Exhibit B-06: Invalidity Contentions: '046 Patent in View of Bae, *NuCurrent v. Samsung Electronics America, Inc. et al.*, Case No. 1:19-cv-00798-Dlc (S.D.N.Y.) Invalidity of U.S. Pat. No. 9,300,046 ("The '046 3atent") by U.S. Patent Granted Publication 6897830 B2 ("Bae"), Apr. 12, 2019, 71 pages.
Exhibit B-07: Invalidity Contentions: '046 Patent in View of Burghartz &Rejaei, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by On the Design of RF Spiral Inductors on Silicon ("Burghartz & Rejaei"), Apr. 12, 2019, 45 pages.
IPR2019-00859—*Samsung Electronics Co., Ltd. vs. NuCurrent, Inc.*, Ex. 1025—U.S. Pat. No. 20070126544A1 to Wotherspoon, Mar. 22, 2019, 6 pages.
IPR2019-00859—*Samsung Electronics Co., Ltd. vs. NuCurrent, Inc.*, Samsung Ex. 1042-Order Denying [167] Motion for Preliminary Injunction, Jul. 2, 2019, 15 pages.
IPR2019-00860—Ex. 1022 U.S. Pat. No. 9,912,173 to Tseng, Mar. 6, 2018, 31 pages.
IPR2019-00860—Ex. 1023 U.S. Pat. No. 7,248,138 to Chiang, Jul. 24, 2007, 18 pages.
IPR2019-00860—Ex. 1024 U.S. Pat. No. 5,084,958 to Yerman et al., Feb. 4, 1992, 20 pages.
IPR2019-00860—Ex. 1028-U.S. Pat. No. 9,820,374 to Bois et al., Nov. 14, 2017, 9 pages.
IPR2019-00860—Ex. 1029 U.S. Pat. No. 7,601,919 to Phan et al., Oct. 13, 2009, 14 pages.
IPR2019-00860—Ex. 1030 U.S. Pat. No. 5,108,825 to Wojnarowski et al., Apr. 28, 1992, 10 pages.
IPR2019-00860—Ex. 1034—U.S. Pat. No. 6,608,363 to Fazelpour, Aug. 19, 2003, 8 pages.
IPR2019-00860—*Samsung Electronics Co., Ltd. v. NuCurrent, Inc.*, Decision Denying Institution of Inter Partes Review re U.S. Pat. No. 8,680,960 B2, Sep. 25, 2019, 6 pages.
IPR2019-00860—*Samsung Electronics Co., Ltd. v. NuCurrent, Inc.*, Petition for Inter Partes Review of U.S. Pat. No. 3,680,960, Mar. 22, 2019, 86 pages.
IPR2019-00860—Samsung Exhibit 1042, *Samsung Electronics Co., Ltd. v. NuCurrent, Inc.*, Order Denying [167] Motion for Preliminary Injunction, *NuCurrent, Inc. v. Samsung Electronics Co., Ltd et al.*, Case 1:19-cv-00798-DLC, Jul. 2, 2019, 15 pages.
IPR2019-00861—*Samsung Electronics Co., Ltd. v. NuCurrent, Inc.*, Petition for Inter Partes Review of U.S. Pat. No. 9,300,046, Mar. 22, 2019, 89 pages.
IPR2019-00862, *Samsung Electronics Co., Ltd. vs. NuCurrent, Inc.*, Samsung Exhibit 1042—Order Denying [167] Motion for Preliminary injunction, *NuCurrent, Inc. vs. Samsung Electronics Co., Ltd et al.*, Case No. 1:19-cv-00798-DLC, Jul. 2, 2019, 15 pages.
IPR2019-00862—*Samsung Electronics Co., Ltd. v. NuCurrent, Inc.*, Petition for Inter Partes Review of U.S. Pat. No. 8,710,948, Mar. 22, 2019, 88 pages.
IPR2019-00863, *Samsung Electronics Co., Ltd. v. NuCurrent, Inc.*, Decision Granting Institution of Inter Partes Review re U.S. Pat. No. 8,698,591 B2, Oct. 7, 2019, 42 pages.
IPR2019-00863—Ex. 1002—*Samsung Electronics Co., Ltd. v. NuCurrent, Inc.*, Corrected Dr. Steven Leeb Declaration, Mar. 22, 2019, 124 pages.
IPR2019-01217—*Samsung Electronics Co., Ltd. v. NuCurrent, Inc.*, Petition for Inter Partes Review of U.S. Pat. No. 9,941,729, Jun. 19, 2019, 90 pages.
IPR2019-01217—Ex. 1001—U.S. Pat. No. 9,941,729, Peralta, Apr. 10, 2018, 48 pages.
IPR2019-01217—Ex. 1002—*Samsung Electronics Co., Ltd. v. NuCurrent, Inc.*, Declaration of R. Jacob Baker, Ph.D., Re., in Support of Petition for Inter Partes Review of U.S. Pat. No. 9,941,729, Jun. 17, 2019, 143 pages.
IPR2019-01217—Ex. 1003-CV of R. Jacob Baker, Jun. 19, 2019, 35 pages.
IPR2019-01217—Ex. 1004—U.S. Appl. No. 14/821,065, filed Aug. 7, 2015, part 1, 330 pages.
IPR2019-01217—Ex. 1004-U.S. Appl. No. 14/821,065, filed Aug. 7, 2015, part 3, 230 pages.
IPR2019-01217—Ex. 1004—U.S. Appl. No. 14/821,065, filed Aug. 7, 2015, part 4, 299 pages.
IPR2019-01217—Ex. 1004—U.S. Appl. No. 14/821,065, part 2, filing date Aug. 7, 2015, 430 pages.
IPR2019-01217—Ex. 1015—Wotherspoon—US 2007/0126544, Jun. 7, 2007, 6 pages.
IPR2019-0863, *Samsung Electronics Co., Ltd. v. NuCurrent, Inc.*, Petition for Inter Partes Review of U.S. Pat. No. 8,698,591, Mar. 22, 2019, 89 pages.

(56) References Cited

OTHER PUBLICATIONS

Lee, Y., "Antenna Circuit Design for RFID Applications", 2003 Microchip Technology, AN710, 50 pages.
Muratov, V., "Multi-Mode Wireless Power Systems can be a bridge to the Promised Land of Universal Contactless charging", Mediatek, Inc., Nov. 20, 2014, 15 pages.
Narayanan, R., "Wireless Power Charging Coil Changing Considerations", Wurth Elektronik, Feb. 23, 2015, 9 pages.
Notification of Decision of Rejection dated May 14, 2019 for KR 10-2013-0026135, 8 pages.
Notification of Decision of Rejection dated May 14, 2019 for KR App. No. 10-2013-0025858, with English Translation, 8 pages.
Office Action dated Apr. 27, 2018 in corresponding TW Application No. 102108345, 11 pages.
Office Action dated Aug. 23, 2017 in corresponding CN Application No. 201310074946.8, 10 pages.
Office Action dated Aug. 25, 2017 in corresponding CN Application No. 201310075086.X, 10 pages.
Office Action dated Dec. 12, 2017 issued in corresponding Japanese Patent Application No. 2013-047048, 11 pages.
Office Action dated Feb. 21, 2017, issued in corresponding Taiwanese Patent Application No. 102108342, 10 pages.
Office Action dated Jan. 31, 2017 in corresponding JP Application No. 2013-047049, 5 pages.
Office Action dated Jun. 29, 2017 issued in corresponding EP Patent Application No. 14000885.5, 4 pages.
Office Action dated Mar. 21, 2017 issued in corresponding Japanese Patent Application No. 2013-047048, 12 pages.
Office Action dated Mar. 27, 2018 issued in corresponding Chinese Patent Application No. 201310075086.X, 12 pages.
Office Action dated Mar. 30, 2018 issued in corresponding Chinese Patent Application No. 201310074946.8, 12 pages.
Office Action dated May 8, 2018, issued in corresponding Japanese Patent Application No. 2013-047048, 2 pages.
Office Action dated Nov. 28, 2017 in corresponding JP Application No. 2013-047049, 5 pages.
Office Action dated Oct. 29, 2018 in corresponding KR Application No. 10-2013-0025858, 12 pages.
Office Action dated Oct. 29, 2018 in corresponding KR Application No. 10-2013-0026135, 12 pages.
Office Action dated Sep. 12, 2018 in corresponding CN Application No. 201310074946.8, 9 pages.
Office Action dated Sep. 12, 2018 in corresponding CN Application No. 201310075086.X, 10 pages.
Office Action dated Sep. 27, 2016 in corresponding EP Application No. 13 001 121.6, 6 pages.
Office Action dated Sep. 27, 2016 in corresponding EP Application No. 13 001 130.7 6, pages.
PGR2019-00049—Ex. 1002—*Samsung Electronics Co., Ltd.,* v. *NuCurrent, Inc.,* Declaration of Jacob Baker, Ph.D., P. E. In Support of Petition for Post-Grant Review of U.S. Pat. No. 10,063,100, May 27, 2019, 141 pages.
PGR2019-00049—*Samsung Electronics Co., Ltd.* v. *NuCurrent, Inc.,* Petition for Post-Grant Review re U.S. Pat. No. 10,063,100, May 28, 2019, 112 pages.
PGR2019-0050—Ex. 1006 File History for U.S. Appl. No. 14/821,065, filed Aug. 7, 2015, Part 2, 430 pages.
PGR2019-0050—Ex. 1006 File History for U.S. Appl. No. 14/821,065, filed Aug. 7, 2015, Part 3, 230 pages.
PGR2019-0050—Ex. 1006 File History for U.S. Appl. No. 14/821,065, filed Aug. 7, 2015, Part 4, 299 pages.
PGR2019-0050—Ex. 1006 File History for U.S. Appl. No. 14/821,065, Part 1, filing date Aug. 7, 2015, 330 pages.
PGR2019-0050—Ex. 1002—Declaration of R. Jacob Baker, Ph.D., P.E. In Support of Petition for Post-Grant Review of U.S. Pat. No. 10,063,100, *Samsung Electronics Co., Ltd.* v. *NuCurrent, Inc.,* May 27, 2019, 42 pages.
PGR2019-0050—Ex. 1005 U.S. Pat. No. 9,941,729 to Peralta et al., Apr. 10, 2018, 48 pages.
PGR2019-0050—Ex. 1008—First Amended Complaint for *NuCurrent, Inc.* v. *Samsung Electronics Co., Ltd.;* Samsung Electronics America, Inc., Case. No. 6:18-cv-00051-JRG-KNM, Jun. 19, 2018, 62 pages.
PGR2019-0050—Ex. 1009—NuCurrent's Opening Claim Construction Brief, *NuCurrent, Inc.* v. *Samsung Electronics Co., Ltd.,* Case. No. 1:19-CV-00798-DLC, May 10, 2019, 31 pages.
PGR2019-0050—*Samsung Electronics Co., Ltd.* v. *NuCurrent, Inc.,* Petition for Post-Grant Review of U.S. Pat. No. 10,063, 100, May 28, 2019, 73 pages.
QI 2009, "System Description Wireless Power Transfer", vol. 1, Low Power, Version 0.95, Jul. 2009, 76 pages.
QI 2010, "System Description Wireless Power Transfer", vol. 1, Low Power, Part 1: Interface Definition, Version 1.0.1, Oct. 2010, Wireless Power Consortium, 86 pages.
Relative Permativity—Dielectric Constant—Jul. 2011, 3 pages.
*Samsung Electronics Co., Ltd.* v. *NuCurrent, Inc.* Case IPR2019-00858, Decision Granting Institution of Inter Partes Review re U.S. Pat. No. 8,680,960, Sep. 25, 2019, 44 pages.
*Samsung Electronics Co., Ltd.* v. *NuCurrent, Inc.,* Case IPR2019-00861, Decision Denying Institution of Inter Partes Review re U.S. Pat. No. 9,300,046 B2, Sep. 25, 2019, 6 pages.
*Samsung Electronics Co., Ltd.* v. *NuCurrent, Inc.,* Case IPR2019-00862, Decision Granting of Inter Partes Review re U.S. Pat. No. 8,710,948 B2, Oct. 4, 2019, 41 pages.
Samsung Ex. 1002, *Samsung Electronics Co., Ltd., v. NuCurrent, Inc.,* U.S. Pat. No. 8,680,960, Declaration of Dr. Steven eeb, Mar. 22, 2019, 115 pages.
Sun M., et al., "Apparatus for Wireless Power and Data Transfer over a Distance", University of Pittsburgh, Jun. 2009, 30 pages.
Yoon, Y., "Embedded Conductor Technology for Micromachined RF Elements", Journal of Micromechanics and Micro engineering, Jun. 2005, 11 pages.
Exhibit E-06: Invalidity Contentions: '729 Patent in View of Muratov, *NuCurrent* v. *Samsung Electronics America, Inc. et al.,* Case No. 1:19-cv-00798-DLC (S.D.N.Y.) Invalidity of U.S. Pat. No. 3,941,729 ("The '729 Patent") by United States Patent Application Publication No. 2015/0357827 ("Muratov"), Apr. 12, 2019, 35 pages.
Exhibit E-07: Invalidity Contentions: '729 Patent in View of Sung, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Publication No. 2012/0274148 ("Sung"), Apr. 12, 2019, 27 pages.
Exhibit E-08 : Invalidity Contentions: '729 Patent in View of Kurz '635, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Publication No. 2015/0145635 ("Kurz '635"), Apr. 12, 2019, 133 pages.
Exhibit E-09: Invalidity Contentions: '729 Patent in View of Kurz '634, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Publication No. 2015/0145635 ("Kurz '634"), Apr. 12, 2019, 122 pages.
Exhibit E-10: Invalidity Contentions: '729 Patent in View of Lee '746, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Application Publication No. 2015/0137746 ("Lee '746"), Apr. 12, 2019, 34 pages.
Exhibit E-11: Invalidity Contentions: '729 Patent in View of Mukherjee, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Publication No. 2015/0091502 ("Mukherjee"), Apr. 12, 2019, 32 pages.
Exhibit E-12: Invalidity Contentions: '729 Patent in View of Asanuma, *NuCurrent* v. *Samsung Electronics America, Inc. et al.,* Case No. 1:19-cv-00798-DLC (S.D.N.Y.) Invalidity of U.S. Pat. No. 9,941,729 ("The '729 Patent") by United States Patent Application Publication No. 2014/0197694 ("Asanuma"), Apr. 12, 2019, 24 pages.
Exhibit E-13: Invalidity Contentions: '729 Patent in View of Takashi, *NuCurrent* v. *Samsung Electronics America, Inc. et al.,* Case No. 1:19-cv-00798-DLC (S.D.N.Y.) Invalidity of U.S. Pat. No. 9,941,729

(56) References Cited

OTHER PUBLICATIONS ("The '729 Patent") by United States Patent Publication No. 2014/0008974 ("Takashi"), Apr. 12, 2019, 77 pages.

Exhibit E-14: Invalidity Contentions: '729 Patent in View of Hoon, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Korean Patent Publication No. 20130015618 ("Hoon"), Apr. 12, 2019, 28 pages.

Exhibit E-15 : Invalidity Contentions: '729 Patent in View of Lee '710, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0318710 ("Lee '710"), Apr. 12, 2019, 42 pages.

Exhibit E-16: Invalidity Contentions: '729 Patent in View of Hisanori, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Publication No. 2012-147408 ("Hisanori"), Apr. 12, 2019, 45 pages.

Exhibit E-17: Invalidity Contentions: '729 Patent in View of Muratov Presentation, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Multi-Mode Wireless Power Systems can be a Bridge to the Promised Land of Universal Contactless Charging, presented by Vladimir Muratov ("Muratov Presentation"), Apr. 12, 2019, 57 pages.

Exhibit E-18: Invalidity Contentions: '729 Patent in View of Han, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2017/0353055 A1 ("Han"), Apr. 12, 2019, 46 pages.

Exhibit E-19: Invalidity Contentions: '729 Patent in View of Riehl IEEE, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Wireless Power Systems for Mobile Devices Supporting Inductive and Resonant Operating Modes, by Patrick S. Riehl et al., IEEE Transactions on Microwave Theory and Techniques, vol. 63, No. 3, Mar. 3, 2015 (Riehl IEEE), Apr. 12, 2019, 56 pages.

Exhibit F-01: Invalidity Contentions: '960 Patent in View of Chung Yeon Ho, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by Korean Patent Application Publication 2010/0092741 A ("Chung Yeon Ho"), Apr. 12, 2019, 34 pages.

Exhibit F-02: Invalidity Contentions: '960 Patent in View of Jung, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by U.S. Patent Application Publication 2009/0140691 A1 ("Chun-Kil Jung"), Apr. 12, 2019, 58 pages.

Exhibit F-03: Invalidity Contentions: '960 Patent in View of Kook, *NuCurrent* v. *Samsung Electronics America, Inc. et al.*, Case No. 1:19-cv-00798-DLC (S.D.N.Y.) Invalidity of U.S. Pat. No. 8,680,960 ("The '960 Patent") by WIPO Patent Application Publication 2008/050917 A1 ("Kook Yoon-Sang"), Apr. 12, 2019, 30 pages.

Exhibit G-01: Invalidity Contentions: '046 Patent in View of Chung Yeon Ho, *NuCurrent* v. *Samsung Electronics America, Inc. et al.*, Case No. 1:19-cv-00798-DLC (S.D.N.Y.) Invalidity of U.S. Pat. No. 9,300,046 ("The '046 Patent") by Korean Patent Application Publication 2010/0092741 A ("Chung Yeon Ho"), Apr. 12, 2019, 33 pages.

Exhibit G-02: Invalidity Contentions: '046 Patent in View of Jung, *NuCurrent* v. *Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2009/0140691 A1 ("Chun-Kil Jung"), Apr. 12, 2019, 49 pages.

Exhibit G-03: Invalidity Contentions: '046 Patent in View of Kook, *NuCurrent* v. *Samsung Electronics America, Inc. et al.*, Case No. 1:19-cv-00798-DLC (S.D.N.Y.) Invalidity of U.S. Pat. No. 9,300,046 ("The '046 Patent") by WIPO Patent Application Publication 2008/050917 A1 ("Kook Yoon-Sang"), Apr. 12, 2019, 26 pages.

Exhibit H-01: Invalidity Contentions: '591 Patent in View of Chung Yeon Ho, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by Korean Patent Application Publication 2010/0092741 A ("Chung Yeon Ho"), Apr. 12, 2019, 43 pages.

Exhibit H-02: Invalidity Contentions: '591 Patent in View of Jung, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2009/0140691 A1 ("Chun-Kil Jung"), Apr. 12, 2019, 88 pages.

Exhibit H-03: Invalidity Contentions: '591 Patent in View of Kook, *NuCurrent* v. *Samsung Electronics America, Inc. et al.*, Case No. 1:19-cv-00798-DLC (S.D.N.Y.) Invalidity of U.S. Pat. No. 8,698,591 ("The '591 Patent") by WIPO Patent Application Publication 2008/050917 A1 ("Kook Yoon-Sang"), Apr. 12, 2019, 49 pages.

Exhibit I-01: Invalidity Contentions: '948 Patent in View of Chung Yeon Ho, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by Korean Patent Application Publication 2010/0092741 A ("Chung Yeon Ho"), Apr. 12, 2019, 39 pages.

Exhibit I-02: Invalidity Contentions: '948 Patent in View of Jung, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2009/0140691 A1 ("Chun-Kil Jung"), Apr. 12, 2019, 78 pages.

Exhibit I-03: Invalidity Contentions: '948 Patent in View of Kook, *NuCurrent* v. *Samsung Electronics America, Inc. et al.*, Case No. 1:19-cv-00798-DLC (S.D.N.Y.) Invalidity of U.S. Pat. No. 8,710,948 ("The '948 Patent") by WIPO Patent Application Publication 2008/050917 A1 ("Kook Yoon-Sang"), Apr. 12, 2019, 43 pages.

Exhibit J-01 : Invalidity Contentions: '729 Patent in View of Satoshi, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Publication No. 2001-344574 ("Satoshi"), Apr. 12, 2019, 19 pages.

Exhibit J-02: Invalidity Contentions: '729 Patent in View of Takahashi, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2007/0095913 ("Takahashi"), Apr. 12, 2019, 23 pages.

Exhibit J-03: Invalidity Contentions: '729 Patent in View of Baarman '953, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2011/0259953 ("Baarman '953"), Apr. 12, 2019, 31 pages.

Exhibit J-04: Invalidity Contentions: '729 Patent in View of Carobolante, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2015/0115727 ("Carobolante"), Apr. 12, 2019, 12 pages.

Exhibit J-05: Invalidity Contentions: '729 Patent in View of Bae, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2016/0156103 ("Bae"), Apr. 12, 2019, 6 pages.

Exhibit J-06: Invalidity Contentions: '729 Patent in View of Singh, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by U.S. Pat. No. 8,680,960 ("Singh"), Apr. 12, 2019, 3 pages.

Exhibit J-07: Invalidity Contentions: '729 Patent in View of Qi 1.0.1, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Qi System Description, Wireless Power Transfer, vol. 1: Low Power, Part 1: Interface Definition, Version 1.0.1 ("Qi 1.0.1"), Apr. 12, 2019, 14 pages.

Exhibit J-08 : Invalidity Contentions: '729 Patent in View of Narayanan, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Application Note: Wireless Power

(56) References Cited

OTHER PUBLICATIONS

Charging Coil Considerations, by Raghu Narayanan, Wurth Elektronik ("Narayanan"), Apr. 12, 2019, 6 pages.

Exhibit J-09: Invalidity Contentions: '729 Patent in View of Barcelo, *NuCurrent v. Samsung Electronics America, Inc. et al.*, Case No. 1:19-cv-00798-DLC (S.D.N.Y.) Invalidity of U.S. Pat. No. 9,941,729 ("The '729 Patent") by Application Note 138:Wireless Power User Guide, by Trevor Barcelo, Linear Technology ("Barcelo"), Apr. 12, 2019, 4 pages.

Exhibit K: Family Patents Combinations, *NuCurrent v. Samsung Electronics America, Inc. et al.*, Case No. 1:19-cv-00798-DLC (S.D.N.Y.), Invalidity Contentions, Apr. 12, 2019, 103 pages.

Exhibit L: '729 Patent Combinations, *NuCurrent v. Samsung Electronics America, Inc. et al.*, Case No. 1:19-cv-00798-DLC (S.D.N.Y.), Invalidity Contentions, Apr. 12, 2019, 106 pages.

Extended Search Report dated Sep. 10, 2019 for EP 19188841.1-1216, 11 pages.

First Office Action dated Aug. 5, 2019 for Chinese App. No. 201680058731.9, English Translation, 6 pages.

International Bureau, International Preliminary Report on Patentability dateed Mar. 7, 2019, issued in connection with International Application No. PCT/US2017/048708, filed on Aug. 25, 2017, 9 pages.

International Searhing Authority, International Search Report and Written Opinion dated Nov. 8, 2017, issued in connection with International Application No. PCT/US2017/048708, filed on Aug. 25, 2017, 10 pages.

International Searhing Authority, International Search Report and Written Opinion dated Oct. 14, 2016, issued in connection with International Application No. PCT/US2016/045588, filed on Aug. 4, 2016, 9 pages.

International Searhing Authority, International Search Report and Written Opinion dated Feb. 21, 2018, issued in connection with International Application No. PCT/US2017/065329, filed on Dec. 8, 2017, 7 pages.

International Searhing Authority, International Search Report and Written Opinion dated Oct. 28, 2016, issued in connection with International Application No. PCT/US2016/047607, filed on Aug. 18, 2016, 7 pages.

IPR2019-00858—*Samsung Electronics Co., Ltd. v. NuCurrent, Inc.*, Petition for Inter Partes Review of U.S. Pat. No. 8,680,960, Mar. 22, 2019, 90 pages.

IPR2019-00858, *Samsung Electronics Co., Ltd. vs. NuCurrent, Inc.*, Samsung Exhibit 1042—Order Denying [167] Motion for Preliminary Injunction, *NuCurrent, Inc. vs. Samsung Electronics Co., Ltd. et al.*, Case No. 1:19-cv-00798-DLC, Jul. 2, 2019, 15 pages.

IPR2019-00858—*Samsung Electronics Co., Ltd. v. NuCurrent, Inc.*, Ex. 1001, U.S. Pat. No. 8,680,960 to Singh et al., Mar. 22, 2019, 50 pages.

IPR2019-00859—*Samsung Electronics Co., Ltd. v. NuCurrent, Inc.*, Petition for Inter Partes Review of U.S. Pat. No. 9,300,046, Mar. 22, 2019, 87 pages.

IPR2019-00859—*Samsung Electronics Co., Ltd. vs. NuCurrent, Inc.*, Decision Granting Institution of Inter Partes Review for U.S. Pat. No. 9,300,046 B2, Sep. 25, 2019, 48 pages.

IPR2019-00859—*Samsung Electronics Co., Ltd. vs. NuCurrent, Inc.*, Ex. 1017—U.S. Pat. No. 5,812,344 to Balakrishnan, Mar. 22, 2019, 12 pages.

Exhibit B-08: Invalidity Contentions: '046 Patent in View of Ganem, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2012/0235500 A1 ("Steven J. Ganem"), Apr. 12, 2019, 75 pages.

Exhibit B-09: Invalidity Contentions: '046 Patent in View of Gao, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2011/084656 A1 ("Gao"), Apr. 12, 2019, 33 pages.

Exhibit B-10: Invalidity Contentions: '046 Patent in View of Hasegawa '215, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Japanese Patent Application Publication 2008-205215 A ("Hasegawa Minoru"), Apr. 12, 2019, 42 pages.

Exhibit B-11: Invalidity Contentions: '046 Patent in View of Hasegawa '518, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by J.P. Patent Application Publication 01310518 A ("Hasegawa Michio '518"), Apr. 12, 2019, 69 pages.

Exhibit B-12: Invalidity Contentions: '046 Patent in View of Hasegawa Michio '631, *NuCurrent v. Samsung Electronics America, Inc. et al.*, Case No. Case No. 1:19-cv-00798-DLC (S.D.N.Y.) Invalidity of U.S. Pat. No. 9,300,046 ("The '046 Patent") by Granted Publication U.S. Pat. No. 4,959,631 A ("Hasegawa Michio '631"), Apr. 12, 2019, 37 pages.

Exhibit B-13: Invalidity Contentions: '046 Patent in View of Ishihara, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by JP Patent Application Publication 2008/294285 A ("Ishihara Keien"), Apr. 12, 2019, 33 pages.

Exhibit B-14: Invalidity Contentions: '046 Patent in View of Kato '840, *NuCurrent v. Samsung Electronics America, Inc. et al.*, Case No. 1:19-cv-00798-DLC (S.D.N.Y.) Invalidity of U.S. Pat. No. 3,300,046 ("The '046 Patent") by U.S. Patent Application Publication 2008/164840 A1 ("Hiroshi Kato"), Apr. 12, 2019, 32 pages.

Exhibit B-15: Invalidity Contentions: '046 Patent in View of Kato '844, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2008/164844 A1 ("Hiroshi Kato"), Apr. 12, 2019, 37 pages.

Exhibit B-16: Invalidity Contentions: '046 Patent in View of Inventor Kimura, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2002/071003 A1 ("Isao Kimura"), Apr. 12, 2019, 53 pages.

Exhibit B-17: Invalidity Contentions: '046 Patent in View of Kurs '765, *NuCurrent v. Samsung Electronics America, Inc. et al.*, Case No. 1:19-cv-00798-DLC (S.D.N.Y.) Invalidity of U.S. Pat. No. 9,300,046 ("the '046 Patent") by 2012/0280765 A1 ("Kurs'765"), Apr. 12, 2019, 50 pages.

Exhibit B-18: Invalidity Contentions: '046 Patent in View of Misumi, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by Japanese. Patent Application Publication JP 10255629 A ("Misumi Shuichi"), Apr. 12, 2019, 33 pages.

Exhibit B-19: Invalidity Contentions: '046 Patent in View of Nakatani, *NuCurrent v. Samsung Electronics America, Inc. et al.*, Case No. 1:19-cv-00798-DLC (S.D.N.Y.) Invalidity of U.S. Pat. No. 9,300,046 ("the '046 Patent") by US 2004/227608 A1 ("Toshifumi Nakatani"), Apr. 12, 2019, 51 pages.

Exhibit B-20: Invalidity Contentions: '046 Patent in View of Partovi '367, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2007/0182367 A1 ("Partovi '367"), Apr. 12, 2019, 37 pages.

Exhibit B-21: Invalidity Contentions '046 Patent in View of Inventor Partovi '413, *NuCurrent v. Samsung Electronics America, Inc. et al.*, Case No. 1:19-cv-00798-DLC (S.D.N.Y.) Invalidity of U.S. Pat. No. 9,300,046 ("The '046 Patent") by U.S. Patent Application Publication 2009/0096413 A1 ("Afshin Partovi '413"), Apr. 12, 2019, 39 pages.

Exhibit B-22: Invalidity Contentions: '046 Patent in View of Partovi '636, *NuCurrent v. Samsung Electronics America, Inc. et al.*, Case No. 1:19-cv-00798-DLC (S.D.N. Y.) Invalidity of U.S. Pat. No. 9,300,046 ("The '046 Patent") by U.S. Patent Application Publication 2012/0235636 A1 ("Afshin Partovi '636"), Apr. 12, 2019, 55 pages.

(56) References Cited

OTHER PUBLICATIONS

Exhibit B-23: Invalidity Contentions: '046 Patent in View of 01 0.95, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by Qi System Description, Wireless Power Transfer, vol. 1: Low Power, Version 0.95 ("Qi 0.95"), Apr. 12, 2019, 23 pages.
Exhibit B-24: Invalidity Contentions: '046 Patent in View of Qi 1.0.1, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by Qi System Description, Wireless Power Transfer, vol. 1: Low Power, Part 1: Interface Definition, Version 1.0.1 ("Qi 1.0.1"), Apr. 12, 2019, 44 pages.
Exhibit B-25: Invalidity Contentions: '046 Patent in View of Shima, *NuCurrent v. Samsung Electronics America, Inc. et al.,* Case No. 1:19-cv-00798-DLC (S.D.N.Y.) Invalidity of U.S. Pat. No. 9,300,046 ("the '046 Patent") by U.S. Pat. No. 5,808,587 A ("HiroshiShima"), Apr. 12, 2019, 76 pages.
Exhibit B-26: Invalidity Contentions: '046 Patent in View of Sun, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by U.S. Patent Application Publication 2011/0101788 A1 ("Sun"), Apr. 12, 2019, 55 pages.
Exhibit B-27: Invalidity Contentions: '046 Patent in View of Tseng, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by U.S. Pat. No. 9,912,173 B2 ("Ryan Tseng"), Apr. 12, 2019, 62 pages.
Exhibit B-28: Invalidity Contentions: '046 Patent in View of Von Novak, III, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by U.S. Pat. No. 9,559,526 B2 ("William H. Von Novak, III"), Apr. 12, 2019, 50 pages.
Exhibit B-29: Invalidity Contentions: '046 Patent in View of Yamakawa, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by U.S. Patent Application Publication 2012/0217819 A1 ("Yamakawa"), Apr. 12, 2019, 36 pages.
Exhibit B-30: Invalidity Contentions: '046 Patent in View of Yoon & Allen, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by Embedded Conductor Technology for Micromachined Rf Elements ("Yoon & Allen"), Apr. 12, 2019, 39 pages.
Exhibit B-31: Invalidity Contentions: '046 Patent in View of the Blackberry Z30, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by the Blackberry Z30, Apr. 12, 2019, 135 pages.
Exhibit B-32: Invalidity Contentions: '046 Patent in View of the LG G2, *NuCurrent v. Samsung Electronics America, Inc. et al.,* Case No. 1:19-cv-00798-DLC (S.D.N.Y.) Invalidity of U.S. Pat. No. 9,300,046 ("the '046 Patent") by the LG G2, Apr. 12, 2019, 401 pages.
Exhibit B-33: Invalidity Contentions: '046 Patent in View of the LG G3, *NuCurrent v. Samsung Electronics America, Inc. et al.,* Case No. 1:19-cv-00798-DLC (S.D.N.Y.) Invalidity of U.S. Pat. No. 9,300,046 ("the '046 Patent") by the LG G3, Apr. 12, 2019, 200 pages.
Exhibit B-34: Invalidity Contentions: '046 Patent in View of the LG Nexus 5, *NuCurrent v. Samsung Electronics America, Inc. et al.,* Case No. 1:19-cv-00798-DLC (S.D.N.Y.) Invalidity of U.S. Pat. No. 9,300,046 ("The '046 Patent") by the LG Nexus 5, Apr. 12, 2019, 340 pages.
Exhibit C-01: Invalidity Contentions: '591 Patent in View of Jitsuo, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by Japanese Patent Application Publication JP05082349A ("Jitsuo"), Apr. 12, 2019, 59 pages.

Exhibit C-02: Invalidity Contentions: '591 Patent in View of Kurs '694, *NuCurrent v. Samsung Electronics America, Inc. et al.,* Case No. 1:19-cv-00798-DLC (S.D.N.Y.) Invalidity of U.S. Pat. No. 8,698,591 ("the '591 Patent") by U.S. 2010/0219694 A1 ("Kurs'694"), Apr. 12, 2019, 61 pages.
Exhibit C-03: Invalidity Contentions: '591 Patent in View of Sheng-Yuan, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by U.S. Patent Application Publication 2007/267718 A1 ("Sheng-Yuan"), Apr. 12, 2019, 84 pages.
Exhibit C-04: Invalidity Contentions: '591 Patent in View of Wotherspoon, *NuCurrent v. Samsung Electronics America, Inc. et al.,* Case No. 1:19-cv-00798-DLC (S.D.N.Y.) Invalidity of U.S. Pat. No. 3,698,591 ("The '591 Patent") by U.S. Patent Application Publication 2007/0126544 A1 ("Wotherspoon"), Apr. 12, 2019, 58 pages.
Exhibit C-05: Invalidity Contentions: '591 Patent in View of Baarman '777, *NuCurrent v. Samsung Electronics America, Inc. et al.,* Case No. 1:19-cv-00798-DLC (S.D.N.Y.) Invalidity of U.S. Pat. No. 8,698,591 ("the '591 Patent") by U.S. 2009/0230777A1 ("Baarman '777"), Apr. 12, 2019, 57 pages.
Exhibit C-06: Invalidity Contentions: '591 Patent in View of Burghartz & Rejaei, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by on the Design of RF Spiral Inductors on Silicon ("Burghartz & Rejaei"), Apr. 12, 2019, 61 pages.
Exhibit C-07: Invalidity Contentions: '591 Patent in View of Ganem, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by U.S. Patent Application Publication 2012/0235500 A1 ("Steven J. Ganem"), Apr. 12, 2019, 98 pages.
Exhibit C-08: Invalidity Contentions: '591 Patent in View of Gao, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by U.S. Patent Application Publication 2011/084656 A1 ("Gao"), Apr. 12, 2019, 49 pages.
Exhibit C-09: Invalidity Contentions: '591 Patent in View of Hasegawa '215, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by Japanese Patent Application Publication 2008-205215 A ("Hasegawa Minoru"), Apr. 12, 2019, 50 pages.
Exhibit C-10: Invalidity Contentions: '591 Patent in View of Hasegawa '518, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by J.P. Patent Application Publication 01310518 A ("Hasegawa Michio '518"), Apr. 12, 2019, 85 pages.
Exhibit C-11: Invalidity Contentions: '591 Patent in View of Hasegawa '631, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by Granted Publication U.S. Pat. No. 4,959,631 A ("Hasegawa'631"), Apr. 12, 2019, 40 pages.
Exhibit C-12: Invalidity Contentions: '591 Patent in View of Ishihara, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by JP Patent Application Publication 2008/294285 A ("Ishihara Keien"), Apr. 12, 2019, 40 pages.
Exhibit C-13: Invalidity Contentions: '591 Patent in View of Kato '840, *NuCurrent v. Samsung Electronics America, Inc. et al.,* Case No. 1:19-cv-00798-DLC (S.D.N.Y.) Invalidity of U.S. Pat. No. 8,698,591 ("The '591 Patent") by U.S. Patent Application Publication 2008/164840 A1 ("Hiroshi Kato"), Apr. 12, 2019, 35 pages.
Exhibit C-14: Invalidity Contentions: '591 Patent in View of Kato '844, *NuCurrent v. Samsung Electronics America, Inc. et al.,* Case No. 1:19-cv-00798-DLC (S.D.N.Y.) Invalidity of U.S. Pat. No. 8,698,591 ("the '591 Patent") by U.S. Patent Application Publication 2008/164844 A1 ("Hiroshi Kato"), Apr. 12, 2019, 39 pages.
Exhibit C-15: Invalidity Contentions: '591 Patent in View of Kimura, *NuCurrent v. Samsung Electronics America, Inc. et al.,* Case No. 1:19-cv-00798-DLC (S.D.N.Y.) Invalidity of U.S. Pat. No.

(56) References Cited

OTHER PUBLICATIONS 8,698,591 ("the '591 Patent") by U.S. Patent Application Publication 2002/071003 A1 ("Isao Kimura "), Apr. 12, 2019, 52 pages.
Exhibit C-16: Invalidity Contentions: '591 Patent in View of Kurs '765, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2012/0280765 A1 ("Kurs '765"), Apr. 12, 2019, 61 pages.
Exhibit C-17: Invalidity Contentions: '591 Patent in View of Misum, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by Japanese. Patent Application Publication JP 10255629 A ("Misum Shuichi"), Apr. 12, 2019, 37 pages.
Exhibit C-18: Invalidity Contentions: '591 Patent in View of Nakatani, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by 2004/227608 A1 ("Toshifumi Nakatani"), Apr. 12, 2019, 59 pages.
Exhibit C-19: Invalidity Contentions: '591 Patent in View of Partovi '367, *NuCurrent v. Samsung Electronics America, Inc. et al.*, Case No. 1:19-cv-00798-DLC (S.D.N.Y.) Invalidity of U.S. Pat. No. 8,698,591 ("The '591 patent") by U.S. Patent Application Publication 2007/0182367 A1 ("Partovi '367"), Apr. 12, 2019, 55 pages.
Exhibit C-20: Invalidity Contentions: '591 Patent in View of Afshin Partovi '413, *NuCurrent v. Samsung Electronics America, Inc. et al.*, Case No. 1:19-cv-00798-DLC (S.D.N.Y.) Invalidity of U.S. Pat. No. 3,698,591 ("The '591 Patent") by U.S. Patent Application Publication 2009/0096413 A1 ("Afshin Partovi '413"), Apr. 12, 2019, 56 pages.
Exhibit C-21: Invalidity Contentions: '591 Patent in View of Partovi '636, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by U.S. Patent Application Publication 2012/0235636 A1 ("Afshin Partovi '636"), Apr. 12, 2019, 77 pages.
Exhibit C-22: Invalidity Contentions: '591 Patent in View of 01 0.95, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by Qi System Description, Wireless Power Transfer, vol. 1: Low Power, Version 0.95 ("Qi 0.95"), Apr. 12, 2019, 29 pages.
Exhibit C-23: Invalidity Contentions: '591 Patent in View of 01 1.0.1, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by Qi System Description, Wireless Power Transfer, vol. 1: Low Power, Part 1: Interface Definition, Version 1.0.1 ("Qi 1.0.1"), Apr. 12, 2019, 57 pages.
CN Office Action, CN Application No. 202111254604.5, dated Aug. 1, 2023, 19 pages.
JP Final Office Action, JP Application No. 2022-109045 dated Sep. 12, 2023, 20 pages.
Exhibit C-24: Invalidity Contentions: '591 Patent in View of Shima, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. No. 5,808,587 A ("Hiroshi Shima"), Apr. 12, 2019, 102 pages.
Exhibit C-25: Invalidity Contentions: '591 Patent in View of Sun, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2011/0101788 A1 ("Sun"), Apr. 12, 2019, 68 pages.
Exhibit C-26: Invalidity Contentions: '591 Patent in View of Tseng, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. No. 9,912,173 B2 ("Ryan Tseng"), Apr. 12, 2019, 84 pages.
Exhibit C-27: Invalidity Contentions: '591 Patent in View of Von Novak, III, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Pat. No. 9,559,526 B2 ("William H. Von Novak, III"), Apr. 12, 2019, 81 pages.
Exhibit C-28: Invalidity Contentions: '591 Patent in View of Yamakawa, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by U.S. Patent Application Publication 2012/0217819 A1 ("Yamakawa"), Apr. 12, 2019, 46 pages.
Exhibit C-29: Invalidity Contentions: '591 Patent in View of Yoon & Allen, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by Embedded Conductor Technology for Micromachined Rf Elements ("Yoon & Allen"), Apr. 12, 2019, 44 pages.
Exhibit C-30: Invalidity Contentions: '591 Patent in View of Bae, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by Granted Publication U.S. Pat. No. 6,897,830 B2 ("Bae"), Apr. 12, 2019, 88 pages.
Exhibit C-31: Invalidity Contentions: '591 Patent in View of the Blackberry Z30, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by the Blackberry Z30, Apr. 12, 2019, 180 pages.
Exhibit C-32: Invalidity Contentions: '591 Patent in View of the LG G2, *NuCurrent v. Samsung Electronics America, Inc. et al.*, Case No. 1:19-cv-00798-DLC (S.D.N.Y.) Invalidity of U.S. Pat. No. 8,698,591 ("the '591 Patent") by the LG G2, Apr. 12, 2019, 557 pages.
Exhibit C-33: Invalidity Contentions: Invalidity Contentions: '591 Patent in View of the LG G3 *NuCurrent v. Samsung Electronics America, Inc. et al.*, Case No. 1:19-cv-00798-DLC (S.D.N.Y.) Invalidity of U.S. Pat. No. 8,698,591 ("The 591 Patent") by the LG G3, Apr. 12, 2019, 266 pages.
Exhibit C-34: Invalidity Contentions: '591 Patent in View of the LG Nexus 5, *NuCurrent v. Samsung Electronics America, Inc. et al.*, Case No. 1:19-cv-00798-DLC (S.D.N.Y.) Invalidity of U.S. Pat. No. 8,698,591 ("The '591 Patent") by the LG Nexus 5, Apr. 12, 2019, 468 pages.
Exhibit D-01: Invalidity Contentions: '948 Patent in View of Jitsuo, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Japanese Patent Application Publication JP05082349A ("Jitsuo"), Apr. 12, 2019, 54 pages.
Exhibit D-02: Invalidity Contentions: '948 Patent in View of Kurs, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2010/0219694 A1 ("Kurs"), Apr. 12, 2019, 59 pages.
Exhibit D-03: Invalidity Contentions: '948 Patent in View of Sheng-Yuan, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2007/267718 A1 ("Sheng-Yuan"), Apr. 12, 2019, 77 pages.
Exhibit D-04: Invalidity Contentions: '948 Patent in View of Wotherspoon, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2007/0126544 A1 ("Wotherspoon"), Apr. 12, 2019, 52 pages.
Exhibit D-05: Invalidity Contentions: '948 Patent in View of Baarman, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2009/0230777A1 ("David W. Baarman"), Apr. 12, 2019, 52 pages.
Exhibit D-06: Invalidity Contentions: '948 Patent in View of Bae, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Granted Publication U.S. Pat. No. 6,897,830 B2 ("Bae"), Apr. 12, 2019, 82 pages.
Exhibit D-07: Invalidity Contentions: '948 Patent in View of Burghartz & Rejaei, *NuCurrent v. Samsung Electronics America, Inc. et al.*, Case No. 1:19-cv-00798-DLC (S.D.N.Y.) Invalidity of

(56) References Cited

OTHER PUBLICATIONS

U.S. Pat. No. 8,710,948 ("The '948 Patent") by on the Design of RF Spiral Inductors on Silicon ("Burghartz & Rejaei"), Apr. 12, 2019, 52 pages.
Exhibit D-08: Invalidity Contentions: '948 Patent in View of Ganem, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0235500 A1 ("Steven J. Ganem"), Apr. 12, 2019, 92 pages.
Exhibit D-09: Invalidity Contentions: '948 Patent in View of Gao, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2011/084656 A1 ("Gao"), Apr. 12, 2019, 44 pages.
Exhibit D-10: Invalidity Contentions: '948 Patent in View of Hasegawa '215, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by Japanese Patent Application Publication 2008-205215 A ("Hasegawa Minoru '215"), Apr. 12, 2019, 16 pages.
Exhibit D-11: Invalidity Contentions: '948 Patent in View of Hasegawa Michio '631, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Granted Publication U.S. Pat. No. 4,959,631 A ("Hasegawa Michio '631"), Apr. 12, 2019, 37 pages.
Exhibit D-12: Invalidity Contentions: '948 Patent in View of Hasegawa '518, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by J.P. Patent Application Publication 01310518 A ("Hasegawa Michio '518"), Apr. 12, 2019, 78 pages.
Exhibit D-13: Invalidity Contentions: '948 Patent in View of Ishihara, *NuCurrent v. Samsung Electronics America, Inc. et al.*, Case No. 1:19-cv-00798-DLC (S.D.N.Y.) Invalidity of U.S. Pat. No. 8,710,948 ("the '948 Patent") by 2008/294285 A ("IshiharaKeien"), Apr. 12, 2019, 38 pages.
Exhibit D-14: Invalidity Contentions: '948 Patent in View of Kato, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2008/164840 A1 ("Hiroshi Kato"), Apr. 12, 2019, 34 pages.
Exhibit D-15: Invalidity Contentions: '948 Patent in View of Kato, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2008/164844 A1 ("Hiroshi Kato"), Apr. 12, 2019, 39 pages.
Exhibit D-16: Invalidity Contentions: '948 Patent in View of Kimura, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2002/071003 A1 ("Isao Kimura"), Apr. 12, 2019, 50 pages.
Exhibit D-17: Invalidity Contentions: '948 Patent in View of Kurs '765, *NuCurrent v. Samsung Electronics America, Inc. et al.*, Case No. 1:19-cv-00798-DLC (S.D.N.Y.) Invalidity of U.S. Pat. No. 3,710,948 ("The '948 Patent") by U.S. Patent Application Publication 2012/0280765 A1 ("Kurs '765"), Apr. 12, 2019, 57 pages.
Exhibit D-18: Invalidity Contentions: '948 Patent in View of Misumi, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Japanese. Patent Application Publication JP 10255629 A ("Misumi Shuichi"), Apr. 12, 2019, 34 pages.
Exhibit D-19: Invalidity Contentions: '948 Patent in View of Nakatani, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2004/227608 A1 ("Toshifumi Nakatani"), Apr. 12, 2019, 56 pages.
Exhibit D-20: Invalidity Contentions: '948 Patent in View of Partovi '367, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2007/0182367 A1 ("Partovi '367"), Apr. 12, 2019, 51 pages.
Exhibit D-21: Invalidity Contentions: '948 Patent in View of Partovi '413, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2009/0096413 A1 ("Afshin Partovi '413"), Apr. 12, 2019, 51 pages.
Exhibit D-22: Invalidity Contentions: '948 Patent in View of Partovi '636, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0235636 A1 ("Afshin Partovi '636"), Apr. 12, 2019, 67 pages.
Exhibit D-23: Invalidity Contentions: '948 Patent in View of 01 0.95, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Qi System Description, Wireless Power Transfer, vol. 1: Low Power, Version 0.95 ("Qi 0.95"), Apr. 12, 2019, 28 pages.
Exhibit D-24: Invalidity Contentions: '948 Patent in View of QI 1.0.1, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Qi System Description, Wireless Power Transfer, vol. 1: Low Power, Part 1: Interface Definition, Version 1.0.1 ("Qi 1.0.1"), Apr. 12, 2019, 55 pages.
Exhibit D-25: Invalidity Contentions: '948 Patent in View of Shima, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 5,808,587 ("Hiroshi Shima"), Apr. 12, 2019, 94 pages.
Exhibit D-26: Invalidity Contentions: '948 Patent in View of Sun, *NuCurrent v. Samsung Electronics America, Inc. et al.*, Case No. 1:19-cv-00798-DLC (S.D.N.Y.) Invalidity of U.S. Pat. No. 8,710,948 ("the '948 Patent") by 2011/0101788 A1 ("Sun"), Apr. 12, 2019, 63 pages.
Exhibit D-27: Invalidity Contentions: '948 Patent in View of Tseng, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 9,912,173 B2 ("Ryan Tseng"), Apr. 12, 2019, 75 pages.
Exhibit D-28: Invalidity Contentions: '948 Patent in View of Von Novak, III, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Pat. No. 9,559,526 B2 ("William H. Von Novak, III"), Apr. 12, 2019, 73 pages.
Exhibit D-29: Invalidity Contentions: '948 Patent in View of Yamakawa, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by U.S. Patent Application Publication 2012/0217819 A1 ("Yamakawa"), Apr. 12, 2019, 42 pages.
Exhibit D-30: Invalidity Contentions: '948 Patent in View of Yoon & Allen, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by Embedded Conductor Technology for Micromachined Rf Elements ("Yoon & Allen"), Apr. 12, 2019, 41 pages.
Exhibit D-31—Invalidity Contentions: '948 Patent in View of the Blackberry Z30, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by the Blackberry Z30, Apr. 12, 2019, 168 pages.
Exhibit D-32: Invalidity Contentions: '948 Patent in View of the LG G2, *NuCurrent v. Samsung Electronics America, Inc. et al.*, Case No. 1:19-cv-00798-DLC (S.D.N.Y.) Invalidity of U.S. Pat. No. 8,710,948 ("The '948 Patent") by the LG G2, Apr. 12, 2019, 511 pages.
Exhibit D-33—Invalidity Contentions: '948 Patent in View of LG G3, *NuCurrent v. Samsung Electronics America, Inc. et al.*, Case

(56) References Cited

OTHER PUBLICATIONS

No. 1:19-cv-00798-DLC (S.D.N.Y.) Invalidity of U.S. Pat. No. 8,710,948 ("The '948 Patent") by the LG G3, Apr. 12, 2019, 249 pages.
Exhibit D-34—Invalidity Contentions: '948 Patent in View of the LG Nexus 5, *NuCurrent* v. *Samsung Electronics America, Inc. et al.*, Case No. 1:19-cv-00798-DLC (S.D.N.Y.) Invalidity of U.S. Pat. No. 8,710,948 ("the '948 Patent") by the LG Nexus 5, Apr. 12, 2019, 434 pages.
Exhibit E-01: Invalidity Contentions: '729 Patent in View of Ha, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Publication No. 2016/0149416 ("Ha"), Apr. 12, 2019, 99 pages.
Exhibit E-02: Invalidity Contentions: '729 Patent in View of Riehl, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication 2014/0035383 ("Riehl"), Apr. 12, 2019, 50 pages.
Exhibit E-03 : Invalidity Contentions: '729 Patent in View of Baarman '154, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication No. 2013/0076154 ("Baarman '154"), Apr. 12, 2019, 42 pages.
Exhibit E-04: Invalidity Contentions: '729 Patent in View of Kanno, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by United States Patent Application Publication 2011/0241437 ("Kanno"), Apr. 12, 2019, 30 pages.
Exhibit E-05: Invalidity Contentions: '729 Patent in View of Kazuya, *NuCurrent* v. *Samsung Electronics America, Inc. et al.*, Case No. 1:19-cv-00798-DLC (S.D.N.Y.) Invalidity of U.S. Pat. No. 9,941,729 ("The '729 Patent") by Japanese Patent Application Publication 2013093429 ("Kazuya"), Apr. 12, 2019, 32 pages.
CN Notice of Allowance, CN Application No. 201780060807.6, dated Aug. 18, 2021, 7 pages.
JP Office Action, JP Application No. 2019-510957 dated Aug. 3, 2021, 9 pages.
Barcelo T., "Wireless Power User Guide", Linear Technology, Application Note 138, Oct. 2013, 8 pages.
Burghartz, J., "On the Design of RF Spiral Inductors on Silicon", IEEE Transactions on Electron Devices, vol. 50, No. 3, Mar. 2003, pp. 718-729.
CN Office Action, CN Application No. 201780060807.6 dated Feb. 5, 2021, 7 pages.
"CN Office Action, CN Application No. 201780060807.6 dated Mar. 4, 2020, 18 pages."
Decision of Dismissal of Amendment issued in corresponding Japanese Patent Application No. 2013-047048, dated May 8, 2018, 7 pages.
EP Communication pursuant to Rule 62 EPC regarding extended European Search Report dated May 15, 2019, for EP App. No. 16835665.7-1212, 16 pages.
EP Office Communication Pursuant to Article 94(3) dated Jan. 17, 2019 for EP App. No. 13001121.6-1216, 4 pages.
European Patent Office, Extended European Search Report dated Aug. 1, 2013, issued in connection with EP Application No. 13001121.6, 6 pages.
European Patent Office, Extended European Search Report dated Aug. 1, 2013, issued in connection with EP Application No. 13001130.7, 6 pages.
European Patent Office, Extended European Search Report dated Nov. 4, 2014, issued in connection with EP Application No. 14000885.5, 8 pages.
European Patent Office, Extended European Search Report dated Aug. 7, 2014, issued in connection with EP Application No. 10751119.8, 12 pages.
European Patent Office, Extended European Search Report dated Jun. 12, 2019, issued in connection with EP Application No. 19154162.2, 9 pages.
European Patent Office, Extended European Search Report dated Dec. 17, 2019, issued in connection with EP Application No. 17879649.6, 9 pages.
European Patent Office, Partial Supplementary European Search Report dated Feb. 14, 2019, issued In connection with EP Application No. 16835665.7, 10 pages.
Ex. 1001 U.S. Pat. No. 8,698,591, Singh, Apr. 15, 2014, 49 pages.
Ex. 1001 U.S. Pat. No. 8,710,948 to Singh et al., Apr. 29, 2014, 49 pages.
Ex. 1001 U.S. Pat. No. 9,300,046 to Singh et al., Mar. 29, 2016, 50 pages.
Ex. 1001—U.S. Pat. No. 10,063, 100, Singh, Aug. 28, 2018, 48 pages.
Ex. 1003—CV of Dr. Steven B. Leeb, Mar. 22, 2019, 7 pages.
Ex. 1004 File History of U.S. Pat. No. 8,710,948 to Singh et al., Apr. 29, 2014, 213 pages.
Ex 1004—File History for U.S. Pat. No. 8,680,960, Singh, Mar. 25, 2014, 201 pages. (in two attachments due to size).
Ex. 1004—File History of U.S. Appl. No. 14/821,157, Aug. 7, 2015, Part 1, 475 pages.
Ex. 1004—File History of U.S. Appl. No. 14/821,157, Aug. 7, 2015, Part 2, 475 pages.
Ex. 1004—File History of U.S. Appl. No. 14/821, 157, Part 3, Aug. 7, 2015, 438 pages.
Ex. 1004—Prosecution History of U.S. Pat. No. 8,698,591, Singh, Apr. 15, 2014, 180 pages.
Ex. 1004—Prosecution History of U.S. Pat. No. 9,300,046, Singh, Mar. 29, 2016, 322 pages (in two attachments A and B) due to size.
Ex. 1005—U.S. Publication 2014-0035383 to Riehl, Feb. 6, 2014, 11 pages.
Ex. 1005—U.S. Pat. No. 20070267718A1 to Lee, Nov. 22, 2007, 13 pages.
Ex. 1006—Riehl P.S., et al., "Wireless Power Systems for Mobile Devices Supporting Inductive and Resonant Operating Modes," IEEE Transactions on Microwave Therory and Techniques, Mar. 2015, vol. 63, No. 3, pp. 780-790 (17 pages).
Ex 1006—Semat—Physics Chapters 29-32, 81 pages, (1958).
Ex. 1007 U.S. Publication 2011/0241437 to Kanno, Oct. 6, 2011, 21 pages.
Ex. 1008—U.S. Publication 2012/0274148 to Sung et al., Nov. 1, 2012, 13 pages.
Ex. 1009—JP Patent No. 2013-93429 to Kazuya, May 16, 2013, 27 pages.
Ex 1009—U.S. Pat. No. 20090096413 to Partovi, Apr. 16, 2009, 88 pages.
Ex. 1010—IEEE Standard Dictionary of Electrical and Electronics Terms, Sixth Edition (1996), 9 pages.
Ex. 1010—U.S. Publication No. 2015/0091502 to Mukherjee et al., Apr. 2, 2015, 7 pages.
Ex. 1011—KR Patent No. 10-2013-0045307 to Yu, May 3, 2013, 45 pages.
Ex. 1011—US20070089773A1 to Koester et al., Apr. 26, 2007, 26 pages.
Ex. 1012—US20120280765 to Kurs, Nov. 8, 2012, 122 pages.
Ex. 1012—IEE Transactions on microwave theory and techniques, New York, NY 1953, 17 pages.
Ex. 1012—U.S. Pat. No. 6,432,497 to Bunyan, Aug. 13, 2002, 12 pages.
Ex. 1013—Asa, et al., "A Novel Multi-Level Phase-Controlled Resonant Inverter with Common Mode Capacitor for Wireless EV Chargers," 2015, 6 pages.
Ex. 1014 U.S. Pat. No. 6,083,842 to Cheung et al., Jun. 4, 2000, 8 pages.
Ex. 1014—Abstract of a Novel Multi-Level Phase-Controlled Resonant Inverter with Common Mode Capacitor for Wireless EV Chargers, IEEE XPlore Digital Library, Jun. 14-17, 2015, 2 pages.
Ex. 1015 Reinhold, et al., "Efficient Antenna Design of Inductive Coupled RFID—Systems with High Power Demand," Journal of Communication, Nov. 2007, vol. 2, No. 6, pp. 14-23.

(56) References Cited

OTHER PUBLICATIONS

Ex. 1016 U.S. Pat. No. 4,549,042 to Akiba et al., Oct. 22, 1985, 8 pages.
Ex. 1018—Wheeler, "Formulas for the Skin Effect," Proceeding of the I.R.E, Sep. 1942, pp. 412-424.
Ex. 1019—Kyriazidou—U.S. Pat. No. 7,236,080, Jun. 26, 2007, 12 pages.
Ex. 1020 Alldred, et al., "A 1.2 V, 60 Ghz Radio Receiver With Onchip Transformers and Inductors in 90 nm CMOS," Proc. IEEE Compound Semiconductor Integrated Circuits SYmp., pp. 51-54, Nov. 2006 ("Alldred"), 12 pages.
Ex. 1031 Ahn U.S. Pat. No. 7,030,725, Apr. 18, 2006, 9 pages.
KR Application No. 10-2019-7005779, Decision for Grant, dated Nov. 11, 2022. 4 pages.
CN Office Action, CN Application No. 202111254604.5, dated May 23, 2024, 15 pages.

\* cited by examiner

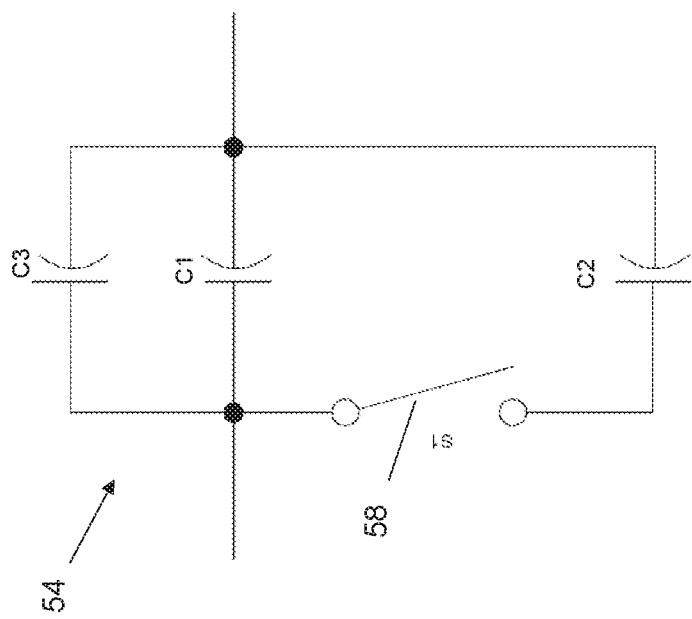

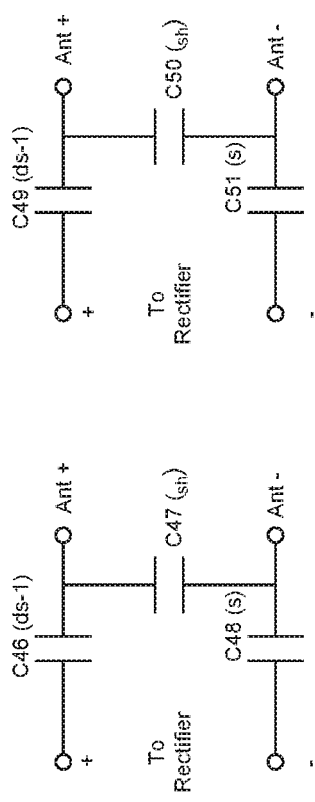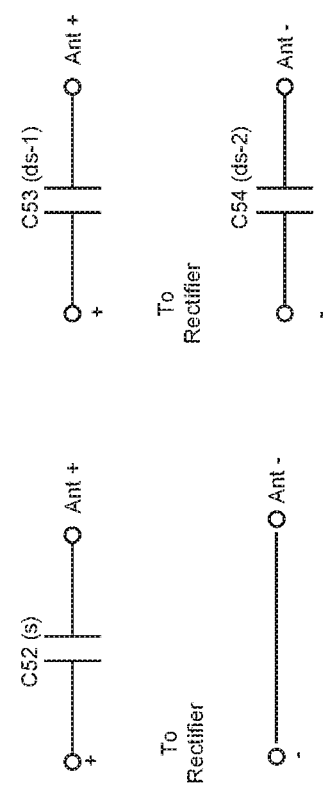
FIG. 18A  FIG. 18B  FIG. 18C  FIG. 18D

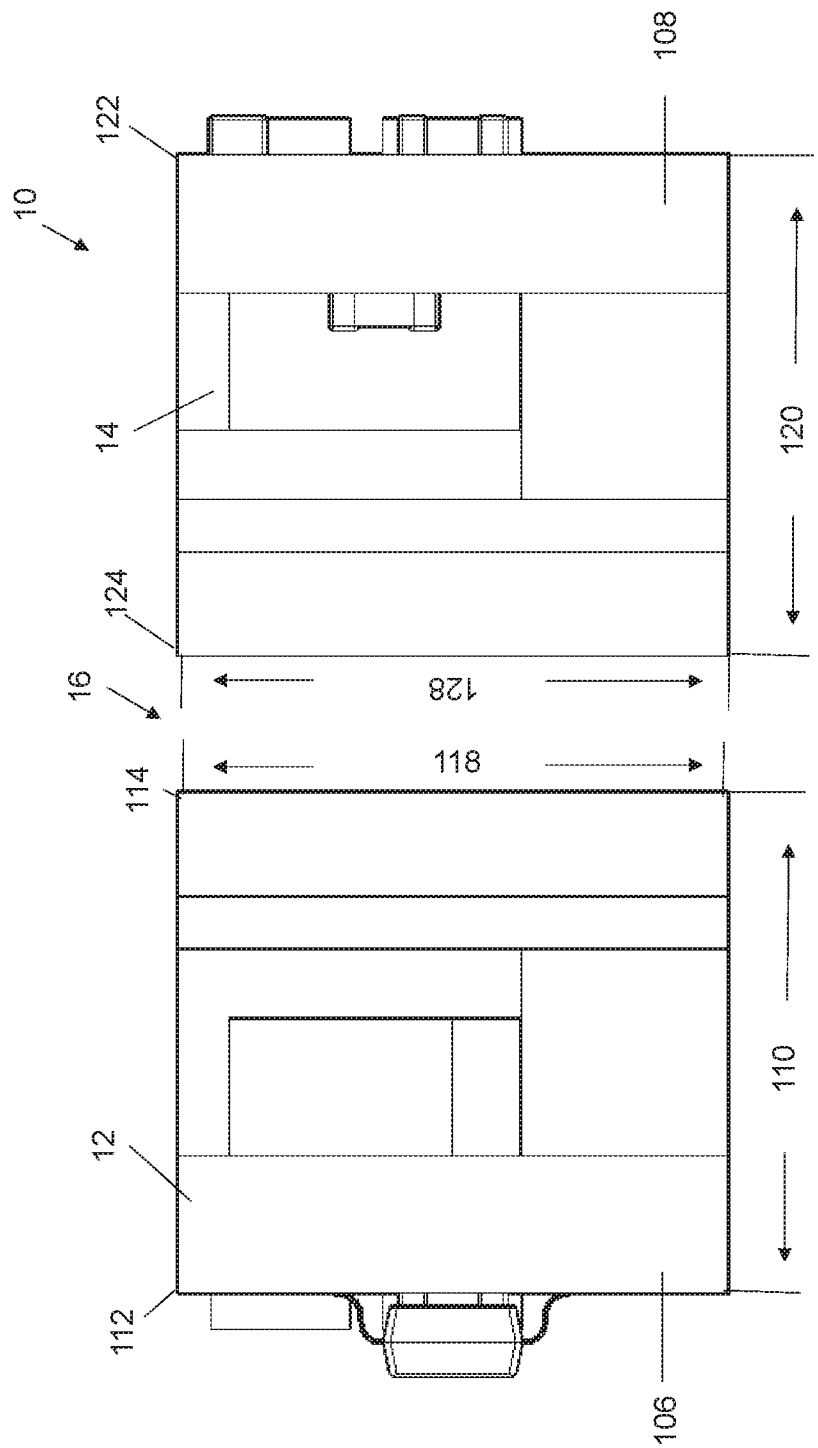

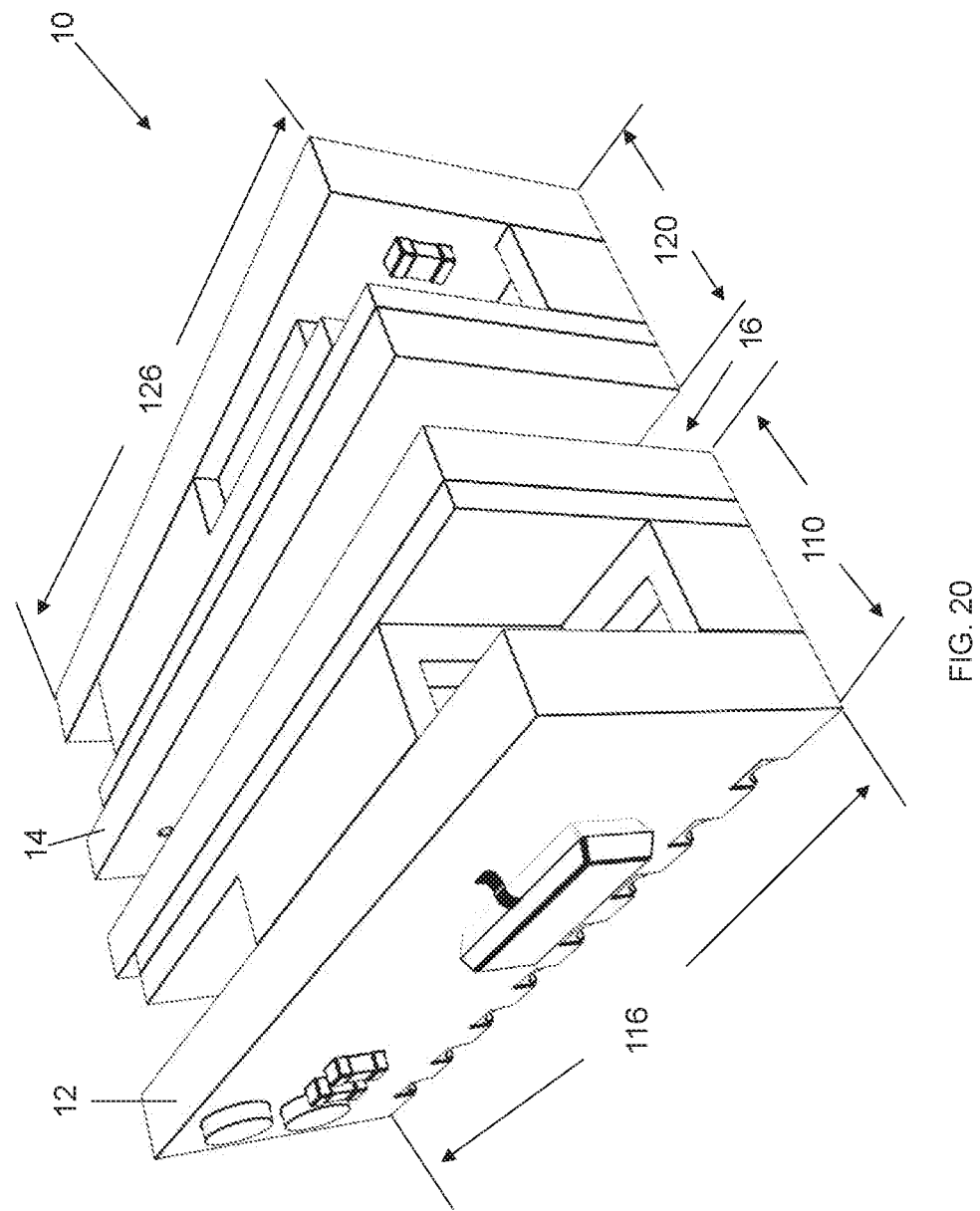

WIRELESS CONNECTOR SYSTEM

RELATED APPLICATION

This application is a continuation of, and claims priority to, U.S. Non-Provisional application Ser. No. 15/686,920, filed on Aug. 25, 2017, and entitled "Wireless Connector System," which in turn claims priority to U.S. Provisional Application No. 62/379,940, filed on Aug. 26, 2016, the disclosure of which is entirely incorporated herein by reference.

TECHNICAL FIELD

The present disclosure generally relates to the wireless transmission of electrical energy and data. More specifically, this application relates to an electrical device that facilitates the wireless transmission electrical energy at multiple operating frequencies and frequency bands.

BACKGROUND

Prior art electrical connectors are traditionally constructed with a plurality of pins that physically plug into a corresponding receiving port. Each half of these connectors are typically assigned a male and a female designation which are subsequently mated to form an electrical contact.

Fundamentally, an electrical connector is an electro-mechanical device comprising electrical conductors that are used to electrically and mechanically join other conductors, electrical terminals of apparatus and equipment to create an electrical circuit. The term electrical connector generally covers a wide range of devices designed to connect, for example, small conductors employed in communication circuits to large cables and bus-bars. They are typically passive and consist of plugs (male) and jacks (female). The connection may be temporary, as for portable equipment, or may serve as a permanent electrical joint between two wires or devices.

Examples of prior art connectors include USB and HDMI plugs. The power levels for these connectors range from a few Watts to about 100 Watts (as, for example, for the recently released USB-C). These connectors are also constructed and rated to provide data capabilities of up to 10 Gbps or higher. In addition, there are numerous types of connectors, ranging from a simplistic "Wire Nut" to more complex USB connectors or RF connectors, which mostly comply with known connection interface standards, for example, Ethernet, CAN, IO-Link, and RS485. The power levels for these connectors can range from microwatts to megawatts.

Typical connector types are in-line splice couplers, T-tap connectors, terminal lugs, and stud connectors. Couplers join conductors end to end. T-tap connectors join a through conductor to another conductor at right angles. Terminal lugs join the conductor to a drilled tongue for bolting to the terminals of equipment. Stud connectors join the conductor to equipment studs. The stud clamp is typically threaded or smooth to match the stud.

Other connector types include split-bolt connectors that are generally of a compact construction and are widely used for splicing and taping wires. The split-bolt connector comprises a bolt-shape casting having a wide and deep lengthwise slot. Conductors are inserted in the slot and a nut clamps the conductors together inside the bolt.

Yet another type of connector is an expansion or flexible connector that allows for limited motion between the connected conductors. The clamp portions of the connector are joined by short lengths of flexible copper braid and may also be held in alignment by a telescoping guide.

Another type of traditional connectors include separable type connectors that generally consist of matched plugs and receptacles. Separable type connectors are designed to separate or disconnect a conductor or group of conductors from a circuit or system. Separable type connectors are commonly used for the connection of portable devices and appliances to an electric wiring system.

Traditional connectors also include locking type connectors that are designed such that a plug is inserted and twisted through a shaped opening, locking it securely in place. Thus, when connected, locking type connectors are generally not separated by a mechanical strain such as a pull on the connected cord.

Electrical connectors are generally characterized by a variety of parameters which include, but are not limited to, the number of electrical connections (i.e. pins), physical construction, size, shape, contact resistance, insulation between electrical connections, ruggedness to vibration, resistance to contaminants and pressure, reliability, estimated lifetime (number of connect/disconnect operations before failure), and ease of connecting and disconnecting. The physical electrical connections, such as pins, of traditional connectors, provide a passage for electrical energy and data. In addition, characteristics of electrical power and data, such as power ratings and data rates are also utilized to characterize various electrical connectors.

Operation of these prior art connectors is typically dependent on the physical connection between two electrically conductive components, such as a pin and a respective pad, port or jack within which the pin is received. The physical connection occurs at a microscopic level over a relatively small interface area between the physically contacting electrically conductive components, such as a pin and a corresponding receptacle. Furthermore, traditional connectors generally require a significant amount of mechanical force to ensure an adequate physical connection of the connecting members so that an electrical signal is safely passed therethrough. This microscopic connecting area may become affected by different factors, such as harsh environments, vibration as well as wear and tear over time under normal operating conditions.

As such, the performance and reliability of these prior art connectors are largely dictated by the integrity of their physical connection. Furthermore, these traditional mechanical connectors generally require physical contact at a precise alignment to function properly.

Furthermore, wired connectors typically do not allow any relative motion between the male and the female portions. Over time, due to this physical contact, these mechanical connection points typically experience forces that can fatigue and damage the pin or port, thereby preventing proper functionality. Such prior art connectors may wear, flex, or may become corroded or damaged. As a result, the physical connection between the corresponding male and female portions such as a pin and respective port may become compromised, thereby resulting in a loss of data or electrical energy transfer therebetween due to an impaired or inoperable connector. Contamination, moisture and liquid ingress in a consumer, medical, military or industrial environment may pose undesirable problems, including outright failure to perform which may result in hazardous, unsafe or threatening conditions. In addition to improper functionality due to faulty physical connections, methods of wired communication, such as Universal Asynchronous Receiver and Transmitter Protocol (UART), Inter-Integrated Protocol (I2C), and Serial Peripheral Interface Protocol (SPI), may have limited bandwidth capabilities in comparison to various wireless methods of communication.

Moreover, developments in automation and robotics have increased the demand for transferring electrical power between dynamically moving parts and assemblies of many different industrial devices. There is a significant challenge to transfer power under these conditions using conventional wired electrical connectors.

In addition to the deficiencies given above, such prior art connectors typically comprise an electrical cord that extends from the connector. Such electrical cords are generally not desired as they may also become damaged, resulting in a loss of data or energy transfer. Furthermore, such electrical cords may excessively occupy critical space and become an impediment to the user. Moreover, exposed or damaged cords may contaminate a sterilized environment. Furthermore, such exposed or damaged cords, for example, cords that have lost their electrical insulation, may become a hazard and potentially cause electrical shock to both humans and animals.

SUMMARY

Therefore, to address these problems, a wireless connector system is provided. In an embodiment, the wireless connector system of the present application enables the wireless transmission of electrical power and/or data between spaced apart transmitter and receiver modules using near field magnetic coupling (NFMC). In an embodiment, the respective transmitter and receiver wireless modules may be insulated and/or hermetically sealed.

The connectors have exposed contact pins and features allowing them to be assembled onto larger electrical circuits, such as a printed circuit board (PCB) or flexible circuit board (FPC) using an electrical component surface mount (SMT) assembly process.

Thus, provided is an electrical connector having a form factor that can replace or eliminate the need for wired connectors.

The wireless connector system of the present application provides a wireless power link that eliminates the need for a physical connection such as an electrical connector that physically joins two components together. Thus, by eliminating the physical connection, the wireless connector or power link can be completely encapsulated, preventing liquids and other debris from inhibiting proper functionality. Without physical contact, mechanical and environmental stresses and wear of the connector are eliminated and a more reliable and robust link to transfer power and data is achieved. This solution also allows for greater misalignment and/or relative movement between the transmitter and receiver compared to prior art connectors. This could allow these connectors to be used in applications which were not previously considered for wired connectors due to their limitations.

In one or more of the embodiments of the present application, a wireless connector system is provided that includes a transmitter module with a first substrate supporting a transmitter antenna, wherein the transmitter antenna is configured to transmit a wireless signal. In addition, the wireless connector system includes a second substrate supporting a transmitter module electronic circuit, wherein the transmitter module electronic circuit is electrically connected to the transmitter antenna. In addition, a first insulator is positioned between the transmitter module electronic circuit and the transmitter antenna. The wireless connector system further includes a receiver module with a third substrate supporting a receiving antenna, wherein the receiving antenna is configured to receive the wireless signal. Furthermore, the wireless connector system includes a fourth substrate supporting a receiver module electronic circuit, wherein the receiver module electronic circuit is electrically connected to the receiver antenna. In addition, a second insulator is positioned between the receiver module electronic circuit and the receiver antenna.

The transmitter and receiver modules of the wireless connector system of the present application are designed with electrical circuitry that increases the amount of wirelessly transmitted electrical power over a greater separation distance between the transmitter and receiver modules. In addition, the wireless connector system may be configured with various sensors that detect the presence of an electrical energy transfer module, heat, or an undesirable foreign object. In an embodiment, the operation of the transmitter and/or the receiver module may be dependent upon information obtained from various sensors that may or may not be incorporated within the module.

BRIEF DESCRIPTION OF THE DRAWINGS

FIGS. 7, 8A, and 8B show embodiments of a switching capacitance circuit that may be incorporated within the impedance matching circuit of the transmitter or receiver circuit of the present application.

FIGS. 18A-18D illustrate embodiments of capacitors within the impedance matching circuit that may be utilized in the transmitter or receiver circuit.

FIGS. 19-21 show embodiments of the transmitter and receiver modules of the present application.

DETAILED DESCRIPTION

Figure 1:
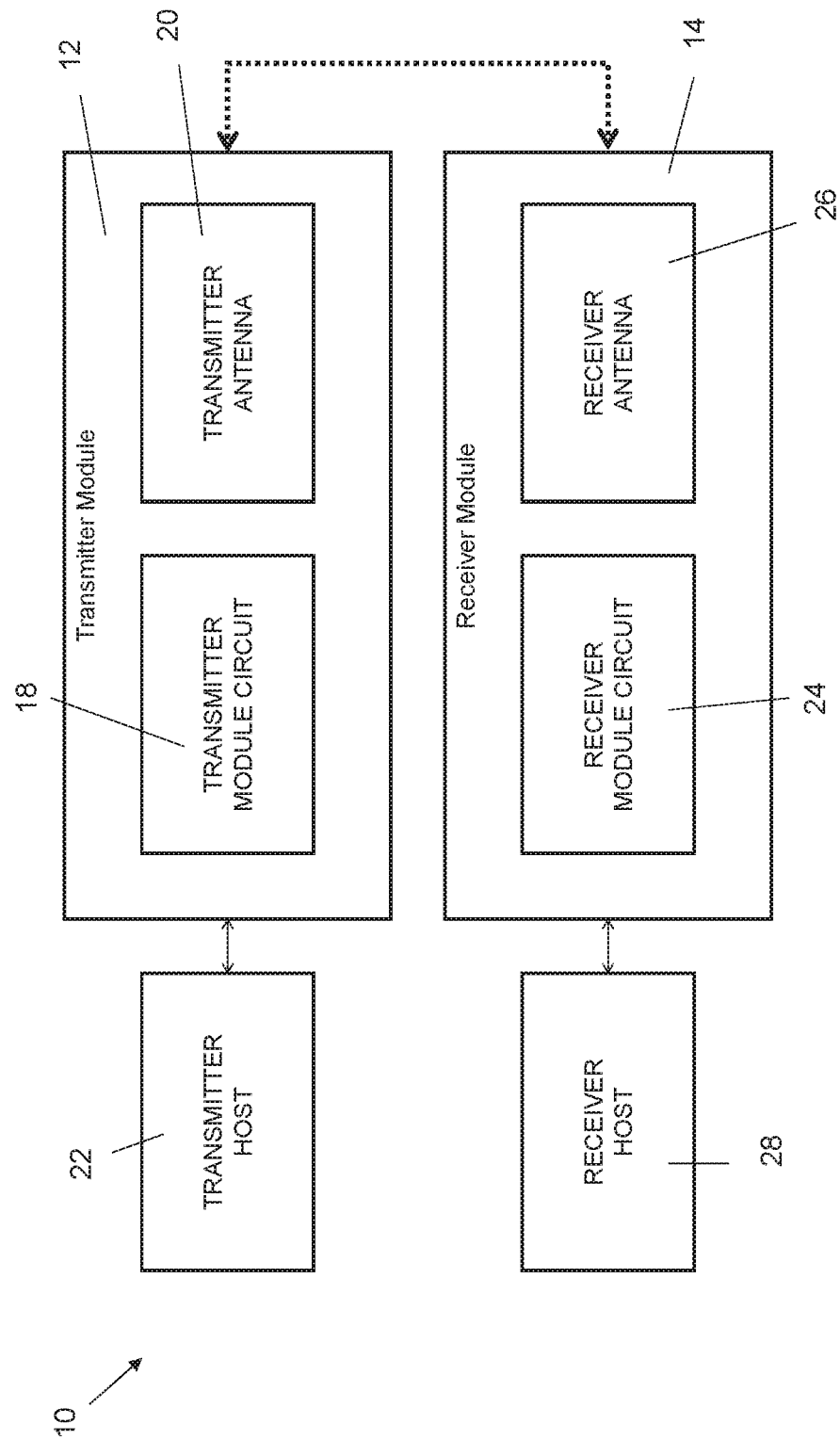
FIG. 1 illustrates a block diagram of an embodiment of the wireless connector system of the present application.

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The wireless connector system 10 of the present disclosure provides for the wireless transfer of electrical energy and/or data. More specifically, the wireless connector system 10 of the present invention provides for the wireless transfer of electrical energy and/or data via near field magnetic coupling. In an embodiment, the wireless connector system 10 comprises a transmitter module 12 configured to transmit electrical energy and a receiver module 14 configured to receive electrical energy transmitted by the transmitter module 12. In an embodiment, the transmitter module 12 is positioned spaced from the receiver module 14 so that electrical energy is wirelessly transmitted from the transmitter module 12 across a separation distance or gap 16 (FIGS. 2 and 19-22) where it is received by the receiver module 14. Thus, the combination of the transmitter and receiver modules 12, 14 provides for the wireless connector system 10 so that electrical energy can be transferred wirelessly without the need of a physical connection therebetween.

In this application, the inventive concepts particularly pertain to near-field magnetic coupling (NFMC). Near-field magnetic coupling enables the transfer of electrical energy and/or data wirelessly through magnetic induction between a transmitting antenna and a corresponding receiving antenna. The NFC standard, based on near-field communication interface and protocol modes, is defined by ISO/IEC standard 18092. Furthermore, as defined herein "inductive charging" is a wireless charging technique that utilizes an alternating electromagnetic field to transfer electrical energy between two antennas. "Resonant inductive coupling" is defined herein as the near field wireless transmission of electrical energy between two magnetically coupled coils that are tuned to resonate at a similar frequency. As defined herein the term "shunt" means an electrically conductive pathway that is created by electrically joining two points of a circuit such that an electrical current or an electrical voltage may pass therethrough. As defined herein "mutual inductance" is the production of an electromotive force in a circuit by a change in current in a second circuit magnetically coupled to the first. As defined herein a "shielding material" is a material that captures a magnetic field. Examples of shielding material include, but are not limited to ferrite materials such as zinc comprising ferrite materials such as manganese-zinc, nickel-zinc, copper-zinc, magnesium-zinc, and combinations thereof. A shielding material thus may be used to direct a magnetic field to or away from an object, such as a parasitic metal, depending on the position of the shielding material within or nearby an electrical circuit. Furthermore, a shielding material can be used to modify the shape and directionality of a magnetic field. As defined herein a parasitic material, such as a parasitic metal, is a material that induces eddy current losses in the inductor antenna. This is typically characterized by a decrease in inductance and an increase in resistance of the antenna, i.e., a decrease in the quality factor.

FIG. 1 shows a generic block diagram of the wireless connector system 10 of the present invention. As shown, the system 10 comprises the transmitter module 12 spaced from the receiver module 14 by the gap 16. The transmitter module 12 comprises a transmitter module circuit 18 that is electrically connected to a transmitter antenna 20. In an embodiment, the transmitter antenna 20 may comprise one or more antennas to facilitate the wireless transfer of electrical power and/or data. In an embodiment, the transmitter module circuit 18 is configured to modify electrical energy that is received from an electrical source (not shown) or a transmitter host device 22 that is electrically connected to the transmitter module 12. In an embodiment, the transmitter host device 22 may comprise an electrically operated device, a circuit board, an electronic assembly, or other electronic device. Examples of transmitter host devices include, but are not limited to, a medical device, a device that comprises an integrated circuit, such as a computer, and personal electronic devices, such as, but not limited to, eye glasses and clothing configured with electronic components.

The transmitter antenna 20 is configured to wirelessly transmit the electrical energy conditioned and modified for wireless transmission by the transmitter module circuit 18 via near-field magnetic induction coupling. In an embodiment, the transmitter module 12 may be electrically powered by the transmitter host device 22.

In an embodiment, the receiver module 14 comprises a receiver module circuit 24 that is electrically connected to a receiver module antenna 26. The receiver antenna 26 is configured to receive electrical energy and/or data that is transmitted by the transmitter module 12. In an embodiment, the receiver module circuit 24 is configured to condition the received wireless electrical energy such that it can be used to electrically power a device or provide electrical energy to an electrical energy storage device such as a battery or capacitor.

In an embodiment, the receiver module 14 is electrically connected to a receiver host device 28. In an embodiment, the receiver host device 28 comprises an electrically operated device, a circuit board, an electronic assembly, or other electronic device. Examples of receiver host devices include, but are not limited to, a medical device, a device that comprises an integrated circuit, such as a computer, and personal electronic devices, such as not but limited to eye glasses and clothing configured with electronic components. In an embodiment, the receiver module 14 may be electrically powered from an electrical power source 105 (FIG. 17) supplied by the receiver host device 28. It is noted that at least one of the transmitter and receiver modules 12, 14 may be configured as a transceiver thereby enabling either or both the transmitter and receiver modules 12, 14 to transmit and receive electrical power and/or data.

In an embodiment, the transmitter module 12 and the receiver module 14 may be connected to the same host device to facilitate wireless transfer of electrical energy within the host device. Alternatively, the transmitter and receiver modules 12, 14 may be electrically connected to different host devices thereby facilitating wireless transfer of electrical energy between two different devices.

Figure 2:
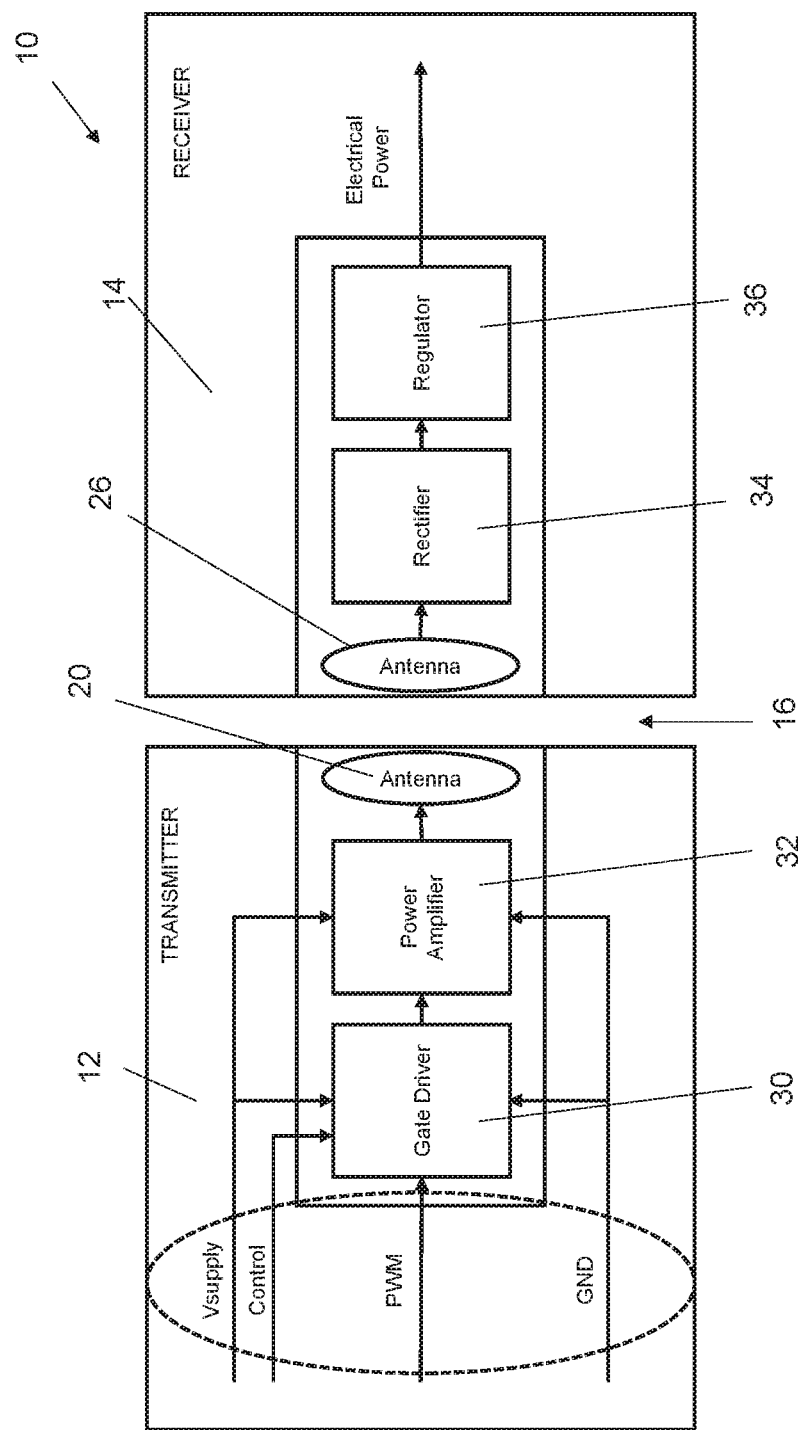
FIG. 2 shows a block diagram of an embodiment of the wireless connector system of the present application.
Figure 3:
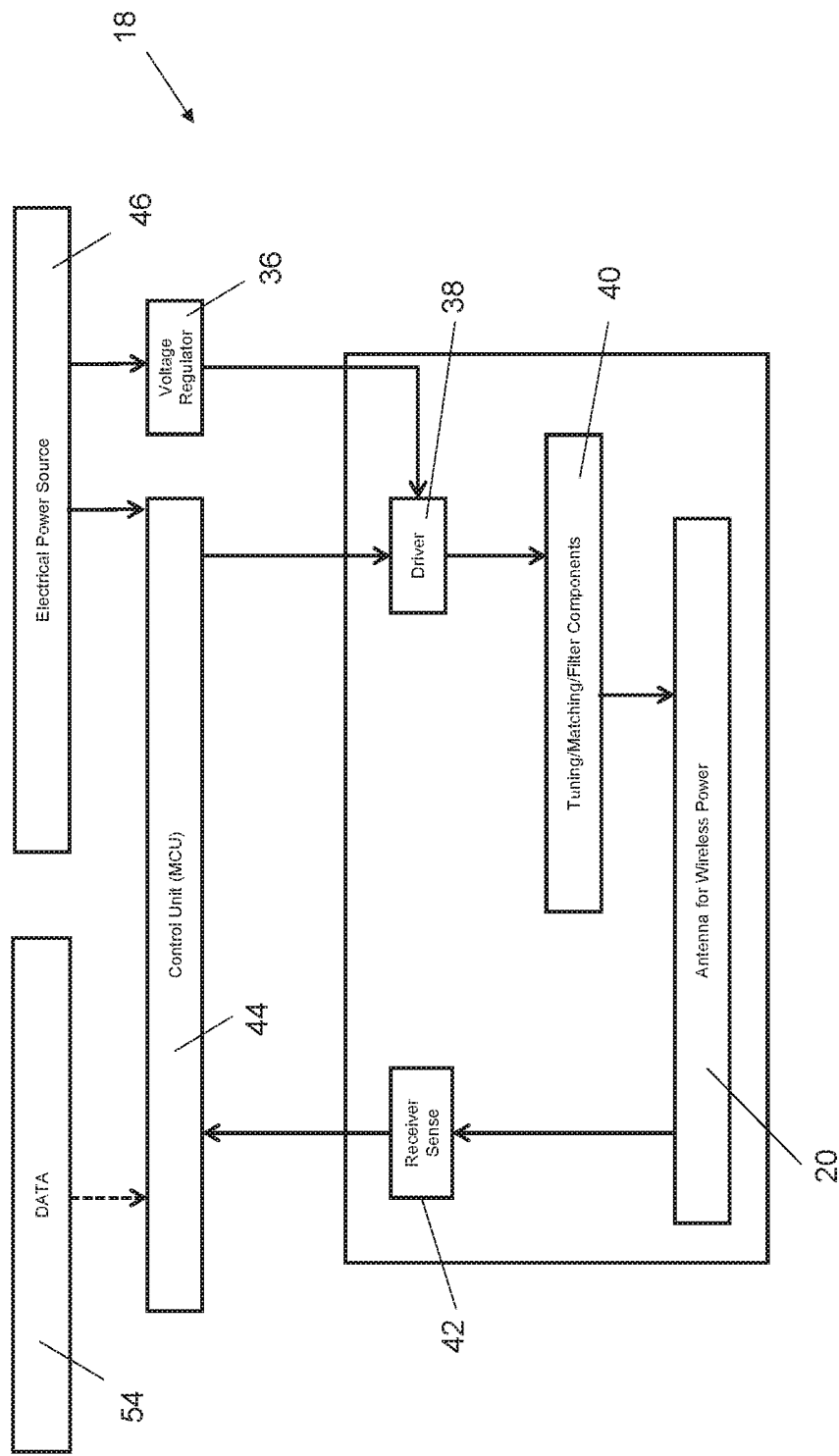
FIGS. 3-6 illustrate electrical block diagrams of embodiments of the transmitter module.

FIG. 2 illustrates a block diagram of an embodiment of the wireless connector system 10 of the present application. As shown, the transmitter module circuit 18 comprises a gate driver 30 and an electrical power amplifier 32. A voltage supply and electrical ground, from the transmitter host device 22 are electrically connected to the gate driver 30 and the electrical power amplifier 32 of the transmitter module circuit 18. In an embodiment, the gate driver 30 is used to control the operation of the electrical power amplifier 32. In addition, a control signal and pulse width modulation signal, from the transmitter host device 22 are electrically connected to the gate driver 30 of the transmitter module circuit 18. In an embodiment, the control signal and pulse width modulator signal are used to control the operation of the transmitter module 12. The receiver module 14, which is illustrated comprising the receiver antenna 26, a rectifier 34 and a voltage regulator 36, is positioned spaced at the gap 16 from the transmitter module 12. As illustrated, an electrical power line, which is electrically connected to the receiver host device 28 and the receiver module circuit 24, exits the receiver module 14 to provide electrical power to a connected receiver host device 28. In an embodiment, the rectifier 34 is configured to rectify the received wireless electrical power from an alternating current electrical power to a direct current electrical power. The voltage regulator 36 is configured to modify the voltage of the received wireless electrical power before it exits the receiver module 14.

FIGS. 3-6 are block diagrams that illustrate embodiments of the transmitter module circuit 18 of the present invention that comprises various transmitter module sub-circuits. As illustrated in the embodiment shown in FIG. 3, the transmitter module circuit 18 comprises an electrical driver sub-circuit 38, an electrical impedance matching or network sub-circuit 40 and a receiver sensing sub-circuit 42. In addition, the transmitter module circuit 18, may comprise a voltage regulator 36 and a master control unit 44. Alternatively, as shown, the voltage regulator 36 and the master control unit 44 may be comprised within the transmitter host device 22.

In an embodiment, the voltage regulator 36 is configured to adjust the amplitude of the voltage of the electrical energy received from an electrical source, such as the transmitter host device 22, by the transmitter module circuit 18. In the embodiment shown, the voltage regulator 36 is electrically connected to an electrical power source 46 and the driver sub-circuit 38. In an embodiment, the electrical power source 46 may comprise an electrical storage device such as an electrochemical cell (not shown), a battery pack (not shown), or a capacitor (not shown). In addition, the electrical power source 46 may comprise an alternating or direct current electrical power from the transmitter host device 22. In an embodiment, the driver circuit 38 controls the operation of the electrical impedance matching or network sub-circuit 40 and/or the transmitter antenna 20. In an embodiment, the driver sub-circuit 38 may comprise an integrated circuit such as a half-bridge integrated circuit. In an embodiment, the driver sub-circuit 38 may be configured to convert at least a portion of the electrical power from a direct current electrical power to an alternating current electrical power for wireless transmission.

In an embodiment, the receiver sensing sub-circuit 42 is configured to detect the presence of the receiver module 14. In an embodiment, if the presence of the receiver module 14 is detected, wireless transmission of electrical power and/or data by the transmitter module 12 to the receiver module 14 is enabled. Likewise, in an embodiment, if the presence of the receiver module 14 is not detected, wireless transmission of electrical power and/or data is prevented from occurring. In addition, the master control unit 44, which may comprise an integrated circuit, is electrically connected to the driver sub-circuit 38. In an embodiment, the master control unit 44 controls the operation of the transmitter antenna 20 and transmitter module circuit 18. The electrical impedance matching or network circuit 40, which comprises at least one capacitor, is electrically connected to the electrical driver sub-circuit 38 and the transmitter antenna 20. The impedance matching circuit 40 provides a capacitance that is designed to adjust and match the electrical impedance of the receiver antenna 26 to a characteristic impedance of the power generator or the load at a driving frequency of the transmitter antenna 20.

In an embodiment, electrical power from an electrical source 46, such as the transmitter host device 22, is received by the voltage regulator 36 and the master control unit 44. A first portion of the electrical power, from the electrical power source 46, is configured to electrically power the components of the transmitter module 12 such as the master control unit 44. A second portion of the electrical power, from the electrical power source 46, is conditioned and modified for wireless transmission to the receiver module 14. In an embodiment, the voltage regulator 36 modifies the amplitude of the voltage of the second portion of electrical power to match the voltage requirements of the receiver host device 28. The second portion of the electrical power, conditioned by the transmitter module circuit 18 for wireless transmission, is received by the transmitter antenna 20 where it is wirelessly transmitted to the receiver module 14.

Figure 4:
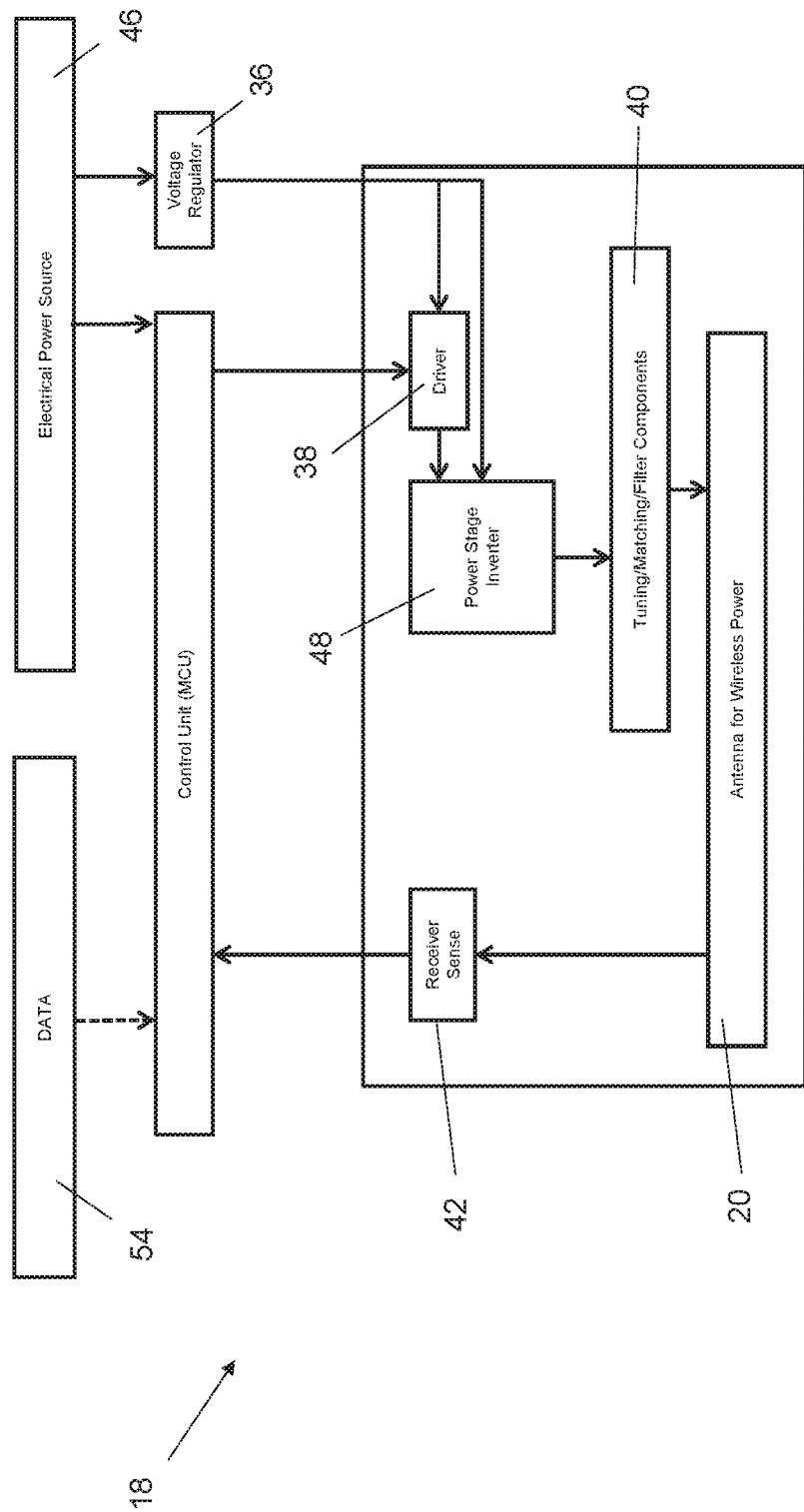

In an embodiment, as illustrated in FIG. 4, the transmitter module circuit 18 may also be configured with a power stage inverter 48, such as a dual field effect transistor power stage inverter. In an embodiment, the power stage inverter 48 is an electrical amplifier that is electrically connected to the driver sub-circuit 38 and the network analyzer sub-circuit 40. In an embodiment, the addition of the power inverter 48 within the transmitter module circuit 18 enables wireless transmission of an electrical power having an increased amplitude. For example, the addition of the inverter sub-circuit 48 enables the transmitter module 12 to transmit an electrical power from about 300 mW to about 600 mW. Without the embodiment of the power stage inverter 48, the transmitter module 12 is configured to transmit electrical power between about 100 mW to about 300 mW. Also, the power stage inverter 48 may be configured to modify the electrical power to be transmitted from a direct current electrical power to an alternating current electrical power.

Figure 5:
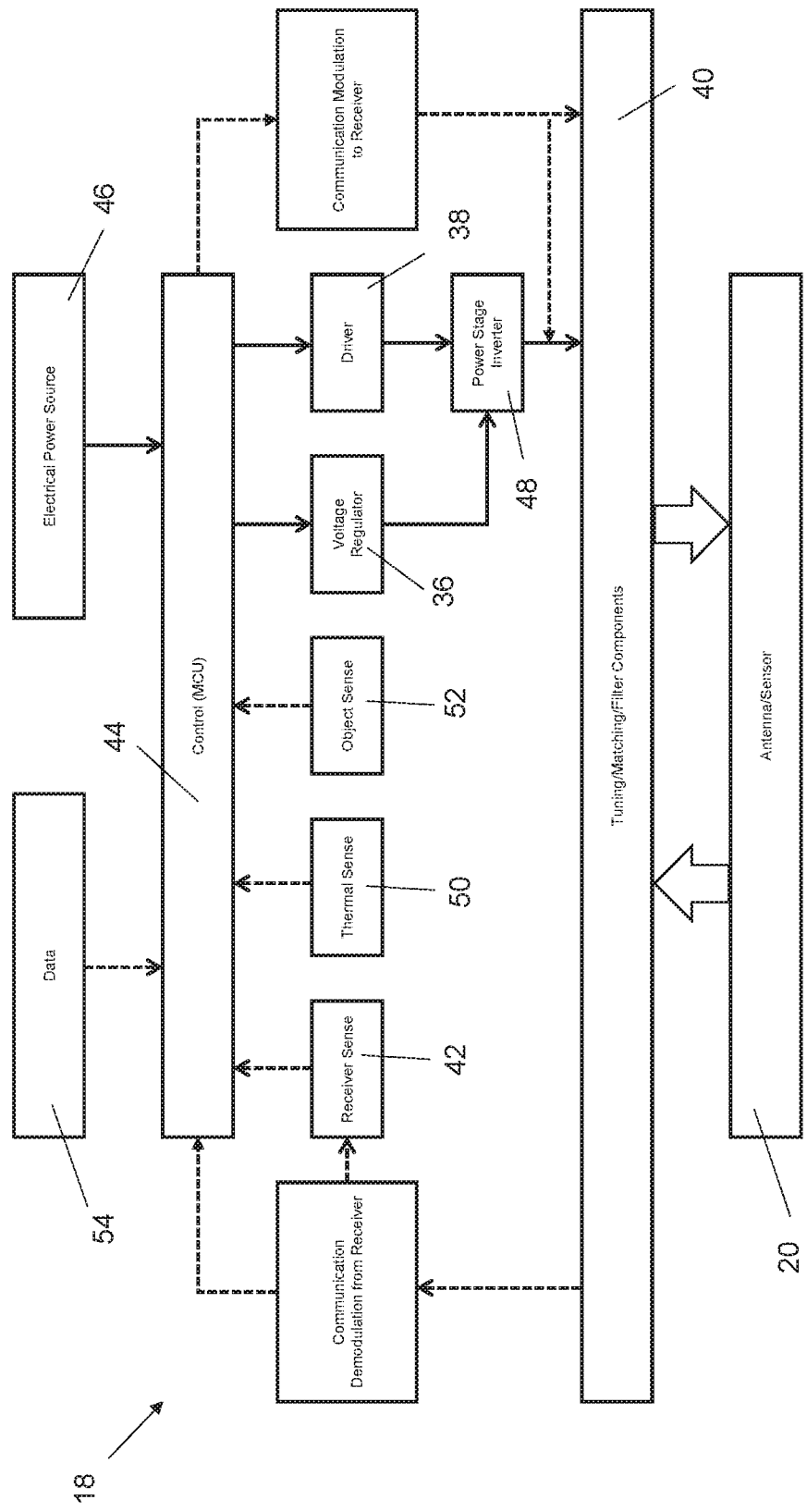

As shown in FIG. 5, the transmitter module circuit 18 may be configured with a variety of sensing circuits. In addition to the receiver sensing sub-circuit 42, the transmitter module circuit 18 may also be configured with a thermal sense sub-circuit 50 and/or an object sensing sub-circuit 52. As illustrated, the thermal and object sensing sub-circuits 50, 52 are electrically connected to the transmitter master control unit 44. The thermal sense sub-circuit 50 is configured to monitor the temperature within the transmitter module 12. In an embodiment, if the master control unit 44 through the thermal sense sub-circuit 50 detects that the temperature within the transmitter module 12 to have increased from about 20° C. to about 50° C., the transmitter master control unit 44 prevents the operation of the transmitter module 12. In an embodiment, the thermal sensing sub-circuit 50 may comprise a thermocouple, a thermistor, such as a negative temperature coefficient (NTC) resistor, a resistance temperature detector (RTD), or combinations thereof. In an embodiment, the object detection sub-circuit 52 is electrically connected to the transmitter master control unit 44. In an embodiment, the object detection sub-circuit 52 is configured to detect the presence of an undesired object. In an embodiment, if the master control unit 44 through the object detection sub-circuit 52, detects the presence of an undesired object, the master control unit 44 prevents the operation of the transmitter module 12. In an embodiment, the object detection sub-circuit 52 utilizes an impedance change detection scheme in which the master control unit 44 analyzes a change in electrical impedance observed by the transmitter antenna 20 against a known, acceptable electrical impedance value or range of electrical impedance values. In addition, the object detection sub-circuit 52 may utilize a quality factor change detection scheme in which the master control unit 44 analyzes a change from a known quality factor value or range of quality factor values of the object being detected, such as the receiver antenna 26. In an embodiment, the object detection sub-circuit 52 may comprise an optical sensor, a Hall Effect sensor, or combination thereof. In an embodiment, these sensors, may be monitored using the master control unit 44, a computer (not shown), a comparator (not shown), or other active or passive monitoring methods known to one skilled in the art. Furthermore, the information obtained from the sensors may be used to control operation of the transmitter module 12, the receiver module 14, or the system 10. In addition, the transmitter module circuit 18 may be configured to transmit and receive data 54. In an embodiment, the transmitter module 12 may be configured to communicate to and from the receiver module 14 through modulation and demodulation of the data 54. In an embodiment, the data 54 may comprise information in for form of an electrical voltage and/or an electrical current.

Figure 6:
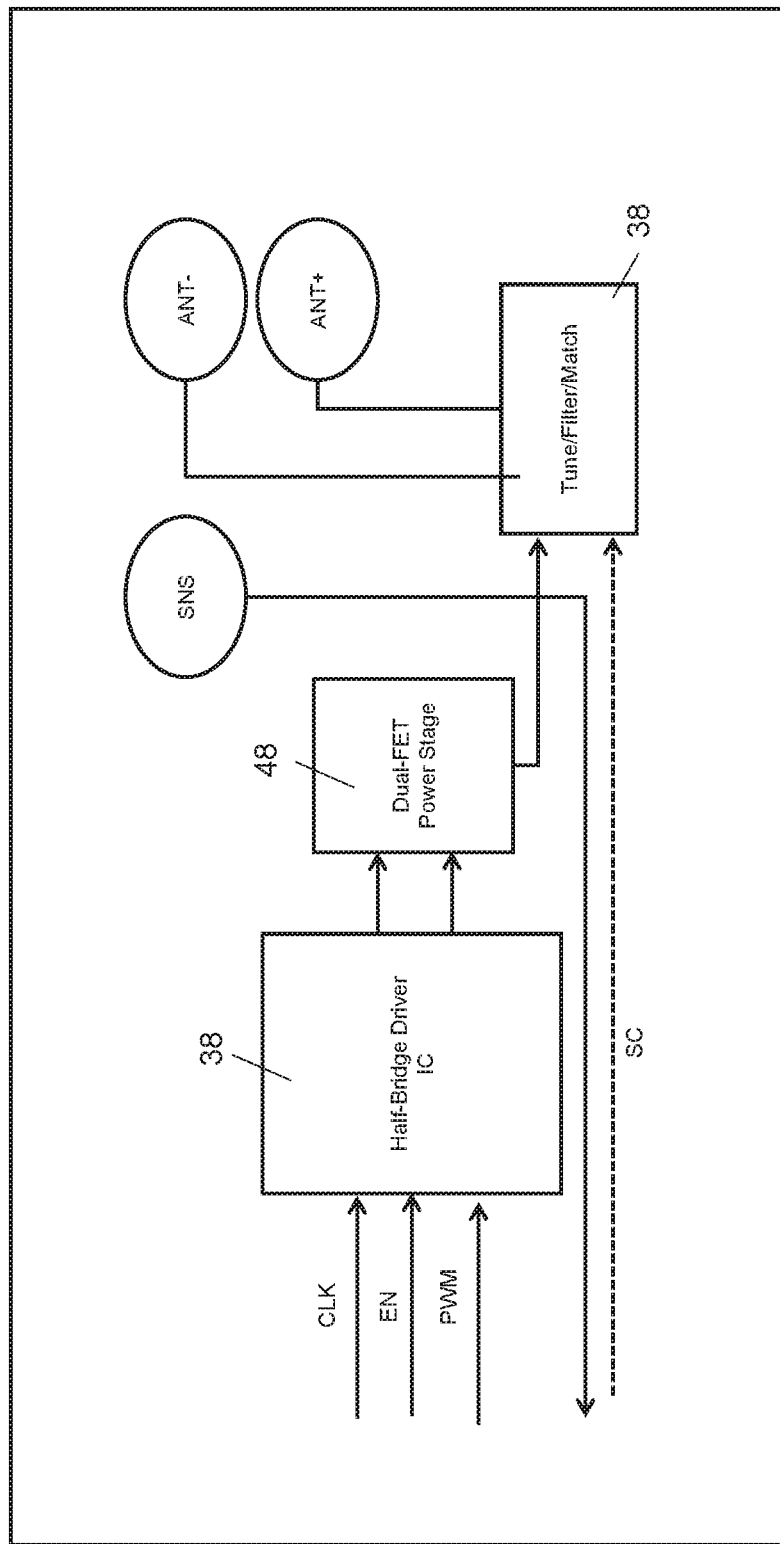

FIG. 6 illustrates an embodiment of the transmitter module circuit 18 of the present application comprising the master control unit 44, the driver circuit 38 comprising a half-bridge driver, the power stage inverter 48 comprising a dual-field effect power stage inverter and the impedance matching circuit 40. A sensing line (SNS) connects the master control unit (MCU) 44 to at least one of the receiver sensing sub-circuit 42, the thermal sensing sub-circuit 50 and the object detection sub-circuit 52.

Figure 8A:
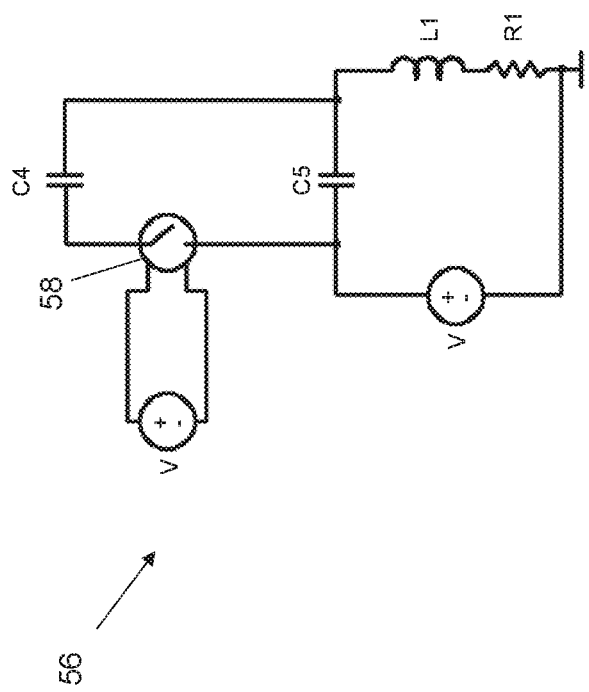
Figure 8B:
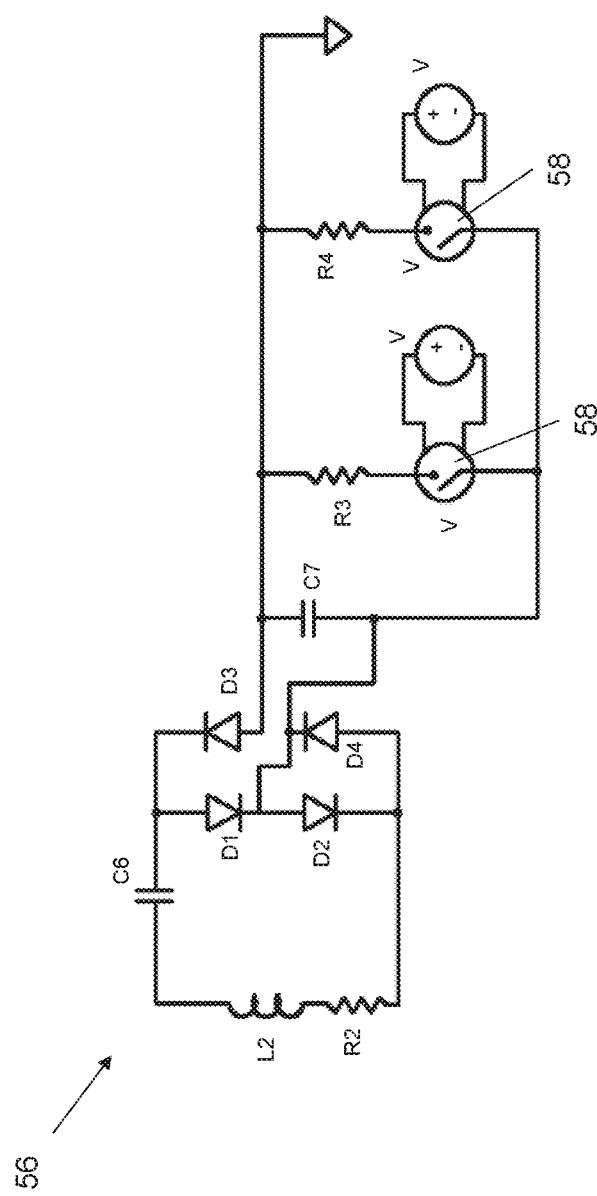

In an embodiment, as illustrated in FIGS. 7, 8A, and 8B, the impedance matching sub-circuit 40 may comprise a switch capacitance sub-circuit 56. In an embodiment, the switch capacitance sub-circuit 56 comprises an electrical switch 58 and at least two capacitors $C_1$ and $C_2$ that are connected in electrical parallel. As shown in FIG. 7, three capacitors $C_1$, $C_2$, and $C_3$ are connected in electrical parallel and the switch 58 is shown between capacitors $C_1$ and $C_2$. In an embodiment, the capacitance of the impedance matching circuit 40 may be adjusted by the master control unit 44 by turning the switch 58 on and off, thereby dynamically connecting or disconnecting capacitors within the impedance matching sub-circuit 40 which adjusts the resulting impedance.

FIG. 8A illustrates an alternate embodiment of the switch capacitance sub-circuit 56 in which the switch 58 is electrically connected between capacitors $C_4$ and $C_5$, that are electrically connected in parallel. In addition, inductor Li and resistor $R_1$ are electrically connected to capacitors $C_4$ and $C_5$. FIG. 8B illustrates an alternate embodiment of a switch capacitor sub-circuit 56 comprising first and second switches 58, resistors $R_2$, $R_3$, and $R_4$, capacitors $C_6$ and $C_7$, and diodes $D_1$-$D_4$ that may be incorporated within the transmitter module circuit 18 or the receiver module circuit 24 to dynamically adjust the impedance of the impedance matching circuit 40.

FIGS. 9-12 are electrical schematic diagrams that illustrate embodiments of the transmitter module circuit 18 of the present application. In an embodiment, the transmitter module circuit 18 comprises the impedance matching sub-circuit 40, an electrical power sub-circuit 60 and a sensing sub-circuit 62, such as the receiver module sensing sub-circuit 42, the thermal sensing sub-circuit 50, the object sensing sub-circuit 52, or combinations thereof. In an embodiment, the electrical power sub-circuit 60 modifies and configures electrical power received from the electrical power source 46 to power the various circuits comprising the transmitter module 12 and provide electrical power for wireless transmission to the receiver module 14.

Figure 9:
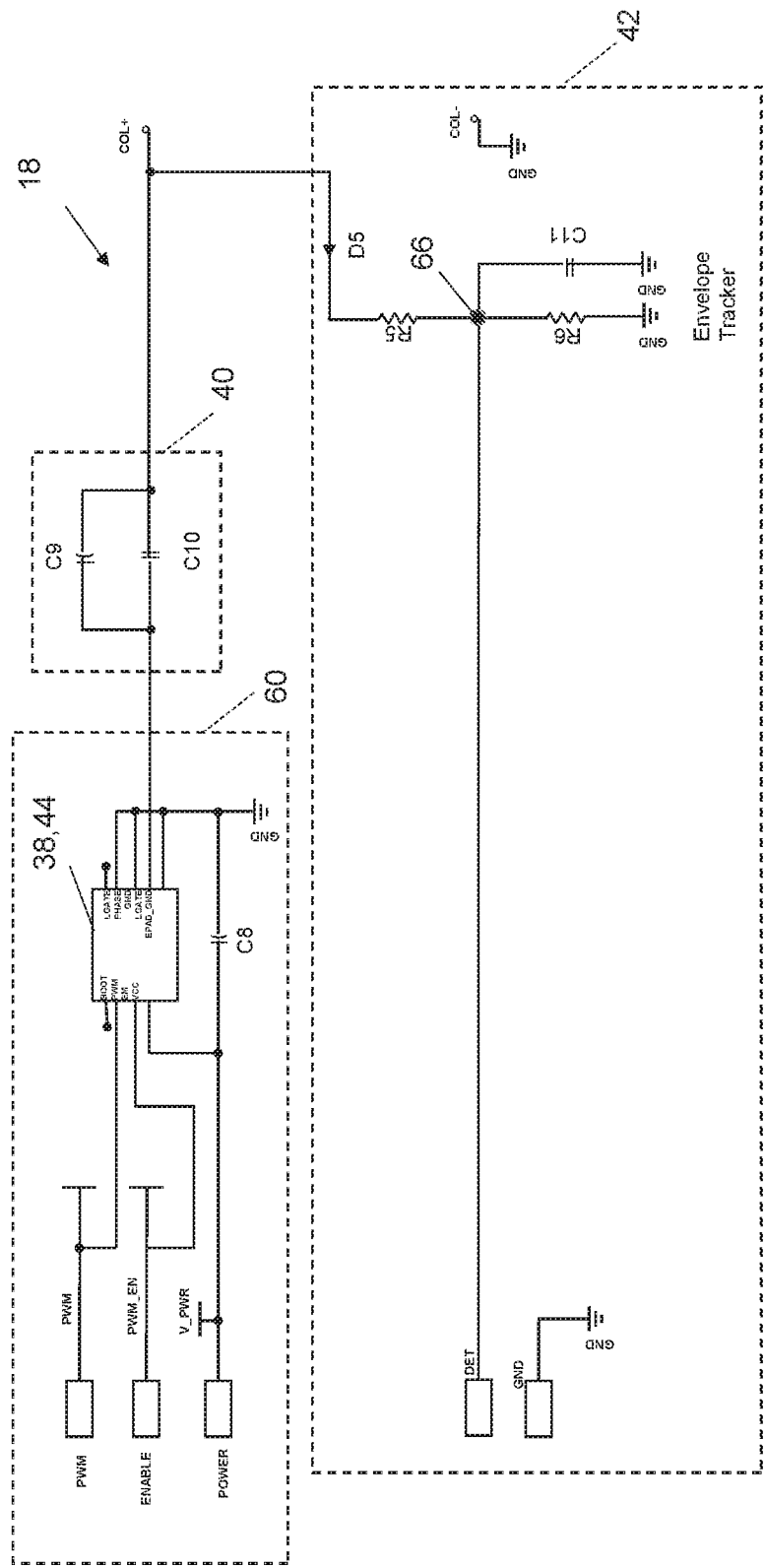
FIGS. 9-12 illustrate electrical schematic diagrams of embodiments of the transmitter circuit.
Figure 10:
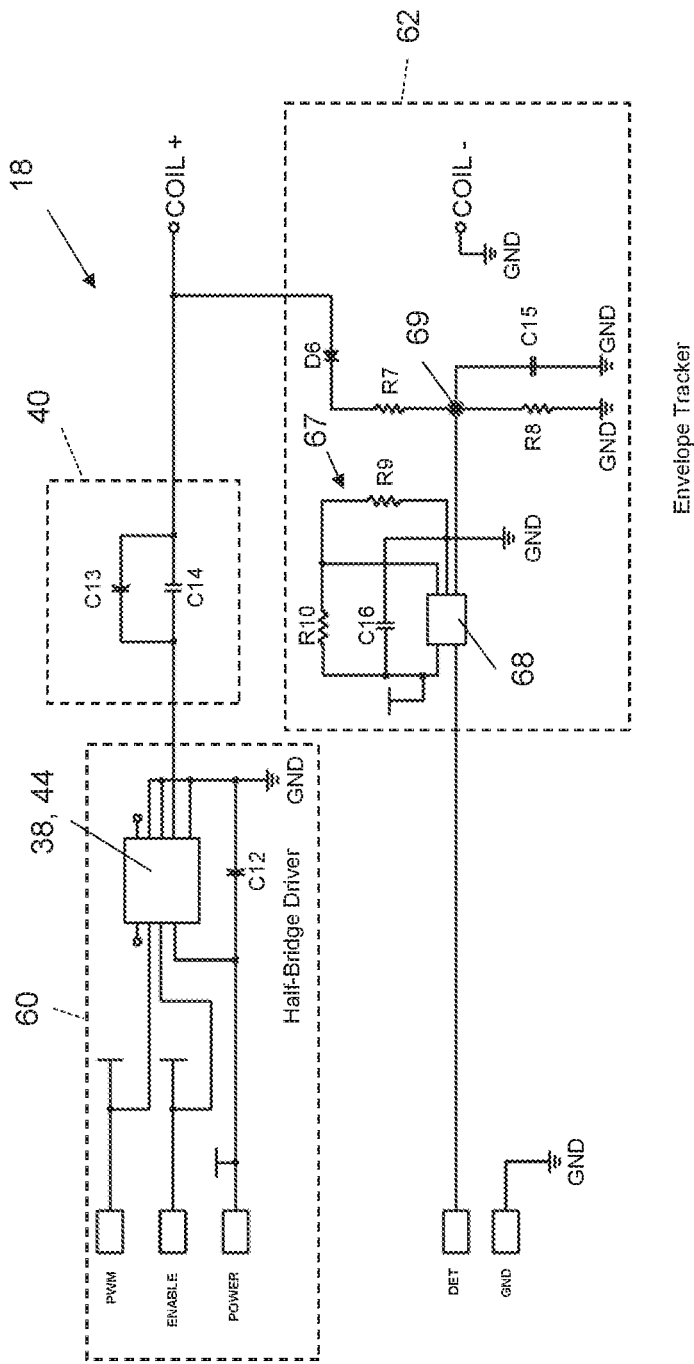

As illustrated in the embodiments shown in FIGS. 9 and 10, the electrical power sub-circuit 60 comprises the driver sub-circuit 38, such as a half-bridge driver circuit. Alternatively, in lieu of the driver sub-circuit 38, the electrical power sub-circuit 60 may comprise the master control unit 44. Electrical energy from the power source 46 or the transmitter host device 22 is received by the transmitter driver sub-circuit 38 or master control unit 44. The driver sub-circuit 38 or the master control unit 44 is configured to convert a portion of the electrical power from a direct current electrical power to an alternating current electrical power for wireless transmission. In addition, the driver sub-circuit 38 or master control unit 44 may be configured to adjust the amplitude of the voltage of the received electrical power. The driver sub-circuit 38 or master control unit 44 is also configured to provide electrical power to operate the other components that comprise the transmitter module 12.

In addition to the electrical power sub-circuit 60, the embodiments of the transmitter circuit shown in FIGS. 9 and 10 further illustrate different embodiments of the receiver module sensing sub-circuit 42. As illustrated in the embodiment of FIG. 9, the receiver module sensing sub-circuit 42 comprises an envelope tracker sub-circuit 64 comprising resistors $R_5$ and $R_6$ electrically connected in series, diode $D_5$ electrically connected in series to resistor $R_5$, and capacitor $C_{11}$ electrically connected between resistors $R_5$ and $R_6$. The envelope tracker circuit 64 is configured to generate an analog voltage signal at node 66 that resides between resistors $R_5$ and $R_6$. In an embodiment, the analog voltage is received by an analog to digital converter (not shown) that is electrically connected to the master control unit 44. In an embodiment, when the receiver module 14 is positioned within the magnetic field emanating from the transmitter antenna 20, the receiver antenna 26 within the receiver module 14 begins to resonate. The presence of the receiver antenna 26 within the magnetic field emanating from the transmitter antenna 20 establishes an electrical coupling between the transmitter and receiver antennas 20, 26 creates a shift in electrical impedance that is detected by the transmitter antenna 20. This change in electrical impedance which results when the receiver antenna 26 of the receiver module 14 is positioned within the magnetic field generates a change in electrical voltage at node 66. Thus, this voltage signal alerts the master control unit 44 of the transmitter module 12 which then begins transmission of electrical energy from the transmitter module 12 to the receiver module 14. For example, if a voltage greater than 0 is detected by the transmitter host device 22 or transmitter master control unit 44 from the voltage sense signal, it is determined that the receiver module 14 is present. In an embodiment, if the receiver module 14 is determined to be present, the driver sub-circuit 38 or the transmitter master control unit 44 is activated and electrical power from the transmitter host device 22 or electrical power source 46 is wirelessly transmitted by the transmitter antenna 20 to the receiver module 14.

FIG. 10 illustrates an alternate embodiment of the envelope tracker circuit 64. In addition to resistors $R_7$, $R_8$, diode D6, and capacitor $C_{15}$, the envelope tracker circuit 64 comprises integrated sub-circuit 67 that comprises integrated circuit 68, capacitor $C_{16}$ and resistors $R_9$ and $R_{10}$. In an embodiment, the integrated sub-circuit 67 is configured to convert the analog voltage received at node 69 into a digital signal that is received by the master control unit 44 within the transmitter module circuit 18.

Figure 11:
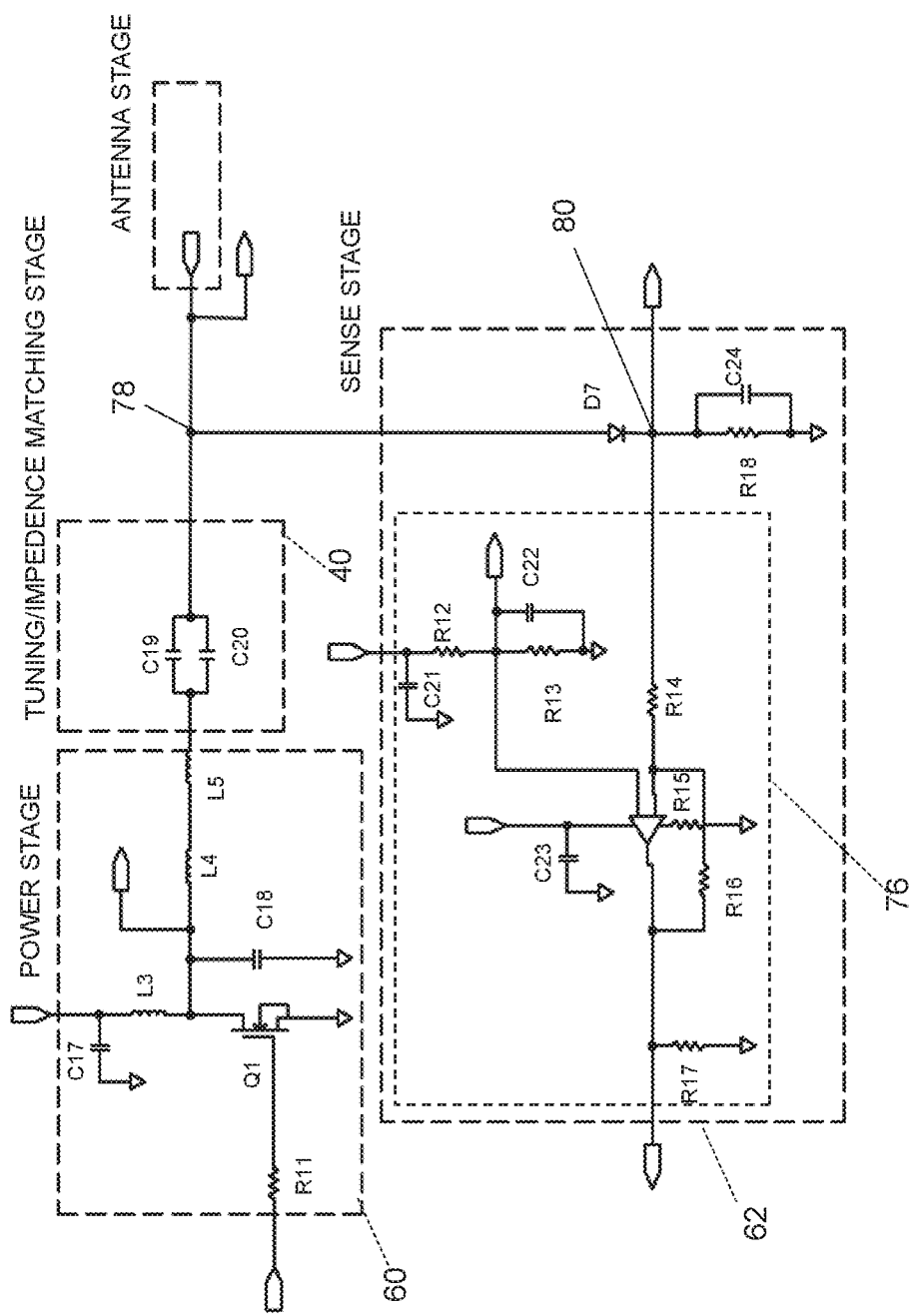
Figure 12:
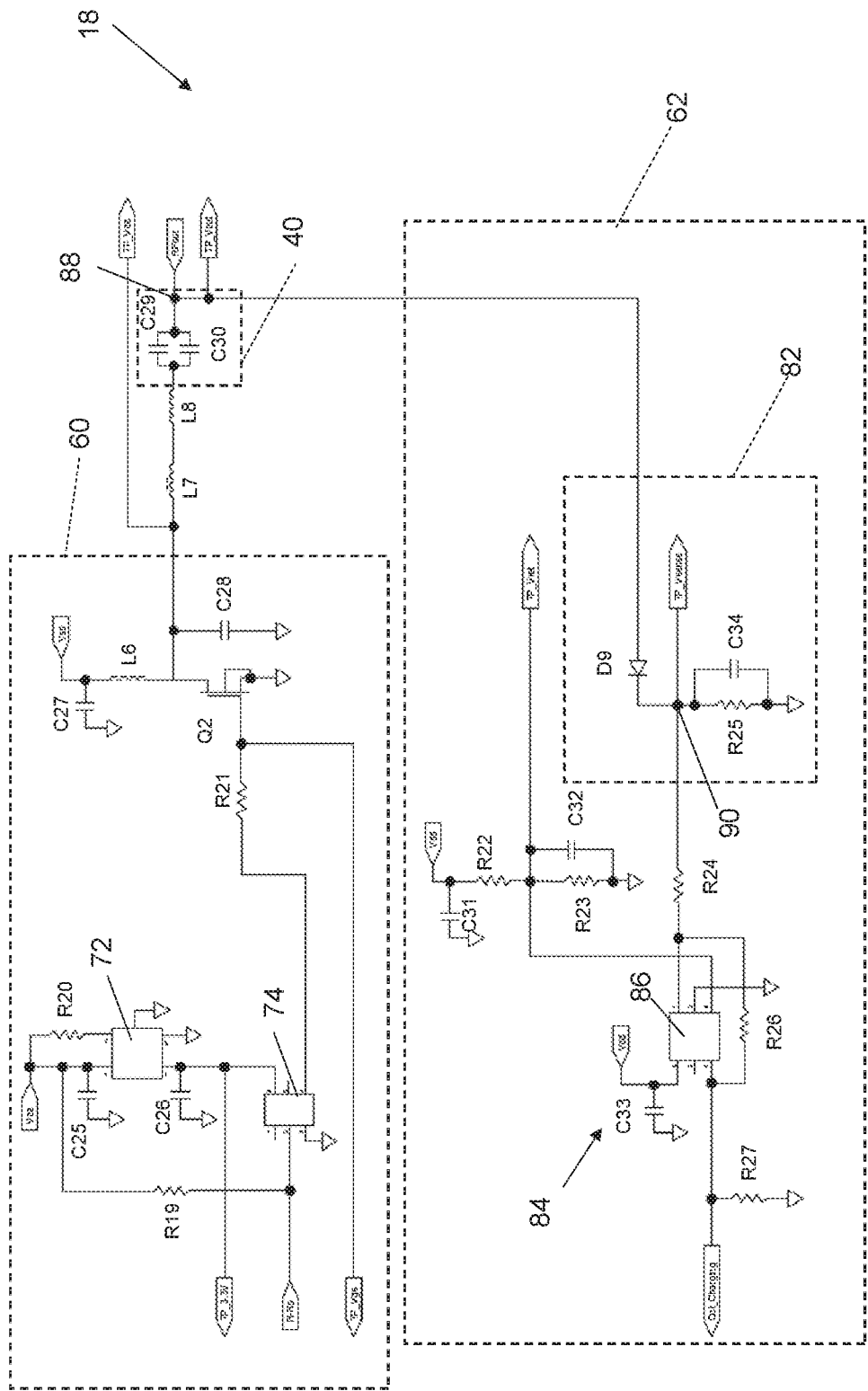

FIGS. 11 and 12, illustrate alternate embodiments of the transmitter module circuit 18. In particular, FIGS. 11 and 12 illustrate alternate embodiments of the electrical power sub-circuit 60. As shown, the electrical power sub-circuit 60 of FIGS. 11 and 12 comprise a field effect transistor $Q_1$ (FIG. 11) and $Q_2$ (FIG. 12). In an embodiment, the electrical power sub-circuit 60 of FIGS. 11 and 12 are configured to drive the transmitter antenna 20 to allow for wireless power transfer. In an embodiment, as shown in FIG. 11, the electrical power sub-circuit 60 comprises the field effect transistor (FET) $Q_1$ that is turned on and off by a control signal from the master control unit 44 or other signal generator, such as a signal generator that resides within the transmitter host device 22 to create the necessary input to control (FET) $Q_1$ and the wireless electrical power transfer. In an embodiment as illustrated in FIG. 11, the electrical power sub-circuit 60 further comprises resistor $R_{11}$, capacitors $C_{11}$, $C_{18}$ and inductors $L_3$-$L_5$.

In an embodiment, as shown in FIG. 12, the field effect transistor (FET) $Q_2$ is electrically connected to power amplifier 60 comprising resistors $R_{19}$-$R_{21}$, inductor $L_6$, and capacitors $C_{25}$-$C_{28}$, and integrated circuits 72 and 74 to modify a direct current (DC) voltage input to an alternating current (AC) amplified voltage signal that drives the transmitter antenna 20 to enable wireless electrical power transfer.

In addition to the electrical power sub-circuit 60, the embodiments of the transmitter module circuit 18 shown in FIGS. 11 and 12 further illustrate various embodiments of the receiver module sensing sub-circuit 42. As shown in FIG. 11, the receiver sensing sub-circuit 42 comprises an operational amplifier 76 comprising capacitors $C_{21}$-$C_{23}$, resistors $R_{12}$-$R_{17}$ and diode $D_8$. As shown, the change in electrical impedance is detected at node 78 which resides between the transmitter antenna 20 and the impedance matching circuit 40 comprising capacitors $C_{19}$ and $C_{20}$. The electrical impedance is then converted into an electrical current signal at node 80 by diode $D_7$, resistor Ria, and capacitor $C_{24}$. The electrical current signal is received by the operational amplifier 76 which is configured to amplify the sense signal received at node 80. In an embodiment, the operational amplifier 76 can also be configured to serve as a comparator in which an envelope detector voltage is compared against a set threshold to determine whether the receiver is present and output a digital signal (i.e., a "LOW" (binary 0) or "HIGH" (binary 1) signal) to the master control unit 44.

The amplified signal is then received by the master control unit 44. In an embodiment, amplifying the sense signal increases the resolution of detection thereby increasing the accuracy of the detecting for the presence of the receiver module 14. In yet another embodiment illustrated in FIG. 12, the receiver sensing sub-circuit 42 comprises an electrical impedance signal conversion sub-circuit 82 and sense control sub-circuit 84. In an embodiment, the electrical impedance signal conversion sub-circuit 82 comprises diode $D_9$ and resistor $R_{25}$ which is electrically connected in parallel to capacitor $C_{34}$. The sense control sub-circuit 84 comprises integrated circuit 86, resistors $R_{22}$-$R_{27}$, and capacitors $C_{31}$-$C_{33}$. In an embodiment, the electrical impedance at node 88 is converted to an electrical current signal at node 90 by diode $D_9$, resistor $R_{25}$, and capacitor $C_{34}$. The electrical current signal is received by integrated circuit 86 within the sense control sub-circuit 84. In an embodiment, the integrated circuit 86 is configured to convert the electrical current signal into an electrical data signal that sent to the master control unit 44 to notify the presence of the receiver module 14.

Figure 13:
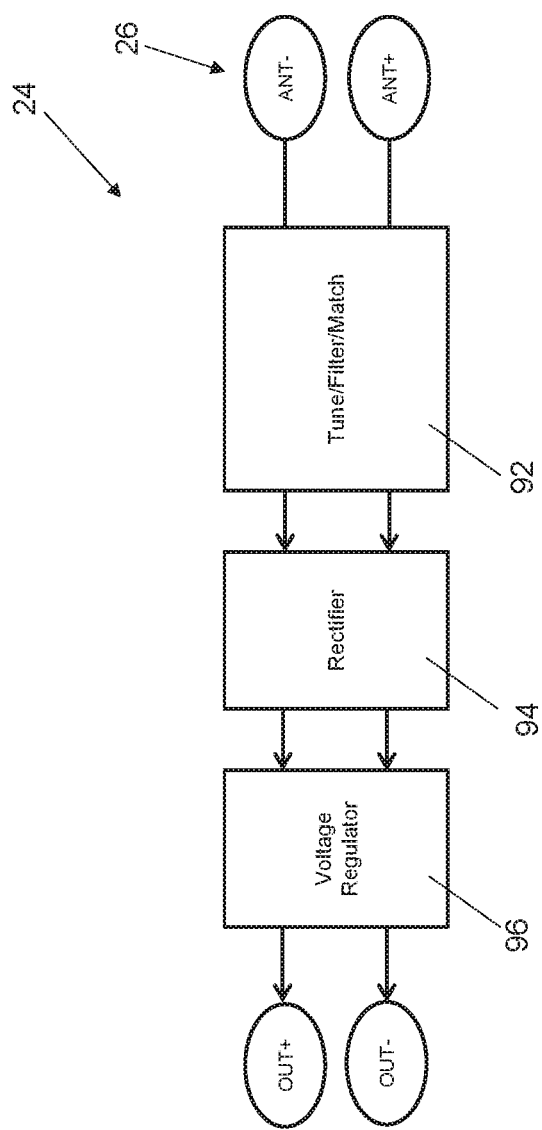
FIG. 13 illustrates a block diagram of an embodiment of the receiver module of the wireless connector system of the present application.

FIG. 13 illustrates a block diagram of an embodiment of the receiver module circuit 24 that resides within the receiver module 14 of the present invention. The receiver module circuit 24 is configured to receive electrical power transmitted wirelessly via near field magnetic coupling from the transmitter antenna 20 of the transmitter module 12. As illustrated in FIG. 13, the receiver module circuit 24 comprises the receiver antenna 26, a receiver impedance matching sub-circuit 92, a rectifier 94, and a voltage regulator 96. As shown, the receiver antenna 26 is electrically connected to the receiver impedance matching circuit 92 that is electrically connected to the rectifier 94 and the voltage regulator 96. In an embodiment, the receiver impedance matching circuit 92 is configured to adjust the electrical impedance of the receiver module 14 to match the electrical impedance of the transmitter module 12. The rectifier 94 is configured to modify the received electrical power from an alternating current electrical power to a direct current electrical power. The voltage regulator 96 is configured to adjust the amplitude of the electrical voltage of the wirelessly received electrical power.

Figure 14:
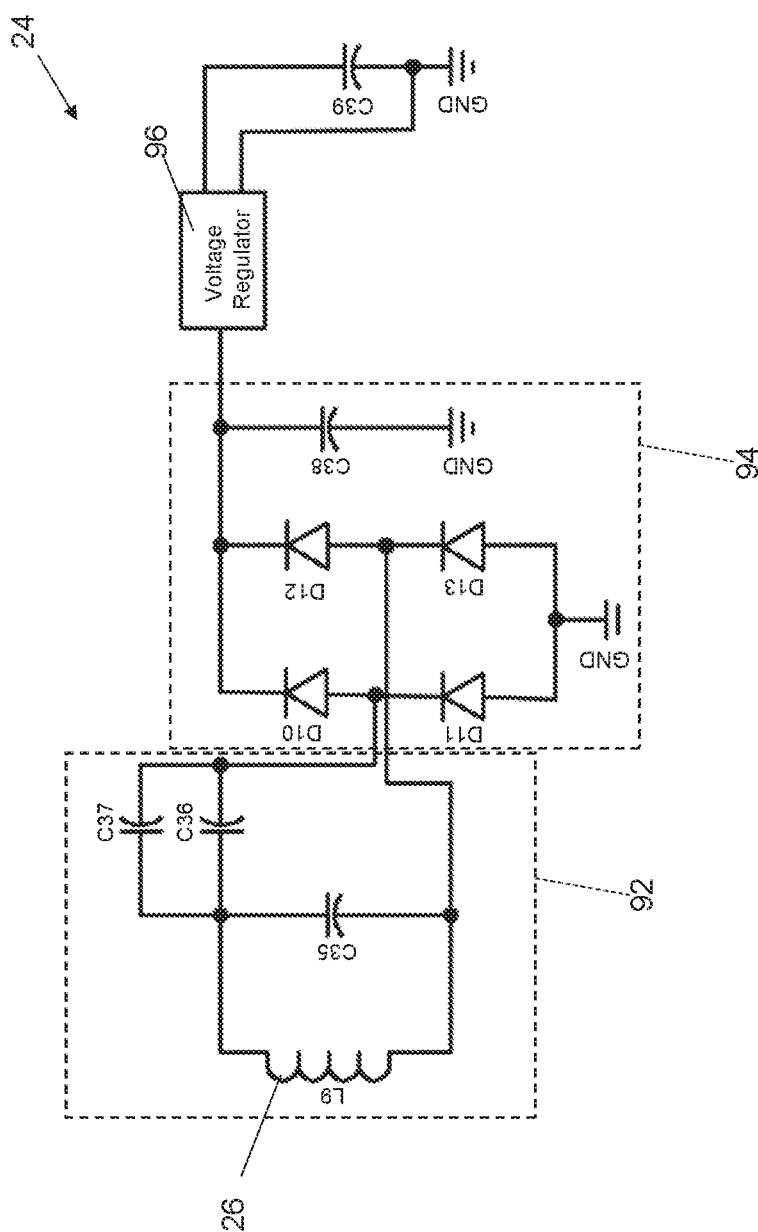
FIG. 14 illustrates an electrical schematic diagram of an embodiment of the receiver circuit within the receiver module.

FIG. 14 is an electrical schematic diagram of the embodiment of the receiver module circuit 24 shown in FIG. 13. As shown, the receiver antenna 26 comprising inductor $L_9$ is electrically connected to the impedance matching sub-circuit 92 comprising capacitors $C_{35}$-$C_{37}$. The impedance matching sub-circuit 92 is electrically connected to the rectifier 94 that comprises diodes $D_{10}$-$D_{13}$ and the voltage regulator 96 comprising a low dropout linear voltage regulator.

Figure 15:
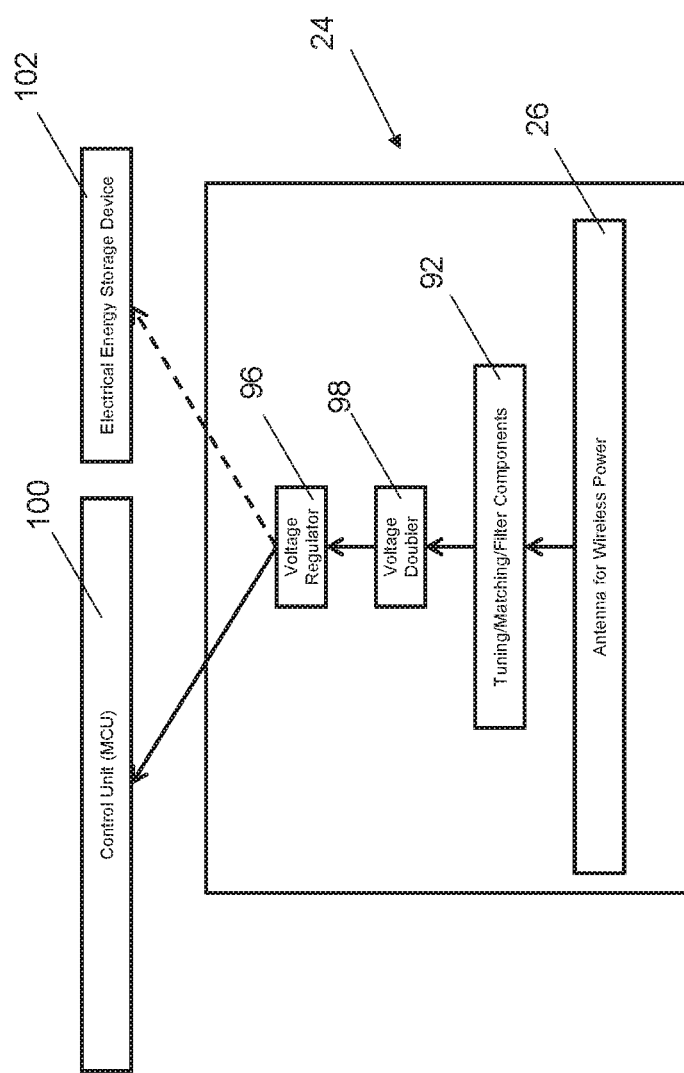
FIG. 15 is an electrical block diagram of an embodiment of the receiver module.

FIG. 15 is a block diagram that illustrates an alternate embodiment of the receiver module circuit 24 within the receiver module 14 of the present application. As shown the receiver module circuit 14 comprises the receiver antenna 26, the electrical impedance matching sub-circuit 92, a voltage doubler sub-circuit 98, the voltage regulator 96 and a receiver master control unit 100. In an embodiment, the receiver antenna 26 is electrically connected to the electrical impedance matching circuit 92 which is configured to dynamically adjust and match the electrical impedance of the receiver antenna 26 to a characteristic impedance of the power generator or the load at a driving frequency of the transmitter antenna 20. In the embodiment, the impedance matching circuit 92 is electrically connected to the voltage doubler sub-circuit 98 which is designed to rectify the wirelessly received electrical power from an alternating current electrical power to a direct current electrical power. The voltage doubler circuit 98 is also configured to increase, i.e., double, the voltage of the wirelessly received electrical power. As further shown in the embodiment, the voltage doubler sub-circuit 98 is electrically connected to the voltage regulator 96 which is designed to further adjust the amplitude of the voltage of the wirelessly received electrical power. The voltage regulator 96 is electrically connected to the receiver master control unit 100. In an embodiment, the receiver master control unit 100 is configured to operate the receiver module circuit 24 within the receiver module 14. In an embodiment, the electrical power wirelessly received from the transmitter module 12 and modified by the receiver module circuit 24 is used to power the host device and/or may be used to electrically charge an electrical storage device 102, such as an electrochemical cell or capacitor.

Figure 16:
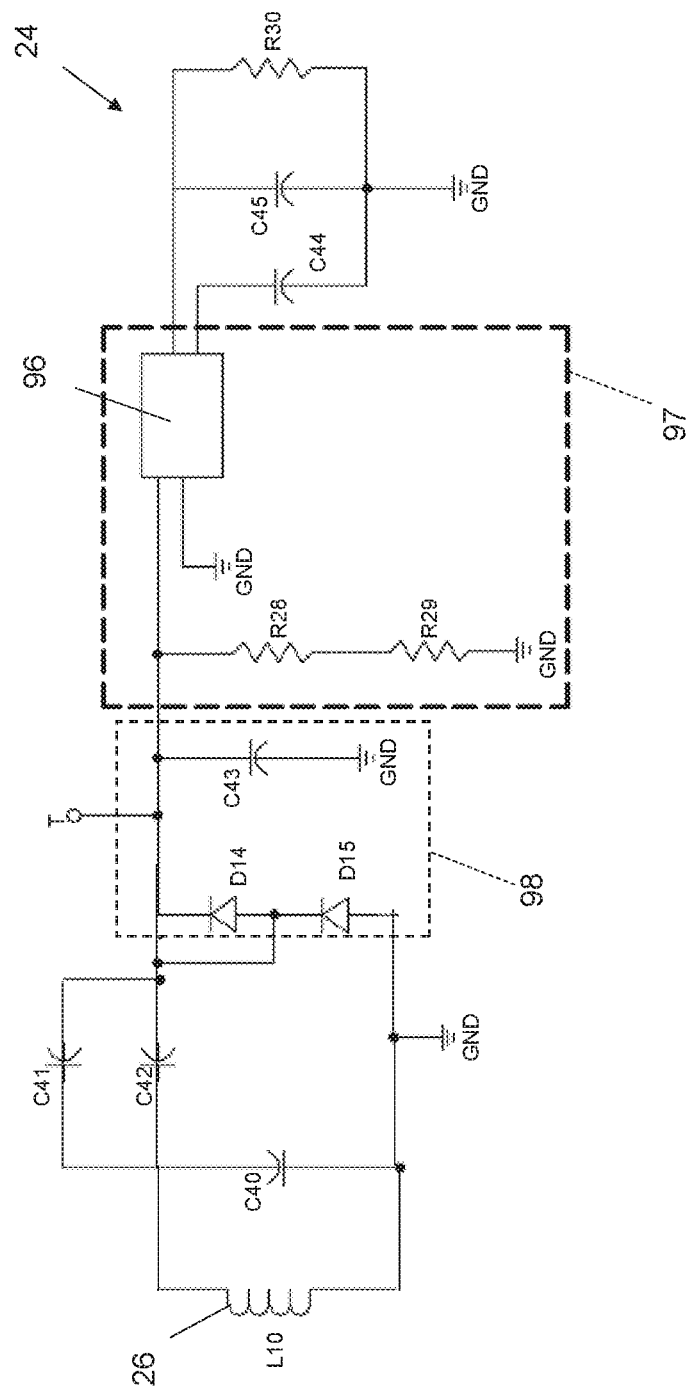
FIG. 16 illustrates an electrical schematic diagram of an embodiment of the receiver circuit within the receiver module.

FIG. 16 illustrates an electrical schematic diagram of the receiver module circuit 24 shown in FIG. 15. As shown the receiver antenna 26 which comprises inductor $L_{10}$, is electrically connected to the electrical impedance matching sub-circuit 92 which comprises at least one capacitor. As illustrated, the electrical impedance matching sub-circuit 92 comprises capacitors $C_{40}$-$C_{42}$. As further illustrated in FIG. 16, the electrical impedance matching circuit 92 is electrically connected to the voltage doubler sub-circuit 98 which comprises diodes $D_{14}$, $D_{15}$ and capacitor $C_{43}$. Incorporation of the voltage doubler sub-circuit 98 within the receiver module circuit 24 rectifies the wirelessly received electrical power and increases the amount of electrical power that can be transmitted across the separation distance 16 between the transmitter and receiver modules 12, 14. In addition, the voltage regulator sub-circuit 97 which comprises voltage regulator 96 is electrically connected to resistors $R_{28}$-$R_{30}$ and capacitors $C_{44}$ and Cos is electrically connected to the voltage doubler sub-circuit 98.

In an embodiment, the voltage doubler sub-circuit 98 allows for increased system efficiency due to a decrease in the electrical impedance experienced by the receiver module circuit 24. Experimental results indicate that incorporation of the voltage doubler sub-circuit 98 within the receiver module circuit 24 decreases the electrical impedance of the circuit 24 from about 301Ω to about 31Ω under a no load condition and decreases the electrical impedance from about 154Ω to about 4.9Ω under full load conditions, a decrease in electrical impedance by as much as 97 percent. Since the voltage doubler sub-circuit 98 significantly reduces the electrical impedance of the receiver module circuit 24, incorporation of the voltage doubler sub-circuit 98 within the receiver module circuit 24 thus provides for the transmission of a greater amount of electrical power across a module separation distance 16 at a given frequency. Furthermore, the voltage doubler sub-circuit 98 allows for decreased component sizes and increased system performance. Moreover, the voltage doubler sub-circuit 98 allows for the operation of the system 10, specifically, wireless transfer of electrical energy and data, across a wider module separation distance 16 in comparison to other rectifying topologies (e.g., a full wave rectifier). For example, the receiver module 14 of the present invention configured with the voltage doubler sub-circuit 98 enables wireless transfer of electrical energy and/or data across a module separation distance 16 from about 0.5 mm to about 5 mm. In comparison, a receiver module that is not configured with the voltage doubler sub-circuit 98 allows for the transfer of electrical energy and/or data across a module separation distance 16 from about 0.5 mm to about 2 mm. The voltage doubler sub-circuit 98 thus enables an increase of the module separation distance 16 by about 100 percent or about double the module separation distance 16. Furthermore, at closer separation distances, the electrical impedance of the gate driver or FET power stage is reduced allowing for increased wireless electrical power delivery.

Figure 17:
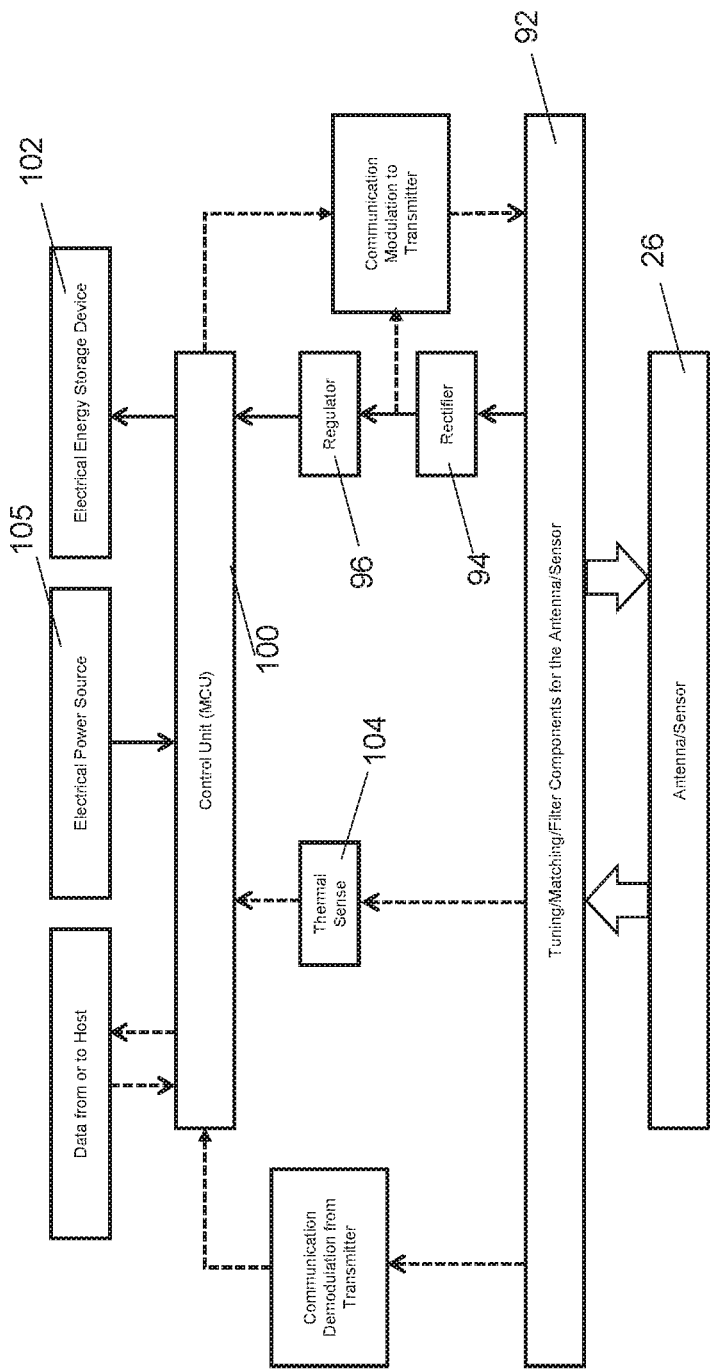
FIG. 17 is an electrical block diagram of an embodiment of the receiver module.

FIG. 17 illustrates a block diagram of an embodiment of the receiver module circuit 24 of the present application. As shown, in addition to the receiver master control unit 100, the receiver antenna 26, the rectifier 94 and voltage regulator 96, the receiver module circuit 24 may be configured with a thermal sense sub-circuit 104. In an embodiment, the thermal sense sub-circuit 104 is configured to monitor the temperature within the receiver module 14. In an embodiment, if the receiver master control unit 100 through the thermal sense sub-circuit 104 detects that the temperature within the receiver module increases from about 20° C. to about 50° C., the receiver master control unit 100 prevents the operation of the receiver module 14. In addition, the receiver module 14 may be configured to receive and transmit data to and from the transmitter module 12. In an embodiment, the receiver module 14 may be configured to modulate and demodulate data from the transmitter module 12 to enable communication therebetween. In an embodiment, the wireless connector system 10 of the present application may be configured for in-band communication, such as in-band amplitude, phase, and/or frequency shift keying communication. In addition, the wireless connector system 10 of the present application may be configured for out of band communication. In band communication is based on the transfer of information/data across a wireless power signal. The wireless power signal is the carrier frequency, and the different methods (amplitude, frequency, and phase) modulate this carrier frequency to deliver the data. Out of band communication utilizes an external signal that is separate from the wireless power signal to deliver data/communication.

FIGS. 18A-18D illustrate embodiments of impedance matching sub-circuits 40, 92 which may be utilized within the receiver module circuit 24 and/or the transmitter module circuit 18. As shown in the embodiment of FIG. 18A, the impedance matching circuit 40, 92 may comprise two capacitors $C_{46}$ and $C_{48}$ connected in electrical parallel and a shunt capacitor $C_{47}$ electrically connected between capacitors $C_{46}$ and $C_{48}$. FIG. 18B illustrates an embodiment in which a shunt capacitor $C_{50}$ is electrically connected in parallel between capacitors $C_{49}$ and $C_{51}$. FIG. 18C illustrates an embodiment in which the electrical impedance matching circuit may comprise at least one capacitor $C_{52}$ electrically connected to the positive side of the receiving or transmitter antenna. FIG. 18D illustrates an embodiment in which two capacitors $C_{53}$ and $C_{54}$ are each electrically connected to the positive and negative terminals, respectively of the receiving or transmitter antenna.

In an embodiment, incorporating a shunt capacitor such as those shown in FIG. 18A or 18B enables electrical power to be transmitted across a greater separation distance 16. In an embodiment, the shunt capacitor is used to boost the received voltage into the receiver rectifier 34 in comparison to a series only tuning topology. The shunt capacitor allows the resistance of the antenna to be modified in order to increase the amount of electrical power that can be transferred at a certain distance as well as increase the maximum operating distance of the system. In an embodiment, incorporating the shunt capacitor, as shown in FIG. 18A or 18B, within the electrical impedance matching sub-circuit 92 of the receiver module circuit 24 enables electrical power to be wirelessly transmitted over a 2 mm separation distance. The inventors have discovered that without the use of a shunt capacitor within the electrical impedance matching sub-circuit 92 of the receiver module circuit 24 of the receiver module 14, wireless transmission of the electrical power spans a shorter separation distance. For example, the inventors have discovered that the shunt capacitor enables electrical power to be wirelessly transmitted over a separation distance 16 that is about 50 percent longer in comparison to a receiver module that does not comprise a shunt capacitor for the same amount of electrical power transmitted.

FIGS. 19-22 illustrate embodiments of the wireless connector system 10 comprising the transmitter module 12 and the receiver module 14. As illustrated, the transmitter module 12 comprises a transmitter module housing 106 that encases the transmitter module circuit 18 and transmitter antenna 20 therewithin. The receiver module 14 comprises a receiver module housing 108 that encases the receiver module circuit 24 and receiver antenna 26 therewithin. In an embodiment, either or both the transmitter module housing 106 and the receiver module housing 108 are hermetically sealed. In an embodiment, at least one of the transmitter module housing 106 and the receiver module housing 108 may be composed of a polymeric material, a metal, a ceramic material or combinations thereof. In addition, either or both the transmitter module 12 and receiver module 14 may be immersed within an encapsulate material (not shown). This encapsulate material helps protect the circuitry of the modules 12, 14 and helps ensure a hermetic seal. It is noted that during operation of the wireless connector system 10, the transmitter and receiver modules 12, 14 are positioned such that the module separation distance 16 spans between the modules 12, 14. In an embodiment, the module separation distance 16 may range from about 0.1 mm to about 5 mm. In an embodiment, the module separation distance or gap 16 between the transmitter and receiver modules 12, 14 during operation of the system ranges from about 0.1 mm to about 2 mm. In an embodiment, the wireless connector system 10 of the present invention is configured to wirelessly transmit between about 1 mW to about 200 mW at a frequency greater than 5 MHz. In an embodiment, the wireless connector system 10 is configured to wirelessly transmit between about 1 mW to about 200 mW at a frequency that ranges from about 1 MHz to about 50 MHz between the transmitter and receiver modules 12, 14. In an embodiment, the wireless connector system 10 may operate at any frequency or frequencies, which may include, but is not limited to, 100 kHz, 6.78 MHz, 10 MHz, 13.56 MHz, 27.12 MHz, 433 MHz, 915 MHz, 1.8 GHz, 2.4 GHz, 60 GHz, and 5.7 GHz. In addition, such frequencies may include licensed frequency bands.

In an embodiment both the transmitter and receiver modules 12, 14 are of a compact size. In an embodiment, the transmitter module 12 has a length 110 that extends from a transmitter module proximal end 112 to a transmitter module distal end 114. The transmitter module 12 has a transmitter module width 116 oriented about perpendicular to the length 110. In an embodiment, the receiver module 14 has a receiver module length 120 that extends from a receiver module proximal end 122 to a receiver module distal end 124. The receiver module 14 comprises a receiver module width 126 oriented about perpendicular to the length 120. As illustrated in FIG. 19, in an embodiment, the transmitter module 12 comprises a transmitter module height 118 that extends about perpendicular to transmitter module length 110. In an embodiment, the receiver module 14 comprises a receiver module height 128 that extends about perpendicular to the receiver module length 120.

Figure 21:
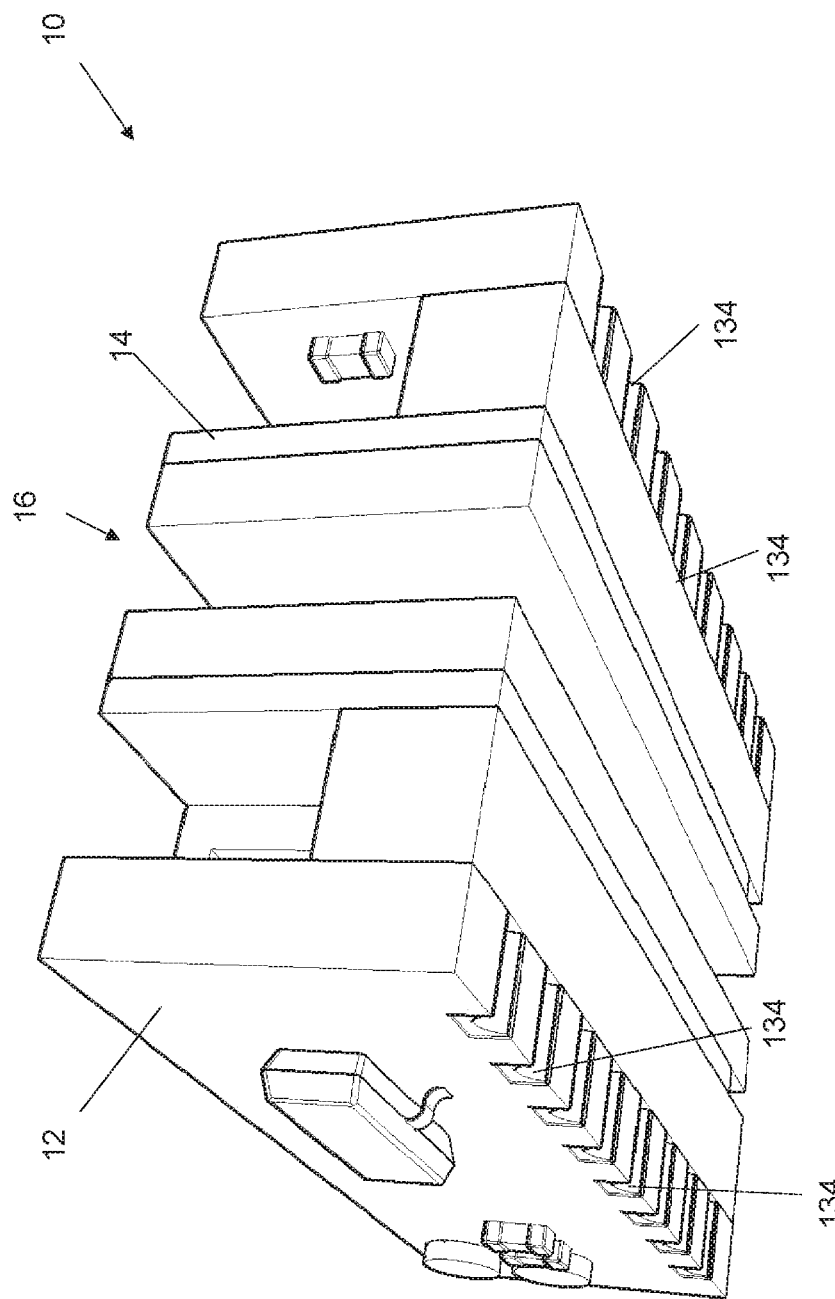
Figure 22:
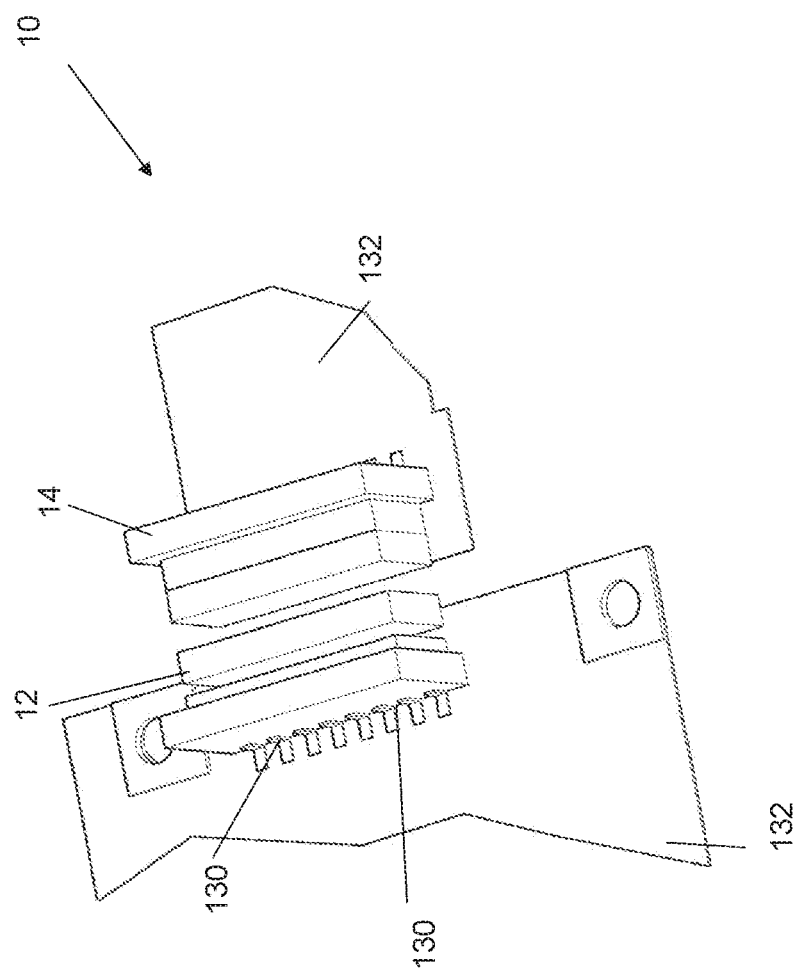
FIGS. 22-23 illustrate embodiments of the transmitter and receiver modules of the wireless connector of the present application electrically connected to a host device.

In an embodiment, either or both the transmitter and receiver modules 12, 14 are configured to be surface mounted. In an embodiment, as shown in FIG. 22, a plurality of brackets 130 mechanically support and electrically connect the modules 12, 14 to a circuit board 132 of the respective host device. In addition, as illustrated in FIG. 21, each of the modules 12, 14 may comprise a plurality of castellations 134 that reside within an exterior surface of the transmitter module housing 106 and/or the receiver module housing 108. These castellations 134 provide a space within which a surface mount (not shown) may be positioned therewithin to mechanically secure the modules 12, 14 to a surface and provide an electrical connection to the host device.

Figure 23:
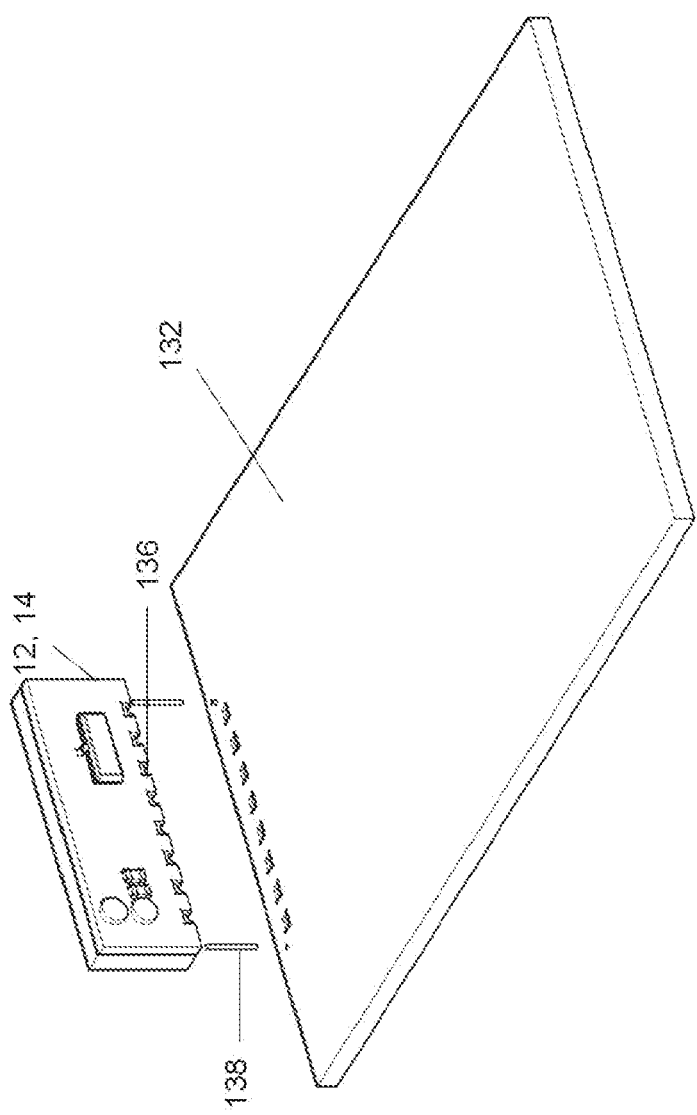

In an embodiment, as shown in FIG. 23, at least one of the transmitter and receiver modules 12, 14 comprises a plurality of metal pads 136 positioned at an edge of an exterior surface of the module housing 106, 108. These metal pads 136 are designed to provide electrical contact of the module 12, 14 to a circuit board 132 or host device 22, 28. Furthermore, the at least one of the transmitter and receiver modules 12, 14 may comprise at least one post 138 that outwardly extends from the exterior surface of the module housing 106, 108. These posts 138 mechanically support and secure the at least one transmitter module and receiver module 12, 14 to a circuit board 132 or a host device 22, 28. In addition, the modules 12, 14 may be electrically connected to circuit boards of their respective host devices through the use of welding, soldering, fasteners, such as pins, spring contacts, and the like.

Figure 24:
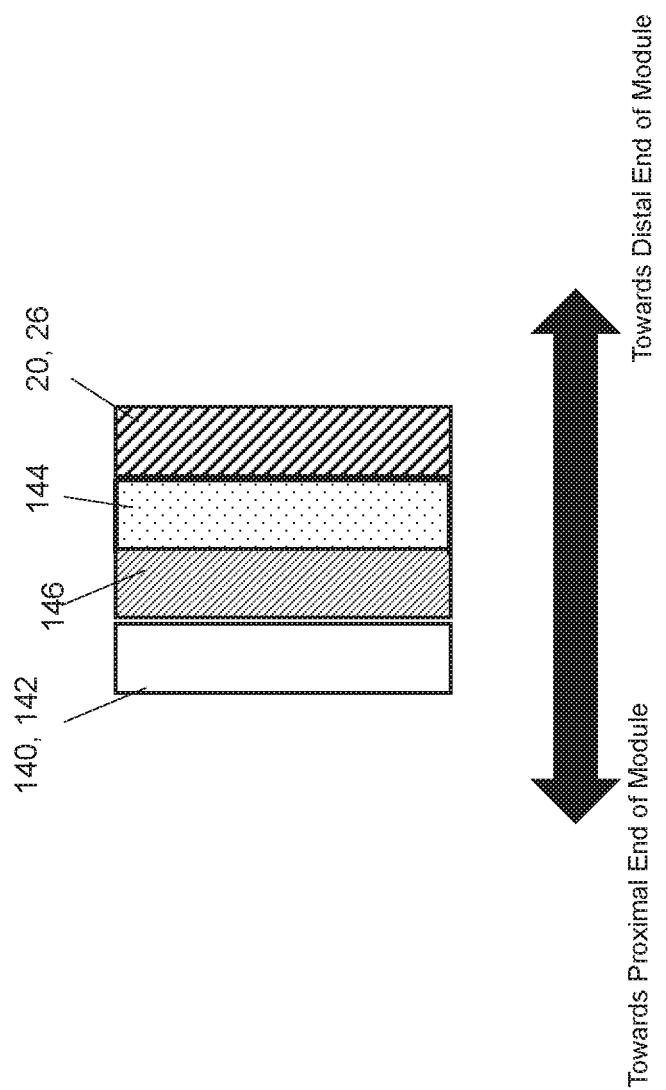
FIG. 24 shows an embodiment of the positioning of the antenna and transmitter and receiver circuit board relative to shielding and spacer materials within the transmitter and receiver module housings.

FIG. 24 illustrates an embodiment of the construction within the housing 106, 108 of the respective modules 12, 14. In an embodiment each of the modules 12, 14 is constructed with a respective transmitter or receiver antenna 20, 26, and a module circuit board residing within the housing 106, 108 of the transmitter or receiver module 12, 14. In an embodiment, a transmitter module circuit board 140 resides within the transmitter module housing 106 and a receiver module circuit board 142 resides within the receiver module housing 108. In an embodiment, the transmitter antenna 20 and receiver antenna 26 resides within the housing 106, 108 at the distal end of their respective modules 12, 14. In an embodiment, the transmitter module circuit board 140 and the receiver module circuit board 142 reside within their respective transmitter module and receiver module housing 106, 108 at the proximal end of their respective modules 12, 14. In an embodiment, the transmitter antenna 20 is electrically connected to the transmitter module circuit board 140 and the receiver antenna 26 is electrically connected to the receiver module circuit board 142 using a flex connector, a board to board connector, a pin and socket connector, a spring contact connector, a pogo pin connector, a through-hole pin solder connector, a soldered wire connection, or a combination thereof.

In an embodiment, at least one of the transmitter and receiver modules 12, 14 may be constructed having a spacer 144 composed of an electrically insulating, non-magnetic material positioned within the housing 106, 108 of the transmitter or receiver module 12, 14. In an embodiment, the at least one spacer 144 is positioned between the transmitter or receiver module circuit board 140, 142 and the transmitting or receiving antenna 20, 26, respectively within the housing 106, 108. In an embodiment, at least one shielding material 146 may be positioned within the housing 106, 108 of either or both the transmitter and receiver modules 12, 14. In an embodiment, the at least one shielding material 146 is positioned between the transmitter or receiver module circuit board 140, 142 and the transmitter or receiver antenna 20, 26, respectively within the housing 106, 108. In an embodiment, the at least one shielding material 146 may be positioned between the transmitter or receiver module circuit board 140, 142 and the at least one spacer 144. In an embodiment, the at least one shielding material 146 may be positioned between the at least one spacer 144 and the transmitter or receiver module antenna 20, 26. As illustrated in the example shown in FIG. 25, the transmitter or receiver antenna 20, 26 is positioned at the distal end of the respective modules 12, 14. A spacer 144 is positioned proximal of the antenna 20, 26, the shielding material 146 is positioned proximal of the spacer 144 and the transmitter or receiver module circuit board 140, 142 is positioned at the proximal end of the module 12, 14. In an embodiment, during operation of the wireless connector system 10 of the present invention, the respective antennas 20, 26 of the transmitter and receiver modules 12, 14 are positioned facing each other across the module separation distance 16. Table I below further illustrates the various sequences of positions within the housing 106, 108. It is noted that Position 1 is the proximal end 112, 122 of the module and Position 4 is the distal end 114, 124 of the module 12, 14, respectively. Position 2 is distal of Position 1 and Position 3 is distal of Position 2.

TABLE I

| Example | Position 1 | Position 2 | Position 3 | Position 4 |
|---|---|---|---|---|
| 1 | Circuit Board | Spacer | Spacer | Antenna |
| 2 | Circuit Board | Shield | Spacer | Antenna |
| 3 | Circuit Board | Shield | Shield | Antenna |
| 4 | Circuit Board | Spacer | Shield | Antenna |

In an embodiment, the circuit board may either be the transmitter module circuit board 140 or the receiver module circuit board 142, the antenna may either be the transmitter antenna 20 or the receiver antenna 26. The spacer 144 may comprise an electrically insulative material such as air, FR4, a polymeric material or a combination thereof. The shielding material 146 may comprise a ferrite material, a metal, or a combination thereof. It is noted that positioning the shielding material 146 closer to the transmitter or receiver antenna 20, 26, such as detailed in Examples 3 and 4, of Table I, provides an increase in electrical inductance that results in an improved mutual inductance between transmitter and receiver modules 12, 14.

Figure 25:
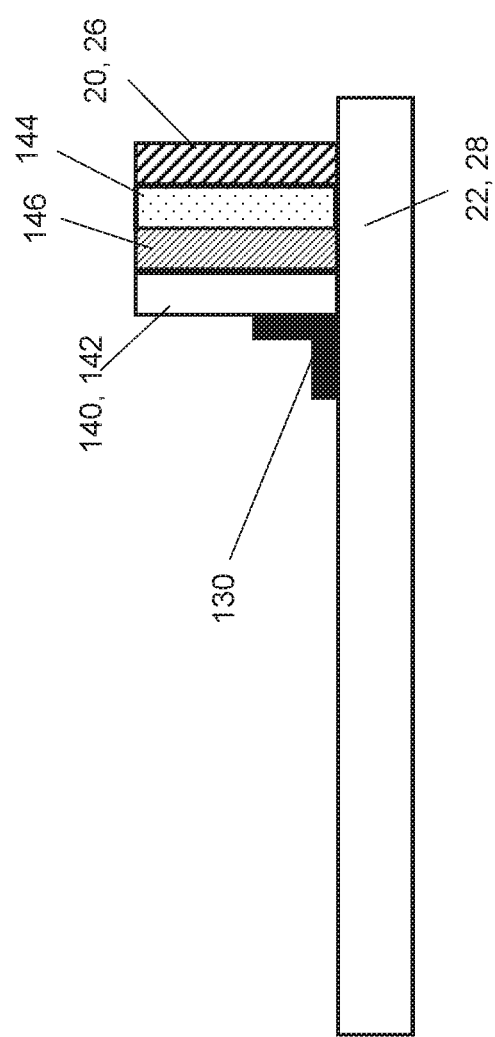
FIGS. 25 and 26 illustrate embodiments of electrically connecting the transmitter and receiver modules to a circuit board of a host device.
Figure 26:
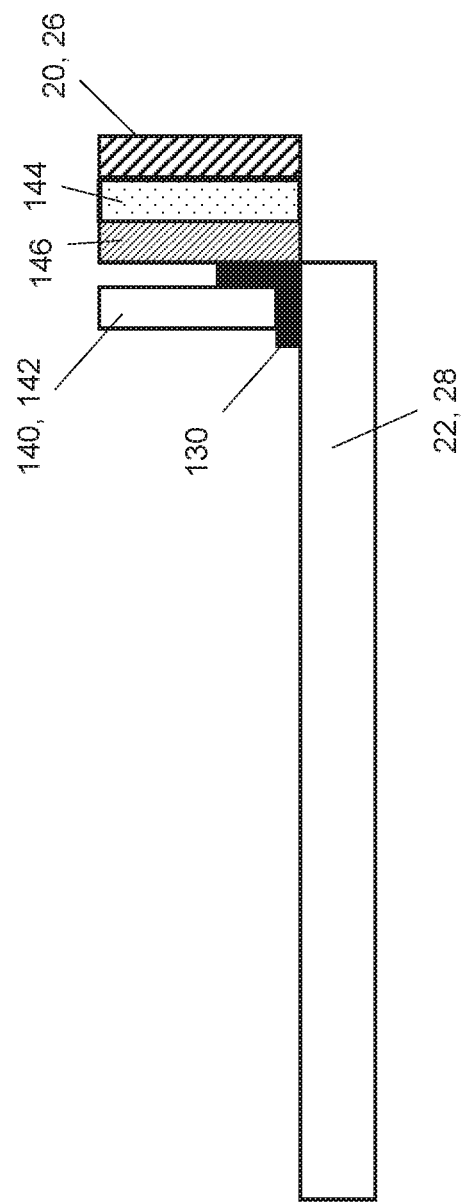

As further illustrated in FIG. 25, the electrically conductive bracket 130 electrically connects the circuit boards 140, 142 of the respective transmitter and receiver modules 12, 14 to the host device. As illustrated in the embodiments shown in FIGS. 25 and 26, the host device is a circuit board. FIG. 26 illustrates a further embodiment in which the electrically conductive bracket 130 is positioned between position 1 and position 2. As specifically illustrated in FIG. 26, the bracket 130 is positioned between the transmitter or receiver circuit board 140, 142 and the shielding material 146. Alternatively, the bracket 130 may be positioned between the transmitter or receiver circuit board 140, 142 and the spacer 144.

Figure 27:
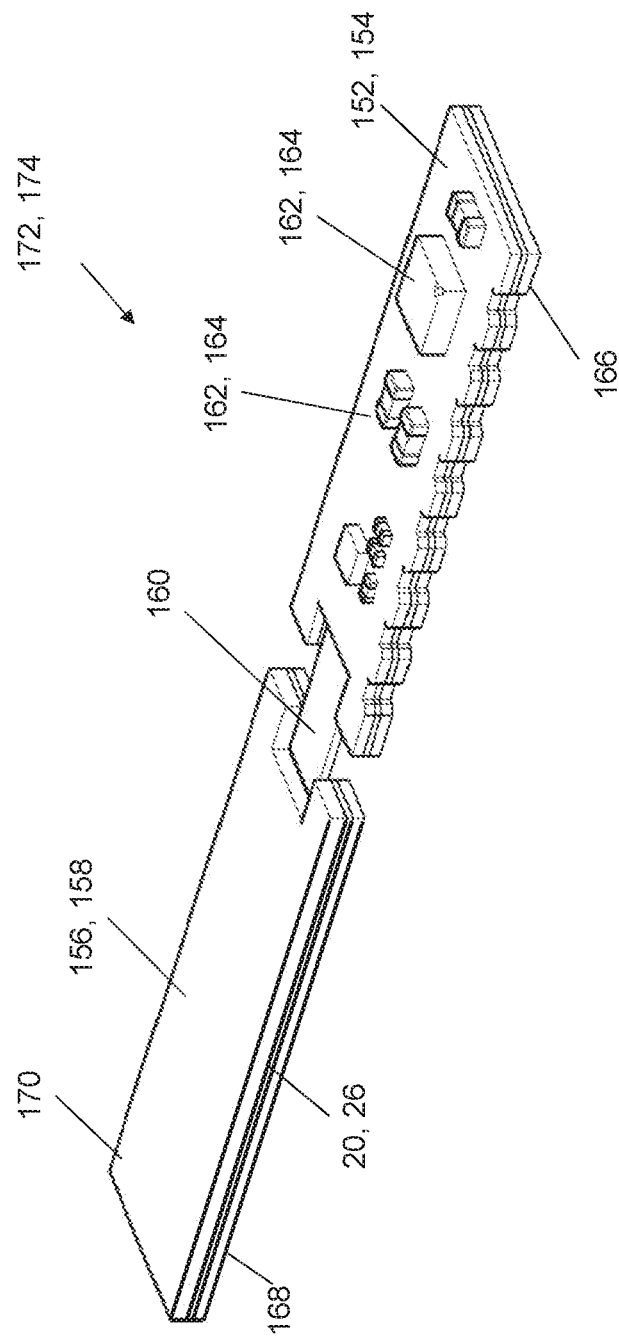
FIGS. 27-30 illustrate embodiments of alternative structures of the transmitter or receiver modules of the present invention.

FIGS. 27-34 illustrate an alternate embodiment of a transmitter module 148 and a receiver module 150 having a hybrid rigid flex printed circuit board construction. In this construction, a module power circuit board, of either a transmitter module power circuit board 152 or a receiver module power circuit board 154 is electrically connected to an antenna assembly of either a transmitter antenna assembly 156 or a receiver antenna assembly 158, respectively (FIG. 27). An electrical bridge or electrical connector 160 extends between and electrically connects the antenna assembly 156, 158 and the module power circuit board 152, 154. This construction can also be used to provide a connection between the transmitter module circuit board 140 and the transmitter antenna 20, and/or the receiver module circuit board 142 and the receiver antenna 26 by encapsulating one or more flexible printed circuit (FPC) layers that comprise the transmitter or receiver antenna 20, 26 inside one or more rigid (FR4) circuit board layers.

FIG. 27 illustrates an embodiment of the components that comprise the transmitter or receiver module 148, 150 having a hybrid rigid flex printed circuit board construction of the present invention. As shown, the module power circuit board of either the transmitter module power circuit board 152 or the receiver module power circuit board 154 is electrically connected to the antenna assembly of either the transmitter antenna assembly 156 or the receiver antenna assembly 158, respectively, by the electrical connector 160. In an embodiment, the electrical bridge or electrical connector 160 is flexible and is capable of bending. In an embodiment, the electrical bridge or electrical connector 160 comprises one or more sheets of copper, a circuit connector ribbon, flexible ribbon, an electrical flex connector, an electrically conductive ribbon, or combinations thereof.

In an embodiment, the transmitter module power circuit board 152 and the receiver module power circuit board 154 comprise a substrate 166 such as FR4 or printed circuit board that is substantially rigid and supports a variety of transmitter module power circuit board electrical components 162 or receiver module power circuit board electrical components 164. In an embodiment, these electrical components 162, 164 may be surface mounted to an exterior surface of the transmitter module power circuit board 152 and the receiver module power circuit board 154, respectively.

In an embodiment, the transmitter and receiver antenna assemblies 156, 158, comprises a substrate 168, such as a rigid printed circuit board or FR4 board that supports the transmitter or receiver antenna 20, 26. As illustrated in FIG. 27, the substrate 168 supports either the transmitter or receiver antenna 20, 26. A shielding material 170, such as a layer of ferrite material, is positioned over the transmitter or receiver antenna 20, 26. In an embodiment, the shielding material 170, such as a sheet of ferrite material may be laminated or adhered to the transmitter or receiver antenna 20, 26 with an adhesive.

Figure 28:
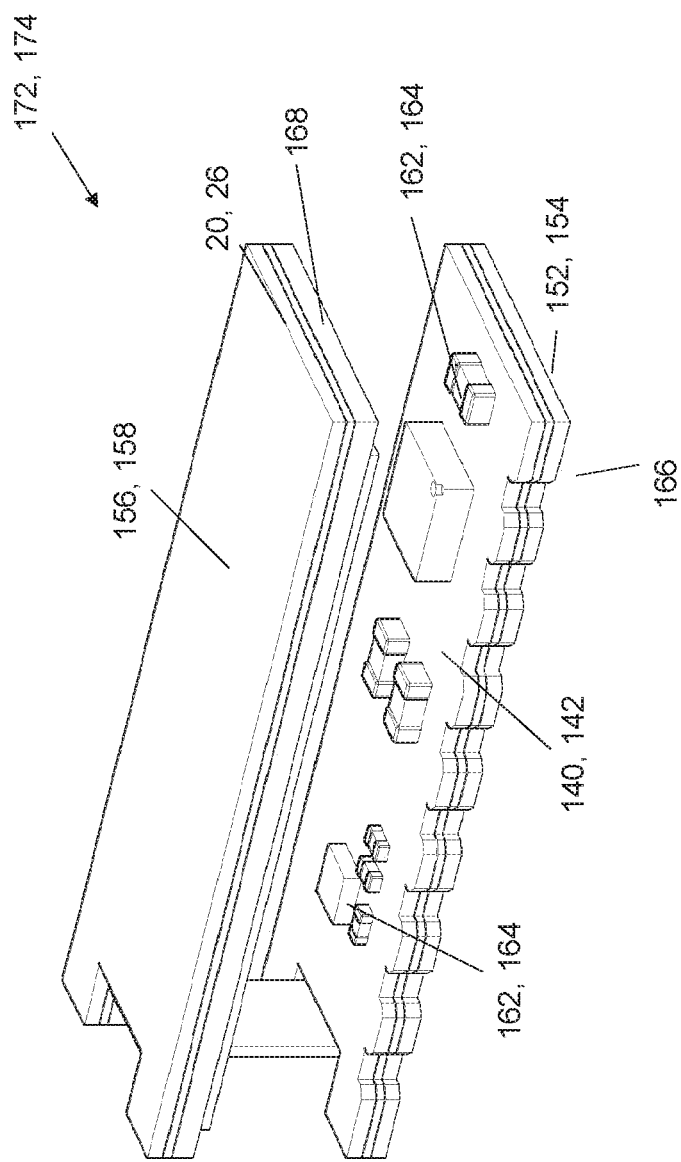
Figure 29:
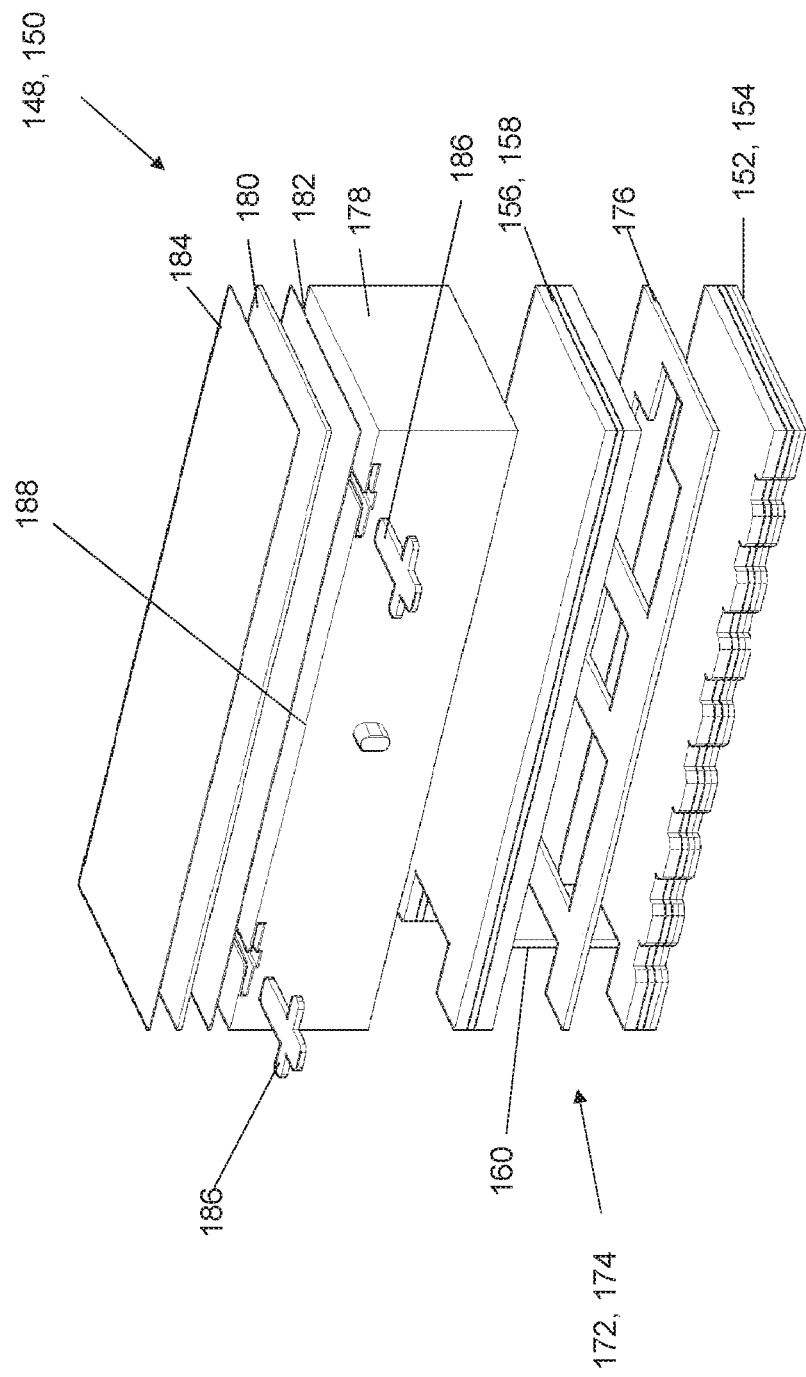

In an embodiment, as illustrated in FIG. 28, the antenna assembly 156, 158 is folded over the module power circuit board 152, 154, to form a transmitter module assembly 172 or a receiver module assembly 174, respectively. In an embodiment, as shown in FIG. 29, a second shielding material 176, such as a ferrite material, may be positioned between the antenna assembly 156, 158 and the module power circuit board 152, 154. This construction provides many benefits that include, but are not limited to:
  1. A continuous connection between the antenna assembly 156, 158 and the module power circuit board 162, 164. In an embodiment, the antenna assembly 156, 158 may be positioned such that conductive traces of the antenna 20, 26 directly connect to the module power circuit board 162, 164. This construction reduces the overall electrical impedance.
  2. The antenna assembly 156, 158 and module power circuit board 162, 164 comprise a single structure (i.e., the transmitter module assembly 172 or the receiver module assembly 174), thus increasing connection reliability and manufacturing yield, and reducing the number of discrete components, complexity and assembly cost.
3. The structure enables a more simplified manufacturing process that allows for large scale manufacture.
4. Testing is simplified as both, the antenna and the power board can be tested at the same time.

FIG. 29 illustrates an exploded view of an embodiment of the transmitter module 148 or the receiver module 150 of the present application comprising the receiver or transmitter module assembly 172, 174 respectively. As shown in the embodiment, the transmitter 148 and/or the receiver module 150 comprise a spacer or housing structure 178 that separates the transmitter or receiver antenna assembly 156, 158 from the transmitter or receiver module power circuit board 152, 154, respectively. Alternatively, the housing structure 178 may provide a space therewithin in which the transmitter or receiver module assembly 172, 174 is positioned.

In an embodiment, the housing structure 178 comprises an electrically insulative material and acts as a spacer that separates the transmitter or receiver module assembly 172, 174 from additional shielding material that may be positioned on an exterior surface of the housing structure 178. As shown in the embodiment illustrated in FIG. 29, a third and fourth shielding material 180, 182, such as a ferrite material, may be positioned on the exterior surface of the housing structure 178. In an embodiment a layer of a rigid circuit board material 184 may be positioned in contact with the third and fourth shielding materials 180, 182 to provide added structural support. In an embodiment, the transmitter module 148 or the receiver module 150 may comprise a retention fastener 186 and/or a locating post 188 that outwardly extend from the housing sidewall. In an embodiment, the retention fastener 186 and/or the locating post 188 are used to precisely position the module 148, 150 on the transmitter module or receiver module host device 22, 28, such as a printed circuit board. In an embodiment, the retention fastener 186 and/or the locating post 188 retain the transmitter module 12 and/or the receiver module 14 to the respective host device 22, 28. Furthermore, the retention fastener 186 and/or the locating post 188 may be electrically connected to the respective host device 22, 28.

Figure 30:
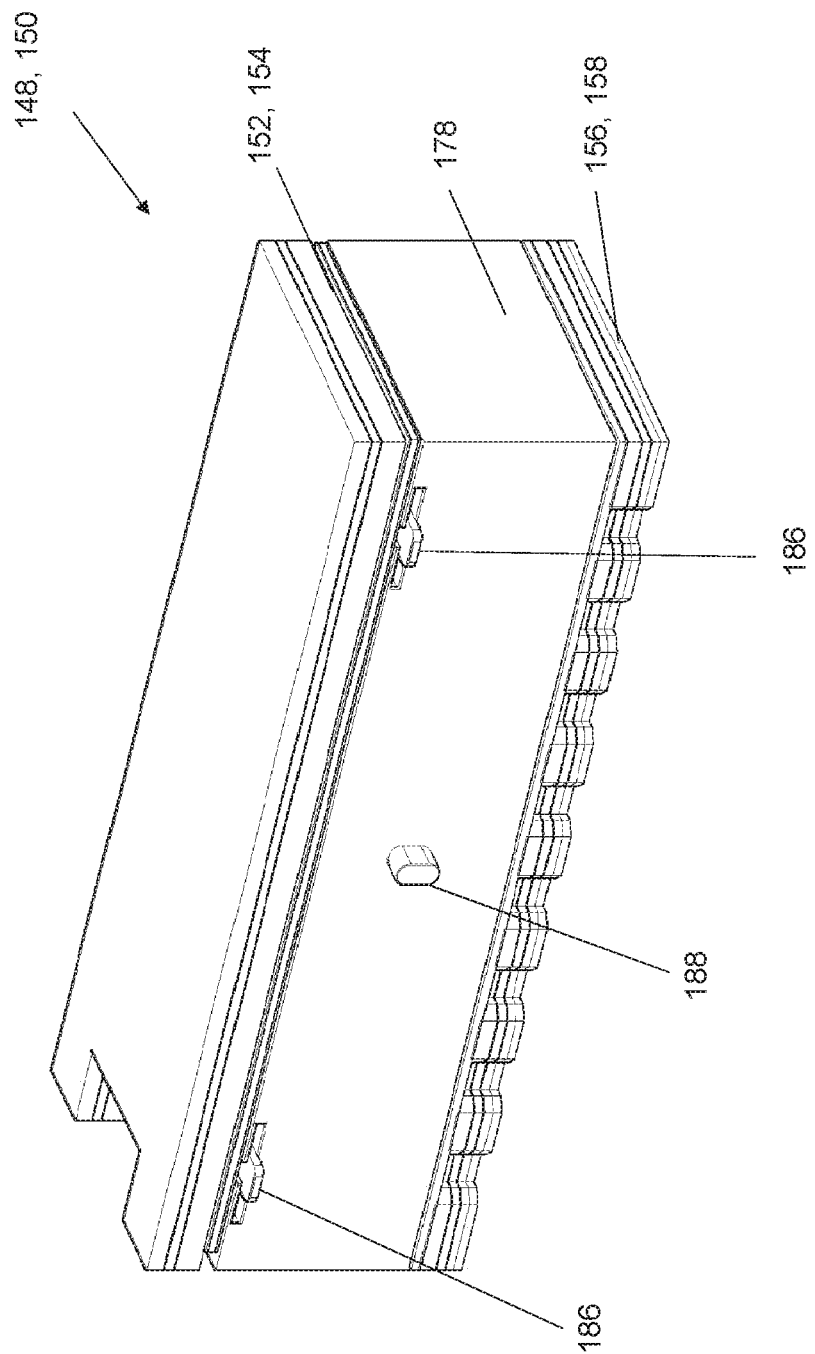

FIG. 30 illustrates an embodiment of an assembled transmitter or receiver module 148, 150 comprising two retention fasteners 186 and the locating post 188 that outwardly extend from the module housing structure 178. As shown, the housing structure 178 is positioned between the transmitter or receiver module power circuit board 152, 154 and the transmitter or receiver antenna assembly 156, 158. In this way, the retention fasteners 186 improve component retention that provides for balanced soldering and helps prevent potential component delamination during a solder reflow process. Furthermore, the retention fasteners 186 and the locating post 188 provide alignment guides for installation of the modules 148, 150.

Figure 30A:
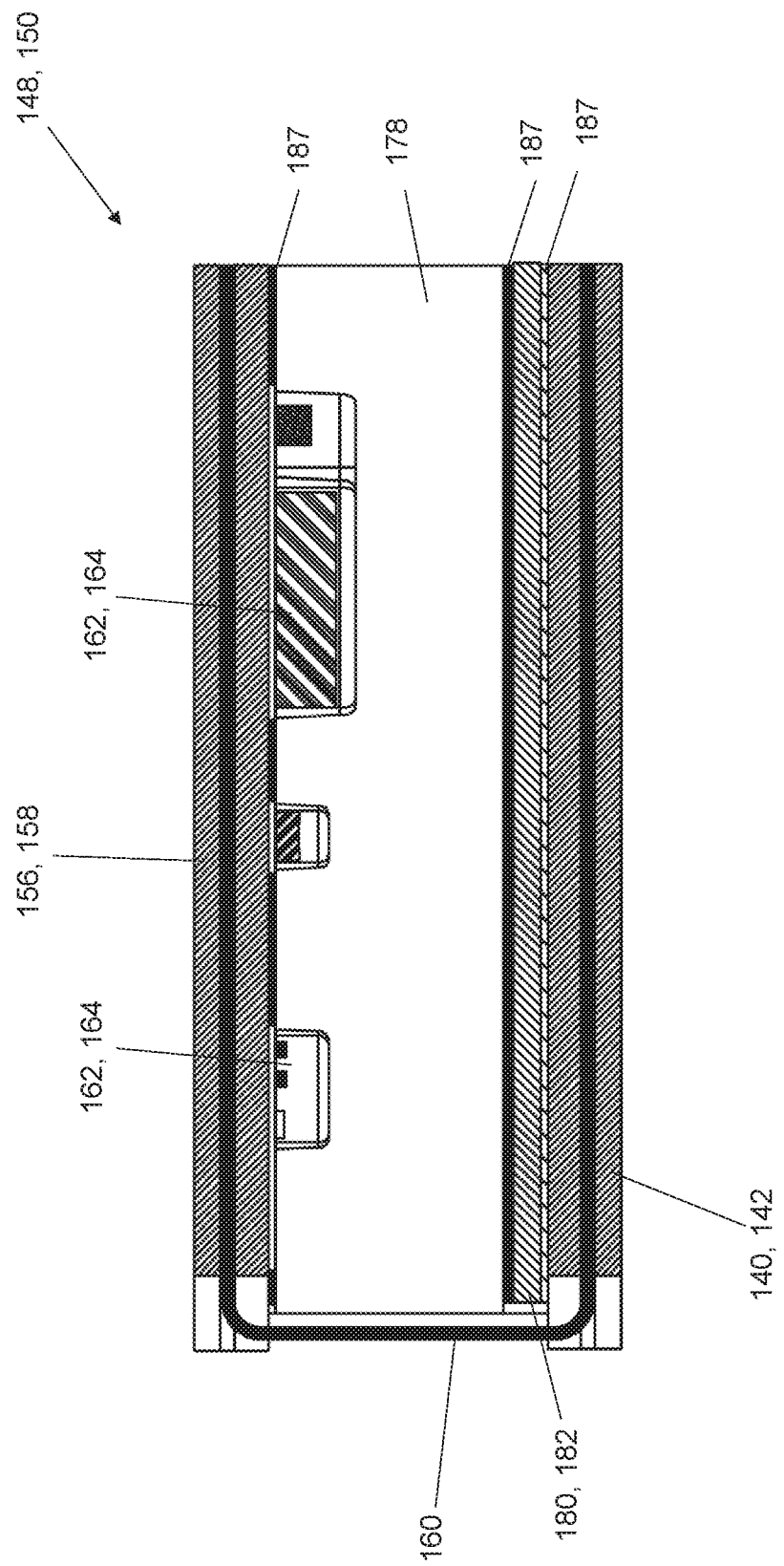
FIG. 30A is a cross-sectional view of the embodiment of the assembled transmitter module or receiver module shown in FIG. 30.
Figure 31:
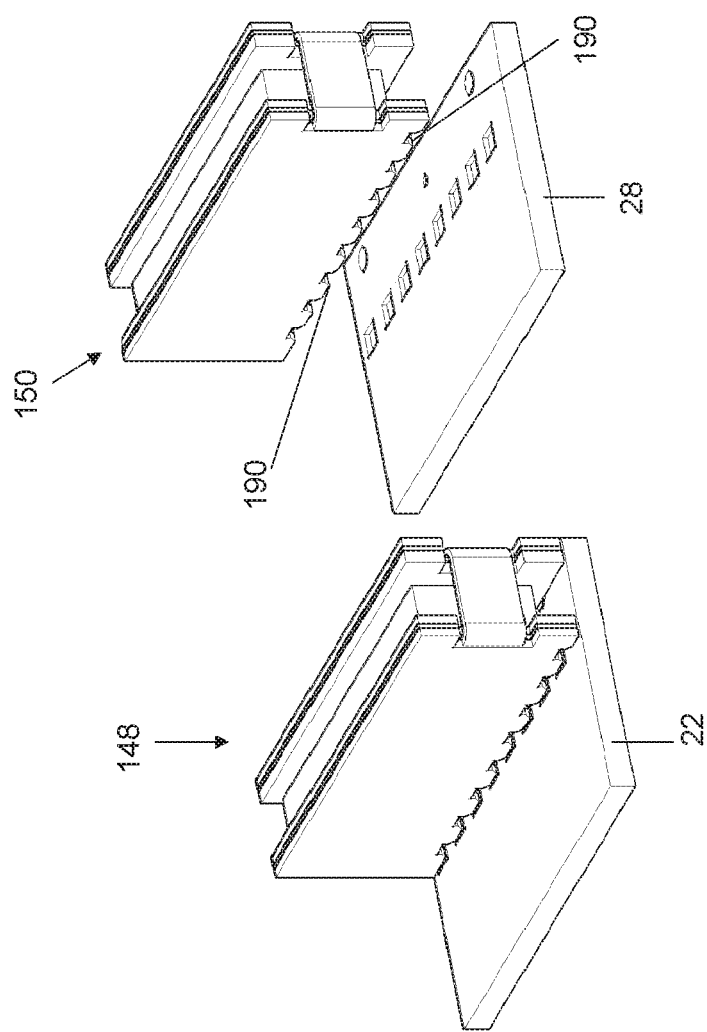
FIGS. 31-34 illustrate different embodiments of the transmitter or receiver module shown in FIGS. 27-30 mounted to a circuit board.
Figure 32:
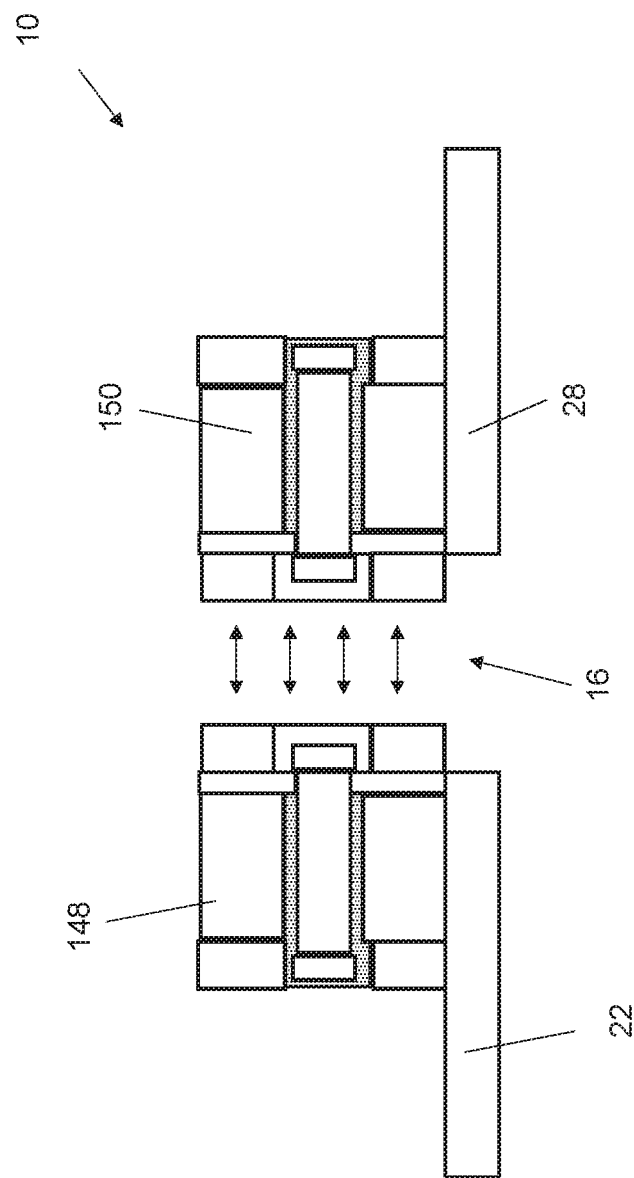
Figure 33:
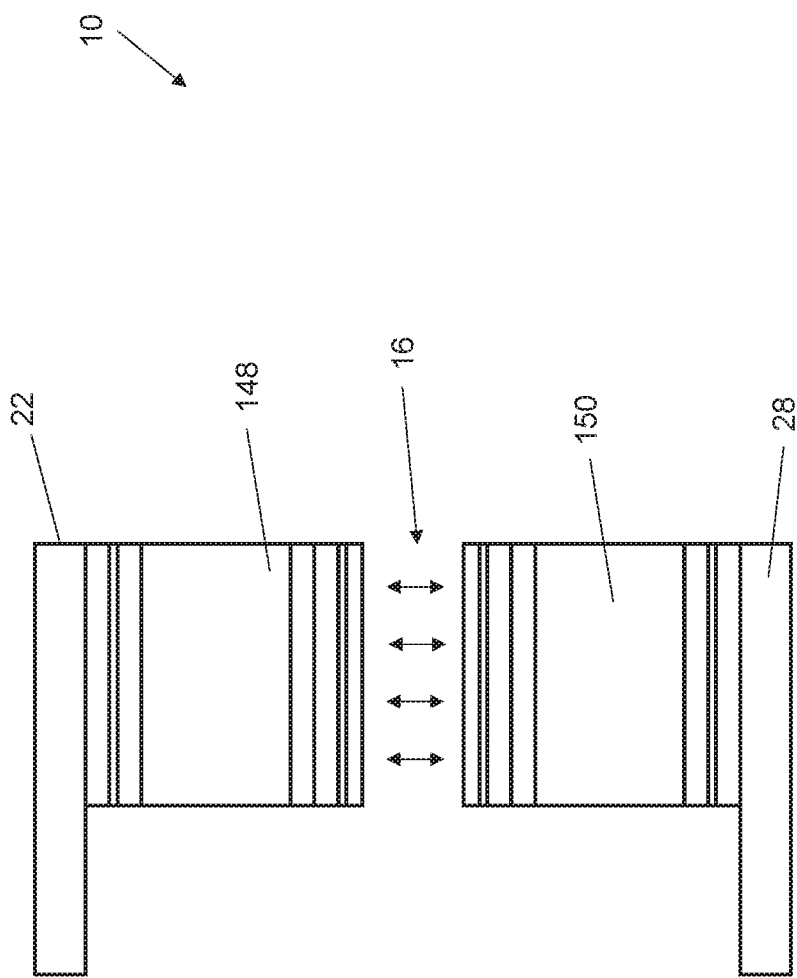

FIG. 30A illustrates a cross-sectional view of the embodiment of the assembled module 12, 14 shown in FIG. 30. As shown, the module circuit board 140, 142 is positioned opposed from the antenna assembly 156, 158. The module spacer or housing structure 178 is positioned therebetween. In an embodiment, the spacer 178 may be of a solid structure having various cutouts for the positioning of the electrical components 162, 164. Alternatively, the spacer 178 may be constructed having a void space therewithin for the positioning of the electrical components 162, 164. In an embodiment, the spacer 178 may be constructed having a void space therewithin for the positioning of the module circuit board 140, 142 and the antenna assembly 156, 158. As illustrated, an adhesive layer 187 may be to adhere the module circuit board 140, 142 and the antenna assembly 156, 158 to the spacer 178.

Figure 34:
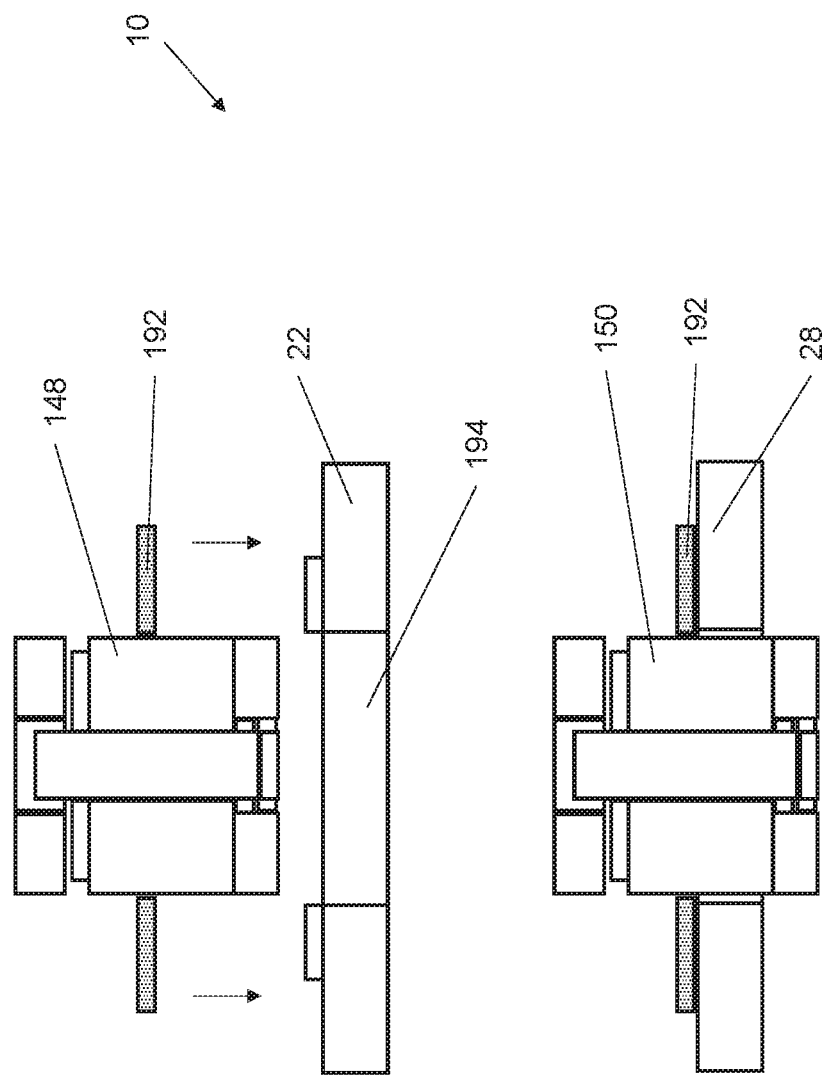

FIGS. 31-34 illustrate various embodiments of the transmitter and receiver modules 148, 150 shown in FIGS. 27-30, mounted to a host device 22, 28 such as a circuit board. As shown, the modules 148, 150 may comprise a plurality of pads 190 that are electrically connected to the host device circuit board. Furthermore, as illustrated in FIG. 34, the modules 148, 150 may comprise alignment legs 192 (FIG. 34) that outwardly extend from the housing structure 178. In an embodiment, the alignment legs 192 provide an additional alignment aid and provide additional mechanical stability when the modules 148, 150 are mounted into an opening in the board 194 of the host device 22, 28. In an embodiment shown in FIG. 34, the transmitter and receiver modules 148, 150 may be positioned within an opening 194 that extends through the thickness of the host device circuit board 22, 28.

Figure 35:
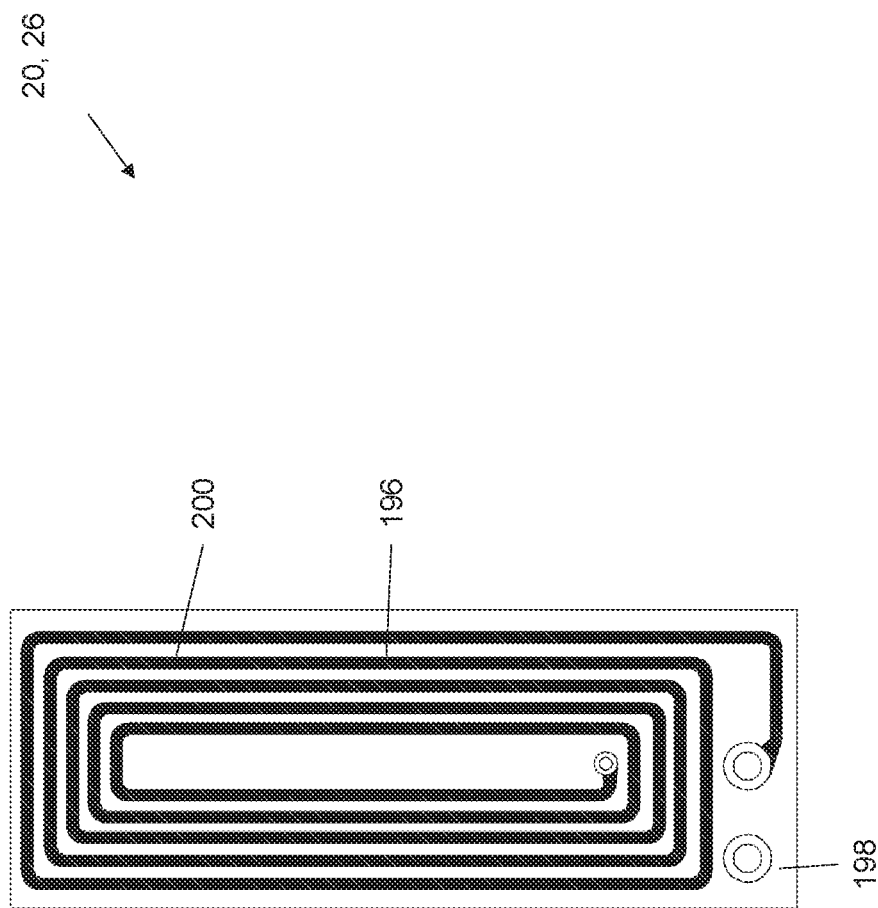
FIG. 35 shows an embodiment of an antenna that may be utilized in either or both the transmitter and receiver modules.

FIG. 35 illustrates a top view of an embodiment of an antenna 20, 26 that may be used with either of the transmitter module 12, 148 or the receiver module 14, 150. In an embodiment, the antenna 20, 26 is of a flat spiral coil configuration. In the embodiment shown, the antenna comprises four layers of alternating of an electrical conductor and electrically insulating layers integrated into a printed circuit board (PCB) or flexible circuit board (FPC). As shown, the antenna 20, 26 comprises two antenna segments that are electrically connected in series. As shown, the antenna 20, 26 is constructed having five turns of a copper trace 196 deposited on the surface of an insulative substrate 198 with a gap 200 of 15 to 200 microns between each trace 196. Each segment comprises an electrical conductor (e.g., trace 196) positioned on an insulative substrate 198 in an electrical parallel configuration. Non-limiting examples can be found in U.S. Pat. App. Nos. 2017/0040690, 2017/0040692, 2017/0040107, 2017/0040105, 2017/0040696, and 2017/0040688 all to Peralta et al., 2017/0040691, 2017/0040694 to Singh et al., 2017/0040693 to Luzinski and 2017/0040695 to Rajagopalan et al. all of which are assigned to the assignee of the present application and incorporated fully herein.

In addition, the antenna 20, 26 may be constructed having a multi-layer-multi-turn (MLMT) construction in which at least one insulator is positioned between a plurality of conductors. Non-limiting examples of antennas having an MLMT construction that may be incorporated within the transmitter module 12, 148 and/or the receiver module 14, 150 may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, 9,300,046, all to Singh et al., assigned to the assignee of the present application are incorporated fully herein. It is also noted that other antennas such as, but not limited to, an antenna configured to send and receive signals in the UHF radio wave frequency such IEEE standard 802.15.1 may be incorporated within the wireless connector system 10 of the present invention.

The wireless connector system 10 is designed to operate in an efficient, stable and reliable manner to satisfy a variety of operating and environmental conditions. The system is designed to operate in a wide range of thermal and mechanical stress environments so that data and/or electrical energy is transmitted efficiently and with minimal loss. In addition, the wireless connector system 10 is designed with a small form factor using a fabrication technology that allows for scalability, and at a cost that is amenable to developers and adopters. In addition, the wireless connector system 10 is designed to operate over a wide range of frequencies to meet the requirements of a wide range of applications.

In an embodiment the system may transmit electrical power on the order of about 100 μW to about 10 W. In another embodiment, electrical power around about 100 W may also be transmitted. Specifically considering near field magnetic coupling (NFMC) as the mechanism of wireless power transfer between the transmitter module 12, 148 and the receiver module 14, 150, it is well known that smaller sizes are generally more easily achievable if a higher operating frequency is selected. This is due to the inverse relationship of the required mutual inductance and the frequency of operation, as indicated by the following equation:

$$M = \frac{V_{induced}}{j*\omega*I_{Tx}}$$

Where:
$V_{induced}$ is induced voltage on the receiver coil
$I_{tx}$ is the AC current flowing through the transmitter coil
$\omega$ is the operating frequency multiplied by $2\pi$ Since the required mutual inductance increases in order to enable the wireless transfer of electrical energy having increased, it is necessary to increase the inductance or coupling of the transmitter or receiver while minimizing AC losses. Mutual inductance can be calculated by the following relationship:

$$M = k*\sqrt{L_{Tx}*L_{Rx}}$$

M is the mutual inductance of the system
k is the coupling of the system
$L_{Tx}$ is the inductance of the transmitter coil
$L_{Rx}$ is the inductance of the receiver coil As the form factor of the antenna coil is reduced, attaining the required inductance on either the receiver or transmitter is accompanied by an increase in antenna coil resistance as the high number of turns required leads to a reduction in trace width. This increase in resistance typically reduces the quality factor of the coil and overall coil to coil efficiency of the system where the Quality factor is defined as:

$$Q = \frac{\omega*L}{R}$$

Where:
Q is the quality factor of the coil
L is the inductance of the coil
$\omega$ is the operating frequency of the coil in radians/s.
Alternatively, the frequency of operation in Hz is co divided by 2H
R is the equivalent series resistance at the operating frequency
And coil to coil efficiency is defined as:

$$Eff = \frac{k^2*Q_{Rx}*Q_{Tx}}{\left(1+\sqrt{(1+k^2*Q_{rx}*Q_{tx})}\right)^2}$$

Where:
Eff is the antenna to antenna efficiency of the system
k is the coupling of the system
$Q_{rx}$ is the quality factor of the receiver
$Q_{tx}$ is the quality factor of the transmitter In an embodiment, the ferrite shield may be incorporated within the antenna structure to improve antenna performance. Selection of the ferrite shield material is dependent on the operating frequency as the complex magnetic permeability ($\mu=\mu'-j*\mu''$) is frequency dependent. The material may be a sintered flexible ferrite sheet or a rigid shield and be composed of varying material compositions. Examples of materials may include, but are not limited to, zinc comprising ferrite materials such as manganese-zinc, nickel-zinc, copper-zinc, magnesium-zinc, and combinations thereof.

In addition, depending on the operating frequency and power requirements of the wireless connector system 10, a hybrid Litz wire and PCB coil antenna construction combination may be necessary to efficiently transfer power. In an embodiment, a hybrid Litz wire and PCB coil combination may comprise the transmitter antenna 20 or the receiver antenna 26 of a wrapped Litz wire construction and the other of the transmitter antenna 20 or the receiver antenna 26 may be constructed having a coil disposed on a surface of a circuit board such as the antenna shown in FIG. 35. Lower operating frequencies on the order of 100 kHz to several MHz range may require a certain mutual inductance between the transmitter and receiver antenna 20, 26. This is attainable by using a transmitter antenna 20 of a Litz wire construction having a novel ferrite core in combination with a receiver antenna 26 comprising a coil disposed on a surface of a circuit board, such as the antenna shown in FIG. 35.

In order to increase mutual inductance, the coupling and/or inductance of the transmitter module 12, 148 or the receiver module 14, 150 must be increased. However, due to the small form factor constraints, coupling is limited by the physical size of the connector modules. It is noted that using transmitter and receiver antennas 20, 26 of a construction comprising a coil disposed on the surface of a circuit board, such as the antenna shown in FIG. 35, may increase inductance and increase the resistance of the antenna coils thereby decreasing the quality factor Q and antenna to antenna efficiency.

In an embodiment, the wireless connector system 10 comprising a transmitter module 12, 148 having a transmitter antenna 20 of a Litz-wire construction and a shielding material and a receiver module 14, 150 having a receiver antenna 26 comprising a coil disposed on a surface of a circuit board (FIG. 35) may be used to increase the coupling and mutual inductance of a small form factor of the wireless connector system 10. To achieve a higher antenna to antenna efficiency, this configuration may be used to achieve the necessary power transfer while maintaining high Q factor at lower frequencies. These improvements may also increase the overall performance of the wireless connector system 10 having a relatively small form factor.

The choice of coil design and construction is determined by a combination of the following electrical and magnetic parameters:
Inductance
ESR (equivalent series resistance) at operating frequency
Coupling (k)
Mutual inductance (M)

For lower operating frequencies, i.e., from about 100 kHz to about 10 MHz, and for achieving increased power transmission on the order of about 0.1 mm to about 100 mm, this particular antenna topology is beneficial. For example, per the mutual inductance equations, if the power to be delivered to a load is constant, while the operating frequency decreases, the mutual inductance between the transmitter and receiver antenna coils increases at a constant transmit current. Table II illustrates the improvement in mutual inductance. Table III illustrates the improvement in coupling and Table IV illustrates the improvement in antenna to antenna efficiency.

TABLE II

| Transmitter Antenna Construction | Transmitter Antenna Shield | Receiver Antenna Construction | M (µH) |
|---|---|---|---|
| Coil on FR4 PCB | Sheet | Coil on FR4 PCB | 0.35 |
| Litz Wire | T-Core | Coil on FR4 PCB | 1.35 |

TABLE III

| Transmitter Antenna Construction | Transmitter Antenna Shield | Receiver Antenna Construction | Coupling |
|---|---|---|---|
| Coil on FR4 PCB | Sheet | Coil on FR4 PCB | 0.26 |
| Litz Wire | T-Core | Coil on FR4 PCB | 0.29 |

TABLE IV

| Transmitter Antenna Construction | Transmitter Antenna Shield | Receiver Antenna Construction | Antenna to Antenna efficiency |
|---|---|---|---|
| Coil on FR4 PCB | Sheet | Coil on FR4 PCB | 57.9% |
| Litz Wire | T-Core | Coil on FR4 PCB | 80.8% |

In addition, if the system 10 is operated at a higher frequency, i.e., on the order of about 1 MHz or greater, the required mutual inductance will be reduced, thereby allowing for smaller transmitter and receiver antennas 20, 26 and modules 12, 14, 148, 150. As defined herein shielding material is a material that captures a magnetic field. An example of which is a ferrite material. In the embodiments detailed in Tables II-IV, a sheet of ferrite material is positioned directly adjacent to the transmitter antenna 20, for example, behind the transmitter antenna 20. As defined herein a "T-Core" shielding material is a magnetic field shield assembly comprising a sheet of shielding material, such as a ferrite material, placed directly behind the transmitter or receiver antenna 20, 26 and an additional second shielding material, such as a ferrite material, placed within the inside area of a coil in the plane of the transmitter or receiver antenna 20, 26. Furthermore, the transmitter module 12, 148 or the receiver module 14, 150 may be constructed having the respective transmitter or receiver antennas 20, 26 comprising a "C-core" shielding material in which the shielding material, such as a ferrite material, configured similarly to the letter "C", is positioned adjacent to the antenna 20, 26. In addition, the transmitter module 12, 148 or the receiver module 14,150 may be constructed having the respective transmitter or receiver antennas 20, 26 comprising a "E-core" shielding material in which the shielding material, such as a ferrite material, configured similarly to the letter "E", is positioned adjacent to the antenna 20, 26.

In an embodiment, the wireless connector system 10 rated for a maximum 200 mW received DC power, can be configured having each transmitter module 12, 148 and receiver module 14, 150 comprise a form factor of about 11 mm×4 mm, and operate at a frequency that ranges from about 2 MHz to 30 MHz. However, this presents a key challenge in the antenna design. It is not typically cost effective, nor is it particularly reliable, to implement a wire wound Litz antenna that can fit in a footprint as small as 11 mm×4 mm. Furthermore, as the operating frequency is increased to about 6 MHz and greater, wire wound Litz antenna coils may not be suitable in terms of performance.

Utilizing relatively small sized printed circuit board or flexible printed circuit board (PCB/FPC) based coil-antennas allow for appropriate stackups, appropriate trace widths, gap widths and copper (or other conductive material) depths that are more suitable for higher frequencies. Further, printed circuit board and flex printed circuit board based coil-antennas are highly integrated into the PCB fabrication process, thereby allowing for integration with the rest of the circuitry. This also allows for the integration of MLMT antenna designs to reduce ESR and improve the Q of the antennas.

Furthermore, utilizing coils in a layered approach allows for other fabrication processes, for example, printing, printing on fabrics, semiconductor fabrication processes, such as a low temperature co-fired ceramic (LTCC) process, a high temperature co-fired ceramic (HTCC) process, and the like.

Small form factor PCB coil designs are suitable at higher operating frequencies due to a lower required inductance while maintaining a low coil ESR to minimize the power dissipated in the transmit and receive coils. Printed circuit board (PCB) coil antennas offer additional benefits from a manufacturing, cost and assembly standpoint compared to wire-wound antenna coil solutions. For applications with a strict requirement for overall assembly thickness, printed circuit board (PCB) coil antennas are preferred due to the reduced thickness possible even with multilayer construction.

The ferrite shield material selected for the coil combination also depends on the operating frequency as the complex magnetic permeability ($\mu=\mu'-j*\mu''$) is frequency dependent. The material may be a sintered flexible ferrite sheet or a rigid shield and be composed of varying material compositions.

It is noted that the construction of the antenna 20, 26 is non-limiting. The antenna that is incorporated within a module may comprise magnetic wires or have a stamped metal construction. Furthermore, the antenna 20, 26 may utilize thick film, thin film or other printing fabrication technologies in its construction.

In an embodiment, incorporation of a transmitter or receiver antenna 20, 26 having a multi-layer-multi-turn (MLMT) construction significantly reduces the equivalent series resistance (ESR) of the respective transmitter module 12, 148 and receiver modules 14, 150 and the wireless connector system 10 of the present invention. The inventors have discovered that incorporation of at least one transmitter and receiver antenna 20, 26 having a multi-layer-multi-turn (MLMT) construction reduces equivalent series resistance (ESR) of the transmitter or receiver module 12, 14 by about 50 percent.

Furthermore, reducing ESR improves the overall system efficiency and reduces heating in the antenna 20, 26 and the system 10 by reducing the (I'×R) losses in the coil. Table V shown below details the measured ESR for two multi-layer-multi-turn (MLMT) antenna designs in comparison to an antenna constructed comprising Litz wire wrapped around an inductor. As shown in Table V below, the antenna constructed with an MLMT design exhibited a lower inductance, (0.60 pH) and a lower equivalent series resistance (ESR) (0.50Ω) in comparison to the antenna having a traditional wound Litz wire construction. Thus, the transmitter or receiver antenna 20, 26 having a multi-layer-multi-turn (MLMT) construction contributes to the increased electrical performance of increased electrical power transmission and increased module separation distance 16 of the wireless connector system 10 of the present invention.

TABLE V

| Antenna Design | Frequency (MHz) | Inductance (µH) | ESR (Ω) |
| --- | --- | --- | --- |
| Litz Wire | 2 | 3.80 | 0.97 |
| MLMT | 2 | 0.60 | 0.50 |
| MLMT | 10 | 0.65 | 1.05 |

Exemplary ways of connecting the module to a host device include, but are not limited to, directly soldering or placing the at least one transmitter module 12, 148 and receiver module 14, 150 on a circuit board or a host device 22, 28. Alternatively, the at least one transmitter module 12, 148 and receiver module 14, 150 could be connected to a circuit board or a host device 22, 28 using a wire/cable. Once connected to a host device 22, 28, the full structure or at least a portion of the structure of the at least one transmitter module 12, 148 and receiver module 14, 150 may be encapsulated within an insulative coating.

In an embodiment, the operating procedure for the transmitter module 12, 148 that comprises a single antenna element may have the following operating process. In this embodiment, the wireless connector system 10 is a unidirectional power transfer system at a frequency, for example at 2.4 GHz. In an embodiment, the receiver module 14, 150 is brought in the vicinity of the transmitter module 12, 148.

In an embodiment, the receiver sensing sub-circuit 42 within the transmitter module 12, 148 detects the presence of the receiver module 14, 150. The master control unit (MCU) 44 within the transmitter module 12, 148 activates the system 10, and an identification stage is initiated. The identification stage could be important to distinguish between a spurious sense signal versus a sense signal detecting a true receiver module 14, 150. The identification could also be important to determine the specific type of the receiver module 14, 150 that would indicate to the transmitter module 12, 148 and the host device 22 what amount of power and type of data to transmit.

In an embodiment, once a positive identification of the receiver module 14, 150 is made, the transmitter module 12, 148 starts transmitting power. In an embodiment, the transmission of electrical power could cease under several conditions, including but not limited to:

(1) removal of the receiver module
(2) a thermal event wherein there is a temperature rise within the system that rises above a predetermined accepted limit (this thermal event could be at the transmitter module 12, 148 or the receiver module 14, 150)
(3) if the receiver module 14, 150 powers a battery, then the battery is fully charged
(4) the power supply to the transmitter module 12, 148 is removed
(5) if the power supply to the transmitter module 12, 148 is a battery, then the electrical power from the battery has dropped below a pre-determined threshold It is noted that the above exemplary process is for a case when the transmitter module 12, 148 is configured as a single-purpose (only transmits) and the receiver module 14, 150 is configured as a single purpose (only receives), and there exists a single antenna element for each transmitter module 12, 148 and receiver module 14, 150. In other words, this is a unidirectional wireless power system.

In another embodiment, the wireless connector system 10 of the present application could include a module that can operate both as a transmitter and as a receiver, i.e. a transceiver. In a further embodiment, the wireless connector system 10 of the present application may comprise a power and data transfer system in addition to a single antenna where the data is modulated into the power frequency.

In another embodiment, the wireless connector system 10 of the present invention may comprise multiple antennas within each transmitter module 12, 148 and receiver modules 14, 150. If a multiple antenna system is employed, then the first antenna could be reserved for identification, diagnostics and any uni- or bi-directional data transfer, while the second antenna can be dedicated to power transfer.

In an embodiment, the reliability and repeatability of the receiver module presence sensing capability could be improved by using a calibration method, as described in the following steps.

1. When the transmitter module 12, 148 is in idle mode, and no object (such as the antenna coil of the receiver module) is present, the sense line within the transmitter module circuit 18 may be amplified or buffered and then connected to an Analog to Digital Converter (ADC). The ADC monitors (or samples) the sense line at predetermined time intervals converts the sense voltage in idle mode (Vidle) to a digital format whose value is stored in memory by the transmitter master control unit (MCU) 44.
2. The ADC continues to sample the sense line while in idle mode by measuring the voltage (Vidle) and calculates the difference between consecutive values of Vidle designated as Videlta. A predetermined voltage threshold designated as Vthreshold is used to compare to Videlta. In this case, Videlta is less than Vthreshold since the changes in Vidle will be small while the device remains in idle mode (Scenario 1)
3. When an object is present (such as a receiver antenna coil) the sense line changes to a different voltage level (Vactive) due to the mutual inductance (M) between the transmitter module 12, 148 and the receiver antenna coil. The ADC converts Vactive to a digital format whose value is stored in memory by a microcontroller or master control unit (MCU) of the transmitter module 12, 148.
4. The processor calculates the difference between the stored value of Vidle and Vactive which is designated as Vadelta and stores this value in a memory. The same predetermined threshold Vthreshold is used and compared to Vadelta along with subsequent samples of Vactive. In this case, since the sense line voltage has changed and Vadelta will be greater than Vthreshold which indicates the presence of a receiver antenna coil. The processor can now switch the device to active mode (Scenario 2)
5. The ADC continues to sample the sense line while in active mode by measuring the voltage (Vactive) and calculates the difference between consecutive values of Vactive designated as Vadelta. The same predetermined voltage threshold designated as Vthreshold is used to compare to Vadelta. In this case, Vadelta is less than Vthreshold since the changes in Vactive will be small while the device remains in active mode (Scenario 3)

6. When an object is removed (such as a receiver antenna coil) the sense line returns to the idle mode voltage level (Vidle) due to the Mutual Inductance (M) between the transmitter and receiver antenna coils. The ADC converts Vidle to a digital format whose value is stored in memory by a microcontroller or processor.

7. The processor within the transmitter module 12, 148 calculates the difference between the stored value of Vactive and Vidle which is designated as Videlta and stores this value in memory. The same predetermined threshold Vthreshold is used and compared to Videlta along with subsequent samples of Vidle. In this case, since the sense line voltage has changed Videlta will be greater than Vthreshold which indicates the removal of the receiver antenna coil. The processor can now switch the device back to idle mode (Scenario 4)

8. It should be noted that this methodology is "self-calibrating" since any variation due to inherent manufacturing process tolerances are removed. The methodology also eliminates the need for a comparator and allows the use of lower cost components since greater module variability can be tolerated.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A transmitter module configured for wireless power transfer within a given frequency range, the transmitter module comprising:
   a transmitter antenna that is configured to engage in wireless transmission of electrical energy via near-field magnetic coupling; and
   control circuitry that is configured to (a) sense whether any receiver module configured for wireless power transfer within the given frequency range is in a near field of the transmitter module, (b) based on the sensing, control an activation state of the transmitter antenna's wireless transmission of electrical energy, (c) monitor a temperature level within the transmitter module, and (d) based on the monitored temperature level, control the activation state of the transmitter antenna's wireless transmission of electrical energy, wherein the control circuitry comprises:
- a first circuit that comprises an envelope detector and is configured to output a voltage level that is indicative of an impedance detected by the transmitter antenna, wherein the impedance detected by the transmitter antenna is dependent on whether any receiver module configured for wireless power transfer within the given frequency range is in the near field of the transmitter module; and
- a second circuit configured to (i) monitor the voltage level output by the first circuit and (ii) based on the monitored voltage level, determine whether the activation state of the transmitter antenna's wireless transmission of electrical energy is to be changed.

2. The transmitter module of claim 1, wherein the envelope detector comprises first and second resistors that are electrically connected in series to one another, and wherein the voltage level output by the first circuit comprises a voltage level at a node residing between the first and second resistors.

3. The transmitter module of claim 2, wherein the envelope detector further comprises a diode that is electrically connected between the first resistor and the transmitter antenna.

4. The transmitter module of claim 2, wherein the envelope detector further comprises a capacitor that is connected to the node residing between the first and second resistors.

5. The transmitter module of claim 1, wherein the second circuit comprises an amplifier that is configured to amplify the voltage level output by the first circuit.

6. The transmitter module of claim 1, wherein the second circuit comprises an analog to digital converter.

7. The transmitter module of claim 1, wherein the second circuit comprises an operational amplifier.

8. The transmitter module of claim 1, wherein the second circuit is configured to monitor the voltage level output by the first circuit by periodically sampling the voltage level.

9. The transmitter module of claim 1, wherein the second circuit is configured to determine whether the activation state of the transmitter antenna's wireless transmission of electrical energy is to be changed by determining whether the monitored voltage level has changed by a threshold amount.

10. The transmitter module of claim 9, wherein the second circuit is configured to either (i) determine that the activation state of the transmitter antenna's wireless transmission of electrical energy need not be changed if the monitored voltage level is not determined to have changed by the threshold amount, (ii) determine that the activation state of transmitter antenna's wireless transmission of electrical energy is to be changed from deactivated to activated if the monitored voltage level is determined to have increased by the threshold amount, or (iii) determine that the activation state of transmitter antenna's wireless transmission of electrical energy is to be changed from activated to deactivated if the monitored voltage level is determined to have decreased by the threshold amount.

11. The transmitter module of claim 1, wherein the second circuit is further configured to output a control signal indicting whether the activation state of the transmitter antenna's wireless transmission of electrical energy is to be changed.

12. The transmitter module of claim 11, wherein the control circuitry further comprises:
- a third circuit configured to (i) receive the control signal output by the second circuit and (ii) control the activation state of the transmitter antenna in accordance with the received control signal.

13. The transmitter module of claim 12, wherein the third circuit is configured to initiate an identification stage for a receiver module if the received control signal indicates that the activation state of the transmitter antenna's wireless transmission of electrical energy is to be changed from deactivated to activated.

14. The transmitter module of claim 12, wherein the third circuit comprises a microcontroller.

15. The transmitter module of claim 1, further comprising:
- a power stage inverter; and
- an impedance matching circuit, wherein the power stage inverter is connected to the transmitter antenna via the impedance matching circuit.

16. The transmitter module of claim 15, wherein the first circuit is connected to a node residing between the transmitter antenna and the impedance matching circuit.

17. The transmitter module of claim 1, wherein the control circuitry is further configured to (a) sense whether any undesired object is in the near field of the transmitter module and (b) based on the sensing, control the activation state of the transmitter antenna's wireless transmission of electrical energy.

* * * * *